(12) United States Patent
Park

(10) Patent No.: US 9,741,759 B2
(45) Date of Patent: Aug. 22, 2017

(54) IMAGE SENSOR AND METHOD OF MANUFACTURING THE SAME

(71) Applicant: Samsung Electronics Co., Ltd., Suwon-si, Gyeonggi-do (KR)

(72) Inventor: Jung-Ho Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/169,975

(22) Filed: Jun. 1, 2016

(65) Prior Publication Data

US 2016/0276381 A1    Sep. 22, 2016

Related U.S. Application Data

(63) Continuation of application No. 14/579,311, filed on Dec. 22, 2014, now Pat. No. 9,373,656.

(30) Foreign Application Priority Data

Mar. 7, 2014    (KR) .................. 10-2014-0027276

(51) Int. Cl.
*H01L 23/58*    (2006.01)
*H01L 27/146*    (2006.01)

(52) U.S. Cl.
CPC ...... *H01L 27/1463* (2013.01); *H01L 27/1462* (2013.01); *H01L 27/1464* (2013.01);
(Continued)

(58) Field of Classification Search
USPC .......... 257/432, 21, 291, 774, E31.121, 290, 257/447, E27.132, 294, E31.122, 257,
(Continued)

(56) References Cited

U.S. PATENT DOCUMENTS 9,048,354 B2 *    6/2015   Park ................ H01L 31/022408
9,373,656 B2 *    6/2016   Park .................... H01L 27/1463
(Continued)

FOREIGN PATENT DOCUMENTS

JP    2007-329336 A    12/2007
KR    10-2007-0040958 A    4/2007
(Continued)

*Primary Examiner* — Tram H Nguyen
(74) *Attorney, Agent, or Firm* — Harness, Dickey & Pierce, P.L.C.

(57) ABSTRACT

Image sensor and method of manufacturing the same are provided. The image sensor includes a semiconductor substrate including a pixel area, a voltage connection area, and a pad area, a plurality of photoelectric conversion devices in the pixel area, an anti-reflective layer on a back side of the semiconductor substrate and on the plurality of photoelectric conversion devices, a device isolation structure between the plurality of photoelectric conversion devices, at least one voltage connection structure in the voltage connection area, and electrically connected to the device isolation structure, at least one voltage applying device electrically connected to the at least one voltage connection structure, an internal circuit including at least one conductive inner wire and at least one conductive inner via in an insulating layer, and a through via structure in the pad area.

26 Claims, 52 Drawing Sheets

(52) U.S. Cl.
CPC .. *H01L 27/14621* (2013.01); *H01L 27/14627* (2013.01); *H01L 27/14636* (2013.01); *H01L 27/14654* (2013.01); *H01L 27/14689* (2013.01)

(58) Field of Classification Search
USPC ........ 257/431, 57, 59, 72, 83, 351, 368, 396
See application file for complete search history.

(56) References Cited

U.S. PATENT DOCUMENTS

| | | |
|---|---|---|
| 2008/0087977 A1 | 4/2008 | Watanabe |
| 2009/0236643 A1 | 9/2009 | Kim |
| 2010/0133638 A1 | 6/2010 | Park et al. |
| 2010/0201926 A1 | 8/2010 | Lee |
| 2010/0244175 A1* | 9/2010 | Park ................. H01L 27/14636 257/459 |
| 2012/0261781 A1 | 10/2012 | Hsu et al. |
| 2012/0313208 A1 | 12/2012 | Kim et al. |
| 2013/0320479 A1* | 12/2013 | Ahn ....................... H01L 31/02 257/460 |
| 2014/0048853 A1* | 2/2014 | Choi ................. H01L 27/14632 257/231 |

FOREIGN PATENT DOCUMENTS

| | | |
|---|---|---|
| KR | 10-0869743 B1 | 11/2008 |
| KR | 10-2010-0025873 A | 3/2010 |
| KR | 10-2010-0062098 A | 6/2010 |
| KR | 10-2010-0090971 A | 8/2010 |
| KR | 10-2011-0037481 A | 4/2011 |
| KR | 10-2011-0079337 A | 7/2011 |

\* cited by examiner

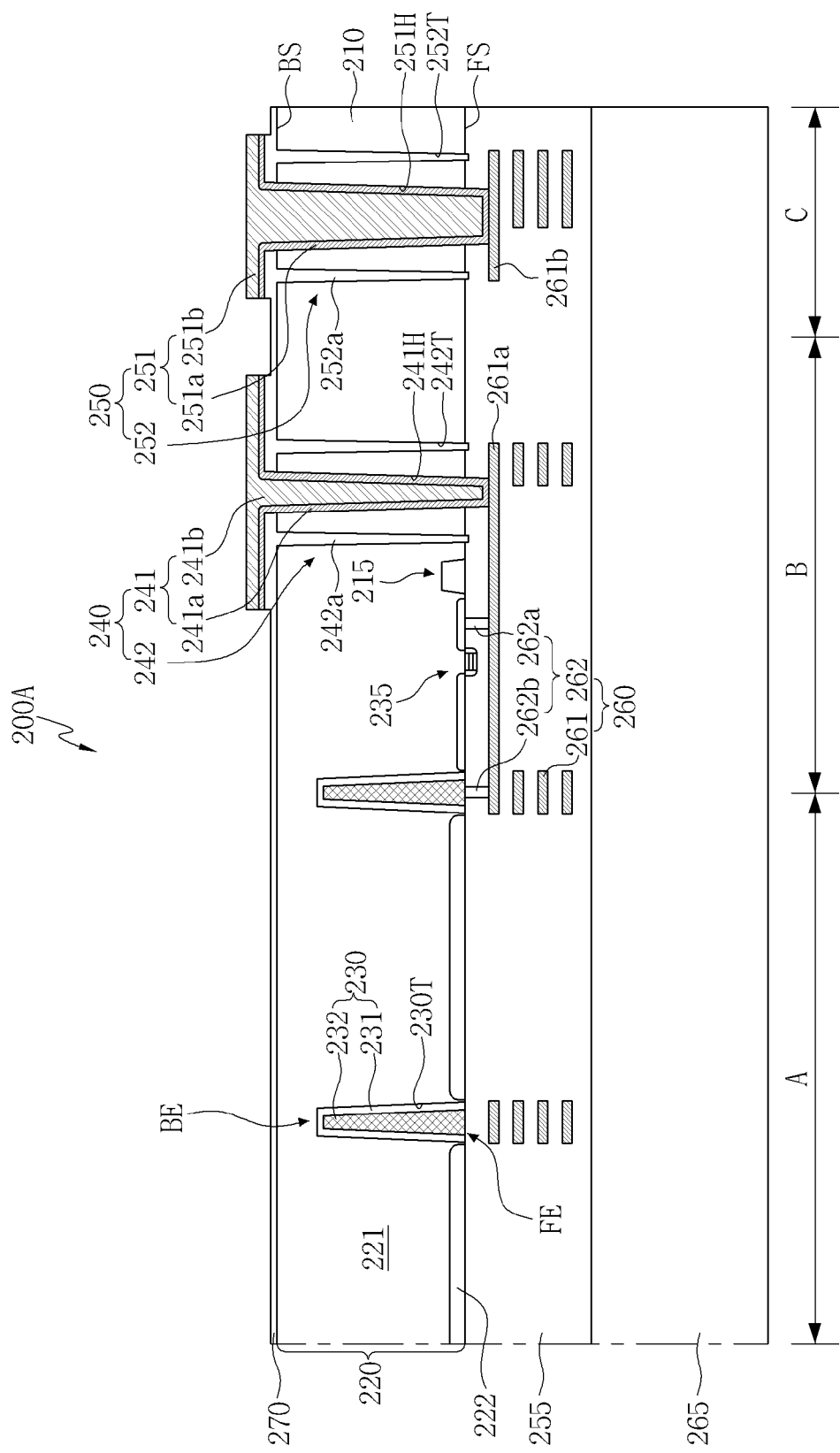

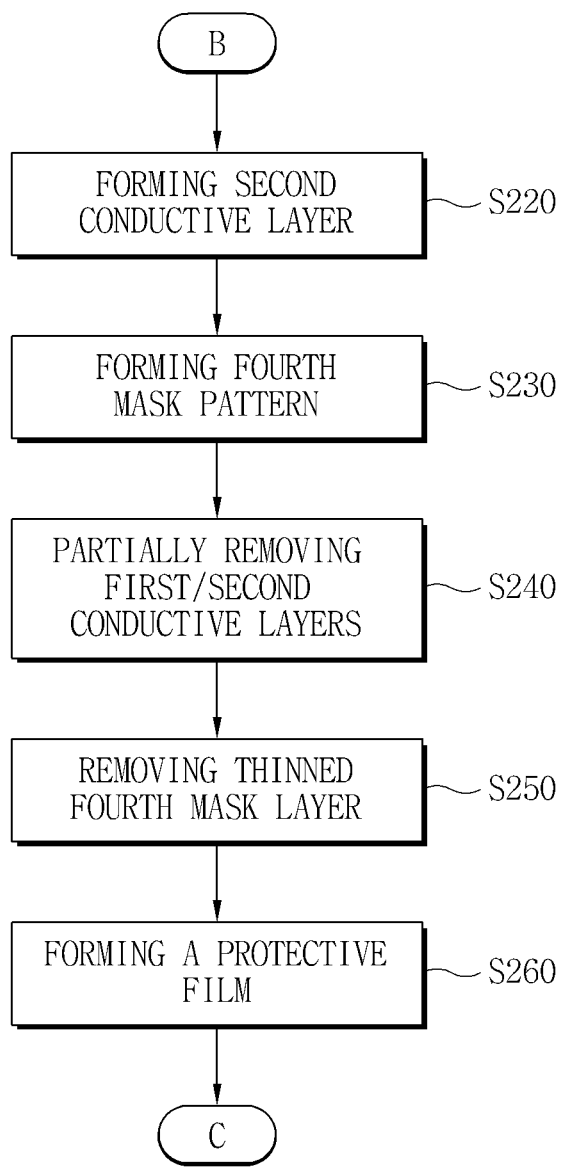

IMAGE SENSOR AND METHOD OF MANUFACTURING THE SAME

CROSS-REFERENCE TO RELATED APPLICATION

This application is a continuation application of U.S. application Ser. No. 14/579,311 filed on Dec. 22, 2014, which claims priority under 35 U.S.C. §119 from Korean Patent Application No. 10-2014-0027276, filed on Mar. 7, 2014, the entire contents of which are incorporated herein by reference.

BACKGROUND

Field

Some example embodiments of the inventive concepts relate to an image sensor having a device isolation structure capable of applying a voltage, a method of manufacturing the same, and/or a camera system and an electronic system including the image sensor.

Description of Related Art

An image sensor having a device isolation structure for improving crosstalk and blooming phenomena between image pixels is proposed. Generally, the device isolation structure may be a shallow trench isolation (STI) structure or a deep trench isolation (DTI) structure. However, in a conventional device isolation structure, white spot and a blooming phenomenon may occur due to a dark current capable of being generated on a surface of the device isolation structure. Accordingly, a device isolation structure in order to remove the dark current is required.

SUMMARY

Some example embodiments of the inventive concepts provide an image sensor having a device isolation structure capable of applying a voltage.

Some example embodiments of the inventive concepts provide a method of manufacturing an image sensor having a device isolation structure capable of applying a voltage.

Some example embodiments of the inventive concepts provide a camera system including an image sensor having a device isolation structure capable of applying a voltage.

Some example embodiments of the inventive concepts provide an electronic system including an image sensor having a device isolation structure capable of applying a voltage.

In accordance with one example aspect of the inventive concepts, an image sensor includes a semiconductor substrate including a pixel area, a voltage connection area, and a pad area, a plurality of photoelectric conversion devices arranged in the pixel area, an anti-reflective layer formed on a back side of the semiconductor substrate and on the plurality of photoelectric conversion devices, a device isolation structure arranged between the plurality of photoelectric conversion devices, at least one voltage connection structure arranged in the voltage connection area and electrically connected to the device isolation structure, at least one voltage applying device electrically connected to the at least one voltage connection structure and configured to apply a voltage to the device isolation structure, an internal circuit including a plurality of conductive inner wires and a plurality of conductive inner vias arranged in an insulating layer formed on a front side of the semiconductor substrate, and a through via structure arranged in the pad area and electrically connected to the inner wires through the semiconductor substrate. For example, the voltage may be a negative voltage.

The device isolation structure may have the form of a grid. The device isolation structure may be a deep trench isolation (DTI) structure.

The device isolation structure may include a device isolation trench penetrating or projecting into at least a portion of the semiconductor substrate from the back side of the semiconductor substrate toward the front side; a device isolation pattern conformally formed on an inner wall of the device isolation trench; a first device isolation conductive pattern conformally formed on the device isolation pattern; and a second device isolation conductive pattern formed to fill the inside of the device isolation trench on the first device isolation conductive pattern, wherein the first device isolation conductive pattern projects into the anti-reflective layer, and a front end of the device isolation structure projects farther than the back side of the semiconductor substrate.

The voltage connection structure may include a voltage connection contact plug penetrating or projecting into the semiconductor substrate in the voltage connection area and being in direct contact with the internal circuit electrically connected to the voltage applying device; and a voltage connection insulating area being spaced apart from and covering a side of the voltage connection contact plug.

The voltage connection contact plug may include a voltage connection contact hole penetrating or projecting into the semiconductor substrate and exposing the internal circuit; a first voltage connection conductive pattern conformally formed on an inner wall of the voltage connection contact hole; and a second voltage connection conductive pattern formed to fill the inside of the voltage connection contact hole on the first voltage connection conductive pattern, wherein the first voltage connection conductive pattern projects into the first device isolation conductive pattern, and the second voltage connection conductive pattern projects into the second device isolation conductive pattern.

The voltage connection insulating area may include a voltage connection insulating trench vertically penetrating or projecting into the semiconductor substrate to be spaced apart by a desired, or alternatively predetermined distance from, and cover a side of, the voltage connection contact plug; and a voltage connection insulating pattern filling the inside of the voltage connection insulating trench, wherein the voltage connection insulating pattern projects into the device isolation pattern.

The through via structure may include a through via contact plug penetrating or projecting into the semiconductor substrate in the pad area and being in direct contact with the internal circuit, and a through via insulating area being spaced apart from, and covering a side of, the through via contact plug.

The through via contact plug may include a through via contact hole penetrating or projecting into the semiconductor substrate and exposing the internal circuit; a first through via conductive pattern conformally formed on an inner wall of the through via contact hole; and a second through via conductive pattern formed to fill the inside of the through via contact hole on the first through via conductive pattern, wherein the first through via conductive pattern includes the same material formed in the same level as the first device isolation conductive pattern, and the second through via conductive pattern includes the same material formed in the same level as the second device isolation conductive pattern.

The through via insulating area may include a through via insulating trench vertically penetrating or projecting into the semiconductor substrate to be spaced apart by a desired, or alternatively predetermined distance from, and cover a side of, the through via contact plug; and a through via insulating pattern filling the inside of the through via insulating trench, wherein the through via insulating pattern projects into the device isolation insulating pattern.

The image sensor may further include a protective film conformally formed on the anti-reflective layer, the device isolation structure, the voltage connection structure, and the through via structure, and including a first pad connection opening exposing the second through via conductive pattern; a planarized film formed on the protective film, and including a second pad connection opening exposing the second through via conductive pattern; a color filter formed on the planarized film to overlap each of the photoelectric conversion devices in the pixel area; and a microlens formed on the color filter.

The image sensor may further include a protective film conformally formed on the anti-reflective layer, the device isolation structure, the voltage connection structure, and the through via structure, and including a first pad connection opening exposing the second through via conductive pattern and a first voltage connection opening exposing the second voltage connection conductive pattern, a planarized film formed on the protective film, and including a second pad connection opening exposing the second through via conductive pattern and a second voltage connection opening exposing the second voltage connection conductive pattern, a color filter formed on the planarized film to overlap each of the photoelectric conversion devices in the pixel area, and a microlens formed on the color filter.

In accordance with at least one example embodiment of the inventive concepts, an image sensor includes a semiconductor substrate including a pixel area, a voltage connection area, and a pad area; a plurality of photoelectric conversion devices arranged in the pixel area; a device isolation structure arranged between the plurality of photoelectric conversion devices, and formed from a front side toward a back side of the semiconductor substrate; at least one voltage applying device applying a voltage to the device isolation structure; an insulating layer formed on the front side of the semiconductor substrate; and an internal circuit arranged in the insulating layer, and including a plurality of conductive inner wires and a plurality of inner vias formed in the voltage connection area and the pad area, respectively, wherein the internal circuit is electrically connected to the device isolation structure and the at least one voltage applying device through the plurality of inner wires and the plurality of inner vias formed in the insulating layer.

The device isolation structure may include a device isolation trench penetrating or projecting into at least a portion of the semiconductor substrate from the front side toward the back side of the semiconductor substrate; a device isolation pattern conformally formed on an inner wall of the device isolation trench; and a device isolation conductive pattern formed to fill the inside of the device isolation trench on the device isolation pattern, wherein a front end of the device isolation structure is coplanar with the front side of the semiconductor substrate.

According to at least one example embodiment, an image sensor, includes a semiconductor substrate including a pixel area, a voltage connection area, and a pad area, a plurality of photoelectric conversion devices in the pixel area, a device isolation structure between the plurality of photoelectric conversion devices, at least one voltage applying device in the voltage connection area configured to apply a voltage to the device isolation structure, an internal circuit including a plurality of conductive inner wires and a plurality of conductive inner vias in the voltage connection area and in the pad area, respectively.

Specific details of other example embodiments are included in the detailed description and drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 11(A)-11(D) are flow charts illustrating a method of manufacturing an image sensor, according to at least one example embodiment.

DETAILED DESCRIPTION OF THE EMBODIMENTS

Figure 1A:
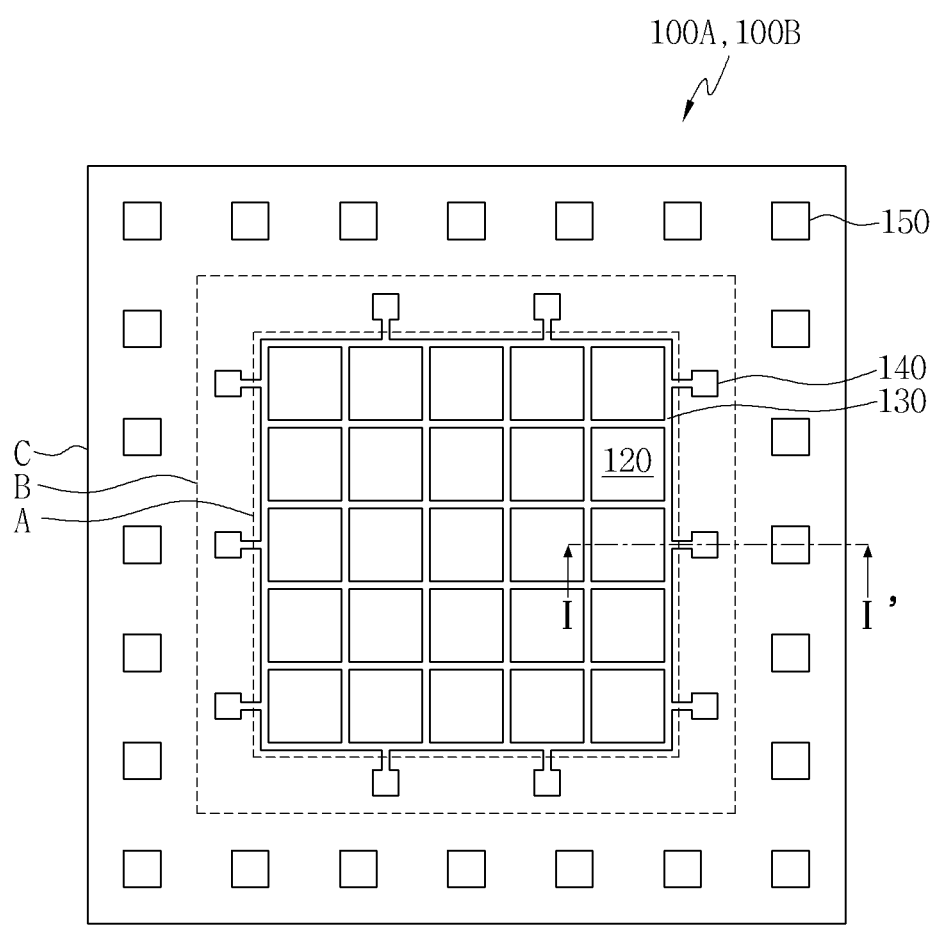
FIG. 1A is a schematic layout illustrating image sensors according to at least one example embodiments of the inventive concepts.

Various example embodiments will now be described more fully with reference to the accompanying drawings in which some example embodiments are shown. These inventive concepts may, however, be embodied in different forms and should not be construed as limited to the embodiments set forth herein. Although a few example embodiments of the inventive concepts have been shown and described, it would be appreciated by those of ordinary skill in the art that changes may be made in these example embodiments without departing from the principles and spirit of the inventive concepts, the scope of which is defined in the claims and their equivalents.

The terminology used herein is for the purpose of describing example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Some example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Like reference marks refer to like reference elements throughout. Accordingly, even though the like reference marks or same as or similar reference marks are not referred or explained in the corresponding drawings or figures, the like reference marks or same as or similar reference marks may be explained with reference to other drawings or figures. Further, even though the reference marks are not marked, the reference marks may be explained with reference to other drawings or figures.

Spatially relative terms "front side" and "back side" may be used herein for ease of description to describe one element or a relationship between a feature and another element or feature as illustrated in the figures. The terms "front side" and "back side" may not designate a specific direction, location, or element, and be compatible with each other. For example, the term "front side" may be interpreted as the term "back side", and the term "back side" may be interpreted as the term "front side". Accordingly, the term "front side" may be represented as the term "a first" and the term "back side" may be represented as the term "a second", or the term "back side" may be represented as the term "a first" and the term "front side" may be represented as the term "a second". However, the term "front side" may not be mixed with the term "back side" within one embodiment.

Spatially relative terms "near" and "far" may mean that one of at least two elements is relatively near or far compared with another of the at least two elements. For example, a meaning that a first end is near to or far away from a first side may be interpreted as a meaning that the first end is relatively nearer to and farther away from the first side than a second end, or the first end is near to or far away from the first side compared with the second side.

In the drawing figures, the dimensions of layers and regions may be exaggerated for clarity of illustration. Like reference numerals refer to like elements throughout. The same reference numbers indicate the same components throughout the specification.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

Figure 1B:
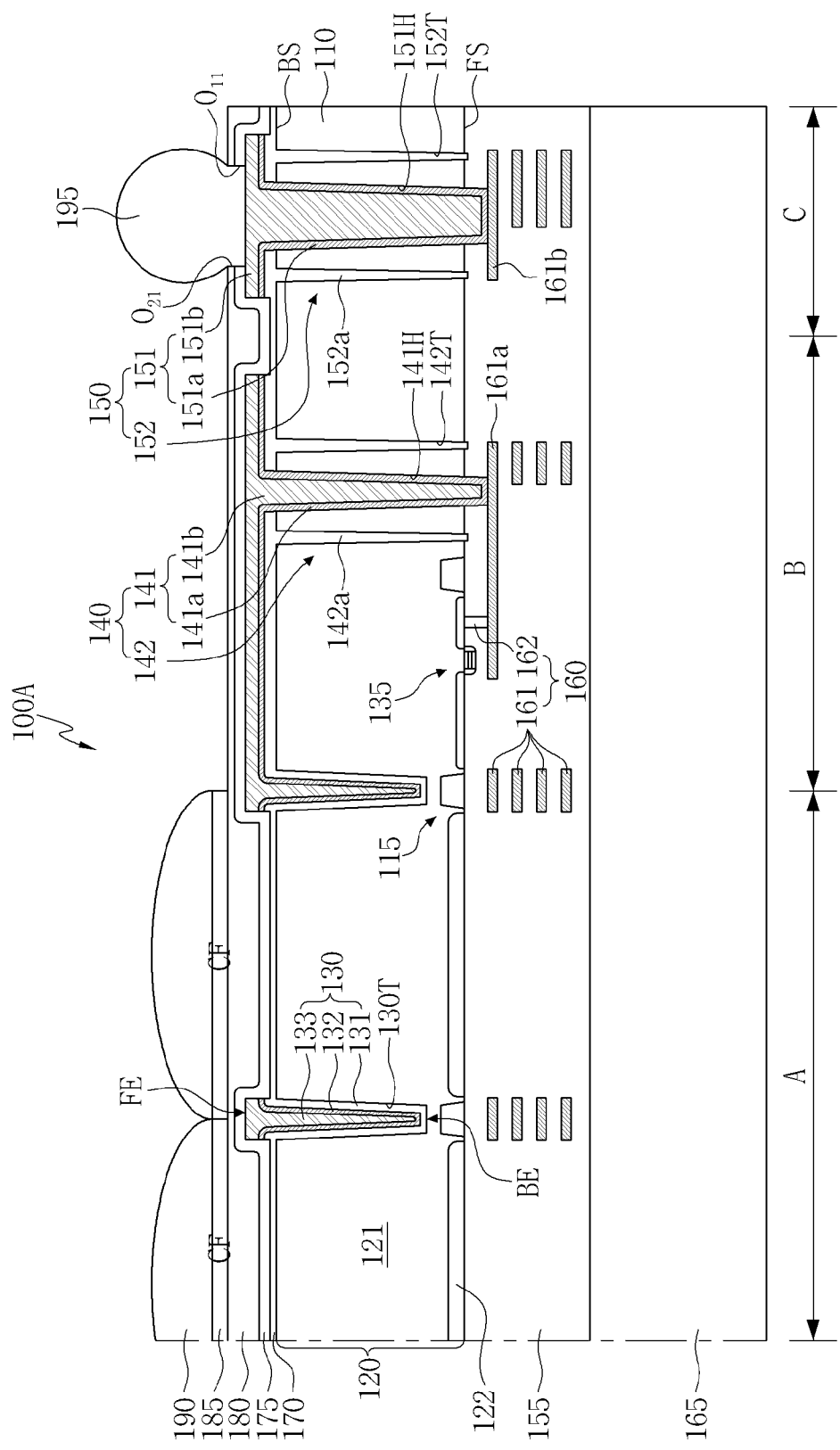
FIG. 1B is a longitudinal-sectional view taken along line I-I' of the image sensor shown in FIG. 1A according to at least one example embodiment of the inventive concepts.

FIG. 1A is a schematic layout illustrating image sensors 100A and 100B according to example embodiments of the inventive concepts, and FIG. 1B is a longitudinal-sectional view taken along line I-I' of the image sensor 100A shown in FIG. 1A according to at least one example embodiment of the inventive concepts.

Referring to FIGS. 1A and 1B, an image sensor 100A according to at least one example embodiment of the inventive concepts may include a semiconductor substrate 110, an area isolation structure 115, a plurality of photoelectric conversion devices 120, a device isolation structure 130, a voltage applying device 135, a voltage connection structure 140, a through via structure 150, an insulating layer 155, and an internal circuit 160. The image sensor 100A according to at least one example embodiment of the inventive concepts may further include a supporting substrate 165, an anti-reflective layer 170, and a protective film 175, a planarized film 180, a color filter 185, and a microlens 190. The image sensor 100A according to at least one example embodiment of the inventive concepts may be a backside illuminated image (BSI) sensor.

The example semiconductor substrate 110 may include a silicon bulk wafer. Further, the example semiconductor substrate 110 may include an epitaxial layer grown on a bulk substrate by an epitaxial process. The semiconductor substrate 110 may have a front side FS and a back side BS facing each other. Further, the semiconductor substrate 110 may include a pixel area A, a voltage connection area B, and a pad area C.

The area isolation structure 115 may define the pixel area A, the voltage connection area B, and the pad area C in the semiconductor substrate 110. The area isolation structure 115 may be formed by filling the inside of a trench vertically penetrating or projecting into a portion of the semiconductor substrate 110 relatively shallowly from the front side FS of the semiconductor substrate 110 with an insulating material. For example, the area isolation structure 115 may include silicon oxide. The area isolation structure 115 may be a shallow trench isolation (STI) structure.

The plurality of photoelectric conversion devices 120 may absorb incident light, and accumulate an electric charge corresponding to an amount of the incident light. Each of the photoelectric conversion devices 120 may include a photodiode 121 and a pinning layer 122 formed in the pixel area A of the semiconductor substrate 110. The photodiode 121 and the pinning layer 122 may be formed by performing an ion implantation process on the pixel area A of the semiconductor substrate 110 and doping impurities of different types. The photodiode 121 may be formed to be relatively deep from the front surface FS toward the back side BS of the semiconductor substrate 110, or may extend from the back side BS to close to the front side FS, and the pinning layer 122 may be formed to be relatively shallow from the front surface FS toward the back side BS of the semiconductor substrate 110. An electric charge generated by the incident light may be accumulated in the photodiode 121.

The device isolation structure 130 may be formed between the photoelectric conversion devices 120, and may physically isolate the photoelectric conversion devices 120.

The device isolation structure 130 may extend from substantially the back side BS to substantially the front side FS of the semiconductor substrate 110, the front end FE of the device isolation structure 130 may protrude further than the back side of the semiconductor substrate 110. A back end BE of the device isolation structure 130 may be in the semiconductor substrate 110, and may be relatively closer to the front side FS than to the back side BS of the semiconductor substrate 110. A cross section of the device isolation structure 130 may have the form of a grid (refer to FIG. 1A).

The device isolation structure 130 may include a device isolation trench 130T penetrating or projecting into a portion of the semiconductor substrate 110 relatively deeply into the photodiode 121 from the back side BS of the semiconductor substrate 110, a device isolation insulating pattern 131 conformally formed on an inner wall of the device isolation trench 130T, a first device isolation conductive pattern 132 conformally formed on the device isolation insulating pattern 131, and a second device isolation conductive pattern 133 formed to fill the inside of the device isolation trench 130T on the first device isolation conductive pattern 132.

The device isolation insulating pattern 131 may be materially in continuity with the anti-reflective layer 170 formed on the back side BS of the semiconductor substrate 110. The device isolation insulating pattern 131 may be formed as a single layer or a multi-layer. For example, the device isolation insulating pattern 131 may include silicon nitride or tantalum oxide. Further, the device isolation insulating pattern 131 may be formed by stacking silicon nitride and tantalum oxide.

The first and second device isolation conductive patterns 132 and 133 may include a low-resistance conductive material. The first device isolation conductive pattern 132 may include a material capable of being conformally formed to a lower portion of the device isolation trench 130T. For example, the first device isolation conductive pattern 132 may include tungsten (W). The second device isolation conductive pattern 133 may include an excellent conductive material, and may be formed to have a sufficient thickness to fill the inside of the device isolation trench 130T. For example, the second device isolation conductive pattern 133 may include aluminum (Al) and doped polysilicon. The device isolation structure 130 may be a deep trench isolation (DTI) structure.

The voltage applying device 135 may be electrically connected to the device isolation structure 130, and may be configured to apply a desired, or alternatively predetermined voltage. Further, the voltage applying device 135 may monitor a dark current generated by the device isolation structure 130. The voltage applying device 135 can remove the dark current by applying a voltage (for example, a negative voltage) corresponding to the monitored dark current to the device isolation structure 130. For example, the voltage applying device 135 may include a metal oxide semiconductor (MOS) transistor. In FIG. 1B, the voltage applying device 135 is illustrated to be a MOS, but a plurality of the voltage applying devices 135 (refer to FIG. 1A) may be electrically connected to the device isolation structure 130.

The voltage connection structure 140 may electrically connect the device isolation structure 130 and the voltage applying device 135. The voltage connection structure 140 may include a voltage connection contact plug 141 electrically connected to the voltage applying device 135, and a voltage connection insulating area 142 being spaced apart from and covering a side of the voltage connection contact plug 141.

The voltage connection contact plug 141 may include a first voltage connection conductive pattern 141a conformally formed on an inner wall of the voltage connection contact hole 141H vertically penetrating or projecting into the semiconductor substrate 110 in the voltage connection area B, and a second voltage connection conductive pattern 141b formed to fill the inside of the voltage connection contact hole 141H on the first voltage connection conductive pattern 141a.

The voltage connection contact hole 141H may penetrate the semiconductor substrate 110, be recessed further into the insulating layer 155 formed on the front side FS of the semiconductor substrate 110, and expose the internal circuit 160 (for example, a device connection inner wire 161a) electrically connected to the voltage applying device 135. Accordingly, the first voltage connection conductive pattern 141a may be in direct contact with the exposed internal circuit 160 (for example, the device connection inner wire 161a).

The first and second voltage connection conductive patterns 141a and 141b may include a low-resistance conductive material. The first voltage connection conductive pattern 141a may include a material capable of being conformally formed to a lower portion of the voltage connection contact hole 141H. For example, the first voltage connection conductive pattern 141a may include tungsten (W). The first voltage connection conductive pattern 141a may be materially in continuity with the first device isolation conductive pattern 132. The second voltage connection conductive pattern 141b may include an excellent conductive material, and be formed to have a thickness sufficient to fill the inside of the voltage connection contact hole 141H. For example, the second voltage connection conductive pattern 141b may include aluminum (Al) and doped polysilicon. The second voltage connection conductive pattern 141b may be materially in continuity with the second device isolation conductive pattern 133.

The voltage connection insulating area 142 may include a voltage connection insulating pattern 142a filling the inside of the voltage connection insulating trench 142T vertically penetrating or projecting into the semiconductor substrate 110 and being spaced apart by a desired, or alternatively predetermined distance from, and covering the side of, the voltage connection contact plug 141. Here, the voltage connection insulating trench 142T may penetrate the semiconductor substrate 110, and be recessed further into the insulating layer 155 formed on the front side FS of the semiconductor substrate 110. The voltage connection insulating pattern 142a may be materially in continuity with the anti-reflective layer 170 and the device isolation insulating pattern 131. The voltage connection insulating pattern 142a may include silicon nitride and/or tantalum oxide. Further, the voltage connection insulating pattern 142a may be formed by stacking silicon nitride and/or tantalum oxide. A cross section of the voltage connection insulating area 142 may have the shape of a ring with a circular, elliptical, or polygon shape. The voltage connection structure 140 may be formed in the same level as the device isolation structure 130.

The through via structure 150 may vertically penetrate the semiconductor substrate 110, and may be electrically connected to the internal circuit 160. The through via structure 150 may include a through via contact plug 151 being in direct contact with the internal circuit 160, and a through via insulating area 152 being spaced apart from and covering a side of the through via contact plug 151.

The through via contact plug 151 may include a first through via conductive pattern 151a conformally formed on an inner wall of the through via contact hole 151H vertically penetrating or projecting into the semiconductor substrate 110 in the pad area C, and a second through via conductive pattern 151b formed to fill the inside of the through via contact hole 151H on the first through via conductive pattern 151a.

The through via contact hole 151H may penetrate the semiconductor substrate 110, be recessed further into the insulating layer 155 formed on the front side FS of the semiconductor substrate 110, and expose the internal circuit 160 (for example, a pad connection inner wire 161b). Accordingly, the first through via conductive pattern 151a may be in direct contact with the exposed internal circuit 160 (for example, the pad connection inner wire 161b).

The first and second through via conductive patterns 151a and 151b may include a low-resistance conductive material. The first through via conductive pattern 151a may include a material that can be conformally formed to a lower portion of the through via contact hole 151H. For example, the first through via conductive pattern 151a may include tungsten (W). The first through via conductive pattern 151a may be the same material formed in the same level as the first device isolation conductive pattern 132 and the first voltage connection conductive pattern 141a. The second through via conductive pattern 151b may include an excellent conductive material, and be formed to have a thickness sufficient to fill the inside of the through via contact hole 151H. For example, the second through via conductive pattern 151b may include aluminum (Al) and doped polysilicon. The second through via conductive pattern 151b may be the same material formed in the same level as the second device isolation conductive pattern 133 and the second voltage connection conductive pattern 141b. A portion of an upper surface of the second through via conductive pattern 151b may be exposed, and the second through via conductive pattern 151b may be used as a through via pad.

The through via insulating area 152 may include a through via insulating pattern 152a filling the inside of the through via insulating trench 152T vertically penetrating or projecting into the semiconductor substrate 110 of being spaced apart by a desired, or alternatively predetermined distance from and covering a side of the through via contact plug 151. The through via insulating trench 152T may penetrate the semiconductor substrate 110, and be recessed further into the insulating layer 155 formed on the front side FS of the semiconductor substrate 110. The through via insulating pattern 152a may be materially in continuity with the anti-reflective layer 170, the device isolation insulating pattern 131, and the voltage connection insulating pattern 142a. The through via insulating pattern 152a may include silicon nitride and/or tantalum oxide. Further, the through via insulation pattern 152a may be formed by stacking silicon nitride and tantalum oxide. A cross section of the through via insulating area 152 may have a form of a ring with a circular, elliptical, or polygon shape. The through via structure 150 may be formed in the same level as the device isolation structure 130 and the voltage connection structure 140.

The insulating layer 155 may be substantially entirely formed on the front side FS of the semiconductor substrate 110. In FIG. 1B, the insulating layer 155 is illustrated in a single layer, but may not be limited to a single layer and may be formed in a multi-layer. For example, the insulating layer 155 may include silicon oxide. A supporting substrate 165 may be formed on the insulating layer 155.

The internal circuit 160 may be arranged in the insulating layer 155, and be formed to be electrically connected to the voltage applying device 135, the voltage connection structure 140, and/or the through via structure 150. The internal circuit 160 may include a plurality of inner wires 161 formed between and/or on the plurality of insulating layers 155, and an inner via 162 formed to penetrate the insulating layer 155 vertically. The plurality of inner wires 161 may include a device connection inner wire 161$a$ formed in the insulating layer 155 corresponding to the voltage connection area B of the semiconductor substrate 110 and electrically connect the voltage applying device 135 and the voltage connection structure 140, and a pad connection inner wire 161$b$ formed in the insulating layer 155 corresponding to the pad area C of the semiconductor substrate 110 and being electrically connected to the through via structure 150. The inner via 162 may vertically electrically connect the voltage applying device 135 and the device connection inner wire 161$a$. The internal circuit 160 may be covered or surrounded by the insulating layer 155. The internal circuit 260 may include a conductor such as doped silicon, a metal, a metal silicide, a metal alloy, a metal compound.

The anti-reflective layer 170 may be conformally formed on the back side BS of the semiconductor substrate 110, and on inner walls of the device isolation trench 130T, the voltage connection insulating trench 142T, and the through via insulating trench 152T. Material and thickness, etc. of the anti-reflective layer 170 may be varied according to a wavelength of light using in a photolithography process, and the anti-reflective layer 170 may be formed in a single layer or a multi-layer. The anti-reflective layer 170 may be materially in continuity with, or be of the same material as, and be formed in the same level as the device isolation insulating pattern 131, the voltage connection insulating pattern 142$a$, and the through via insulating pattern 152$a$. For example, the anti-reflective layer 170 may include silicon nitride and/or tantalum oxide.

The protective film 175 may be conformally formed on the anti-reflective layer 170, the device isolation structure 130, the voltage connection structure 140, and the through via structure 150. The protective film 175 may have a first pad connection opening $O_{11}$ exposing a portion of an upper surface of the second through via conductive pattern 151$b$ (see FIG. 5S). The protective film 175 may include silicon nitride, silicon oxide, or silicon oxynitride.

The planarized film 180 may be formed on the protective film 175. The planarized film 180 may include a second pad connection opening $O2_1$ being vertically aligned with the first pad connection opening $O_{11}$, and exposing a portion of an upper surface of the second through via conductive pattern 151$b$ (see FIG. 5S). The planarized film 180 may include an organic material such as photoresist.

In this embodiment, the second through via conductive pattern 151$b$ exposed through the first and second pad connection openings $O_{11}$, $O_{21}$ may be used as a through via pad, and a solder ball 195 may be bonded on the exposed second through via conductive pattern 151$b$.

The color filter 185 may be formed to include a corresponding pigment on the planarized film 180 and to overlap each of the photoelectric conversion devices 120 in the pixel area A of the semiconductor substrate 110.

The microlens 190 may be formed on the color filter 185. The microlens 190 may be formed by reflowing a photoresist pattern.

Figure 2:
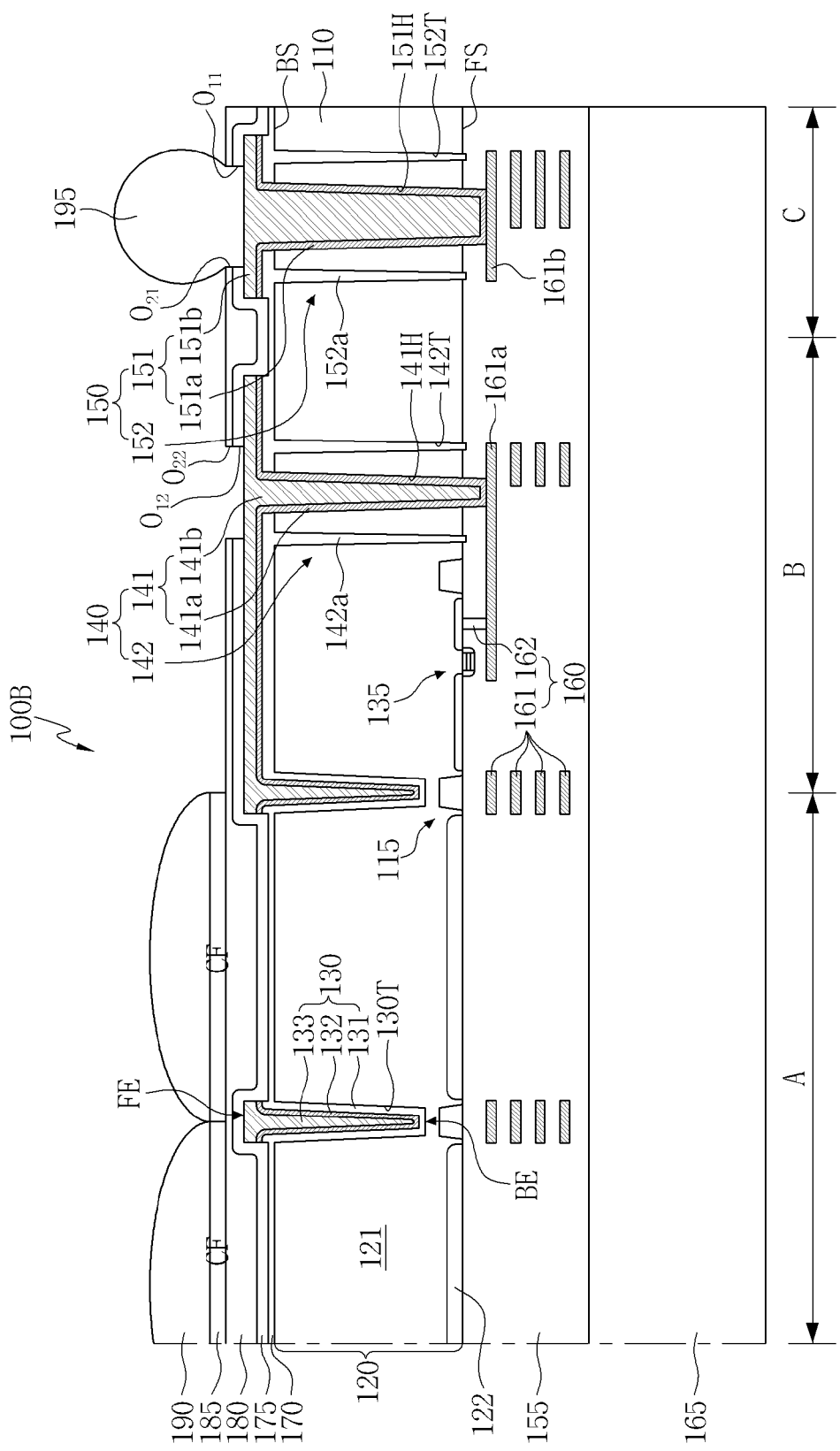
FIG. 2 is a longitudinal-sectional view taken along line I-I' of the image sensor shown in FIG. 1A according to at least one example embodiment of the inventive concepts.

FIG. 2 is a longitudinal-sectional view taken along line I-I' of the image sensor 100B shown in FIG. 1A according to at least one example embodiment of the inventive concepts. Since an image sensor 100B according to at least one example embodiment of the inventive concepts shown in FIG. 2 has the same structure as the image sensor 100A according to one example embodiment of the inventive concepts shown in FIG. 1B excluding the protective film 175 and the planarized film 180, detailed description for the same structure will be omitted.

Referring to FIGS. 1A and 2, the image sensor 100B according to at least one example embodiment of the inventive concepts may include a semiconductor substrate 110, an area isolation structure 115, a plurality of photoelectric conversion devices 120, a device isolation structure 130, a voltage applying device 135, a voltage connection structure 140, a through via structure 150, an insulating layer 155, and an internal circuit 160. Further, the image sensor 100B according to another example embodiment of the inventive concepts may further include a supporting substrate 165, an anti-reflective layer 170, a protective film 175, a planarized film 180, a color filter 185, and a microlens 190. The image sensor 100B according to another example embodiment of the inventive concepts may be a backside illuminated image sensor (BSI).

The protective film 175 may be conformally formed on the anti-reflective layer 170, the device isolation structure 130, the voltage connection structure 140, and the through via structure 150. The protective film 175 may include a first pad connection opening $O_{11}$ exposing a portion of an upper surface of the second through via conductive pattern 151$b$, and a first voltage connection opening $O_{12}$ exposing a portion of an upper surface of the second voltage connection conductive pattern 141$b$. The protective film 175 may include silicon nitride, silicon oxide, or silicon oxynitride.

The planarized film 180 may be formed on the protective film 175. The planarized film 180 may include a second pad connection opening $O_{21}$ being vertically aligned with the first pad connection opening $O_{11}$ and exposing a portion of the upper surface of the second through via conductive pattern 151$b$, and a second voltage connection opening $O_{22}$ being vertically aligned with the first voltage connection opening $O_{12}$ and exposing a portion of the upper surface of the second voltage connection conductive pattern 141$b$. The planarized film 180 may include an organic material such as photoresist.

In this example embodiment, the second through via conductive pattern 151$b$ exposed through the first and second pad connection openings $O_{11}$, $O_{21}$ may be used as a through via pad, and a solder ball 195 may be bonded on the exposed second through via conductive pattern 151$b$. The second voltage connection conductive pattern 141$b$ exposed through the first and second pad connection openings $O_{21}$, $O_{22}$ may be used as a voltage connection pad, and an external circuit (for example, a voltage applying module) may be connected on the exposed second voltage connection conductive pattern 141$b$. The external circuit may apply a desired, or alternatively predetermined voltage (for example, a negative voltage) to the device isolation structure 130 through the voltage connection structure 140. When the voltage is applied to the device isolation structure 130, a dark current generated on a boundary surface of the device isolation structure 130 and the semiconductor substrate 110 can be reduced.

Figure 3A:
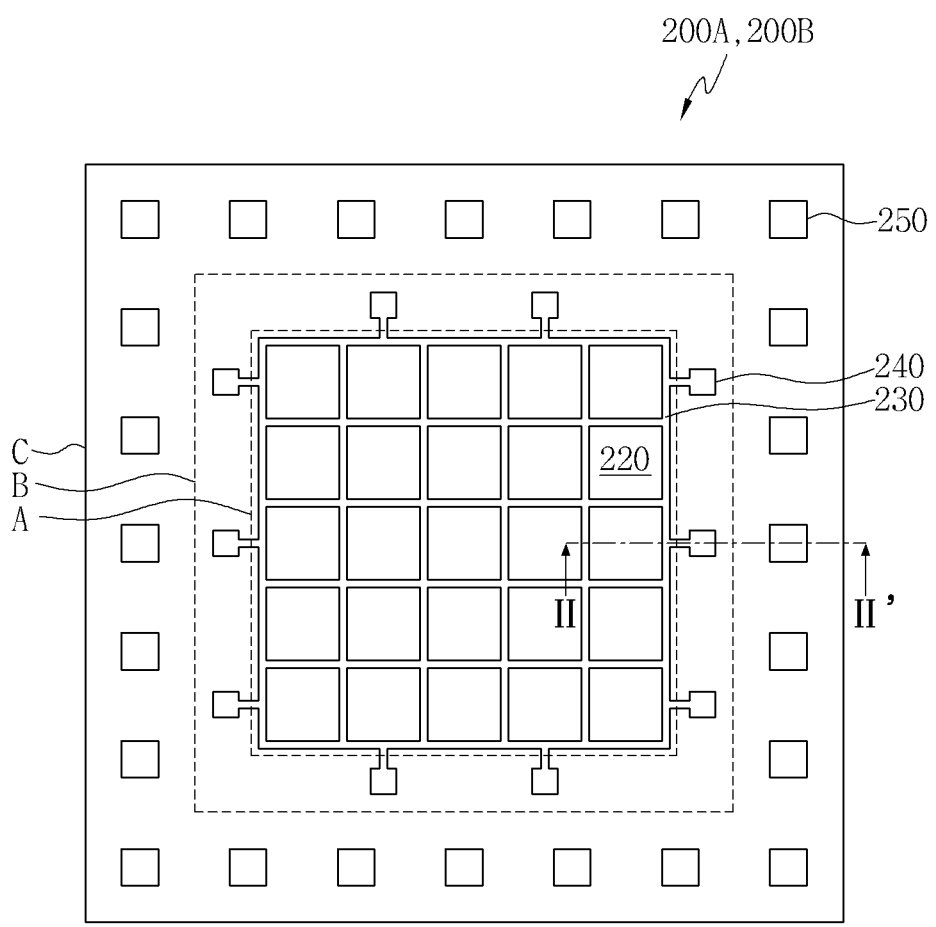
FIG. 3A is a schematic layout illustrating an image sensor according to at least one example embodiment of the inventive concepts.
Figure 3B:
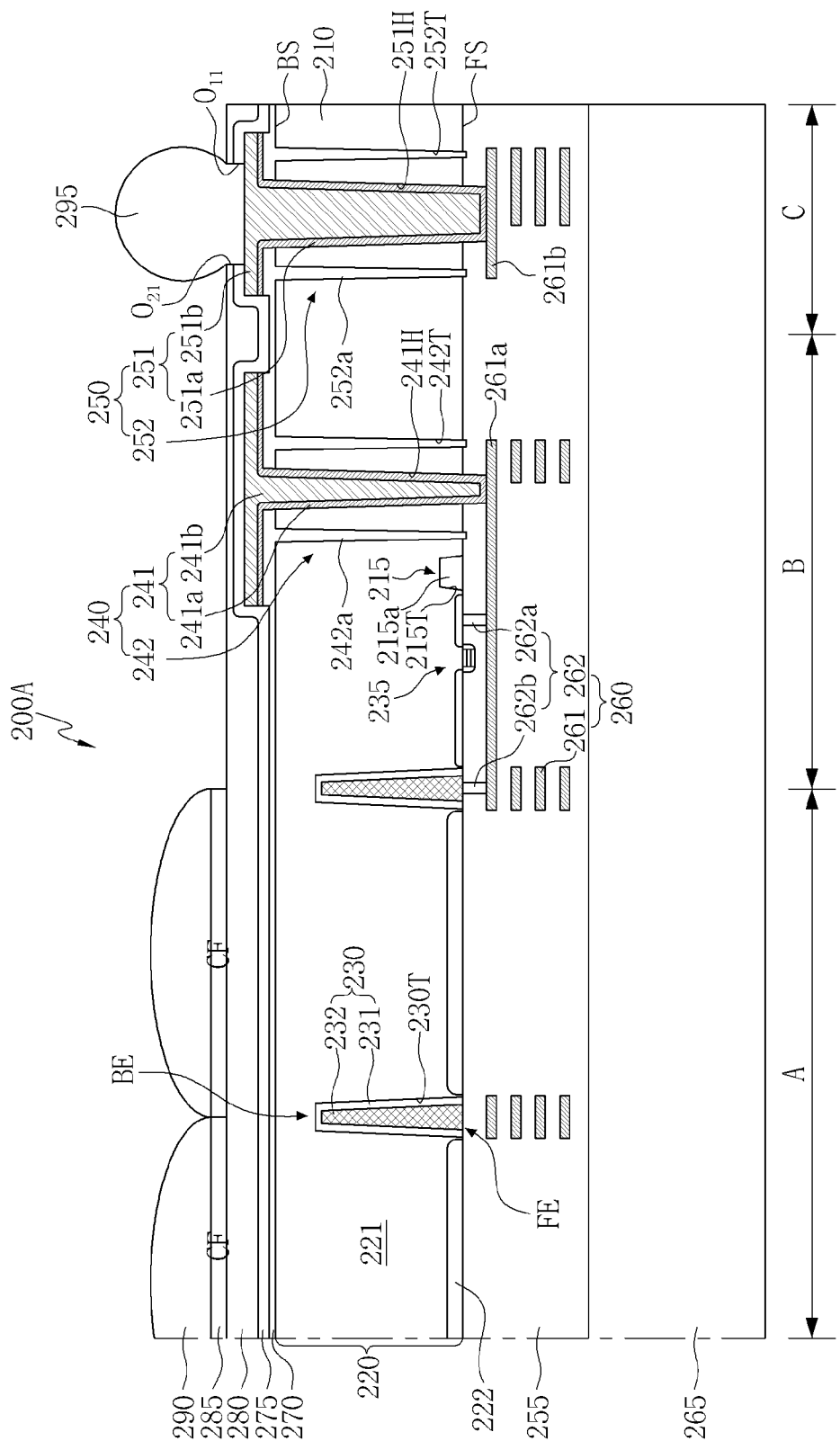
FIG. 3B is a longitudinal-sectional view taken along line II-II' of the image sensor shown in FIG. 3A according to at least one example embodiment of the inventive concepts.

FIG. 3A is a schematic layout illustrating an image sensors 200A and 200B according to at least one example embodiments of the inventive concepts, and FIG. 3B is a longitudinal-sectional view taken along line II-II' of the image sensor 200A shown in FIG. 3A according to an example embodiments of the inventive concepts.

Referring to FIGS. 3A and 3B, an image sensor 200A according to at least one example embodiments of the inventive concepts may include a semiconductor substrate 210, an area isolation structure 215, a plurality of photoelectric conversion devices 220, a device isolation structure 230, a voltage applying device 235, a voltage connection structure 240, a through via structure 250, an insulating layer 255, and an internal circuit 260. Further, the image sensor 200A according to at least one example embodiment of the inventive concepts may further include a protective film 275, a planarized film 280, a color filter 285, and a microlens 290. The image sensor 100A according to at least one example embodiment of the inventive concepts may be a backside illuminated image sensor (BSI).

The semiconductor substrate 210 may include a silicon bulk wafer. Further, the semiconductor substrate 210 may include an epitaxial layer grown on a bulk substrate by an epitaxial process. The semiconductor substrate 210 may have a front side FS and a back side BS facing each other. Further, the semiconductor substrate 210 may include a pixel area A, a voltage connection area B, and a pad area C.

The area isolation structure 215 may define the pixel area A, the voltage connection area B, and the pad area C in the semiconductor substrate 210. The area isolation structure 215 may be formed by filling the inside of an area isolation trench 215T vertically penetrating or projecting into a portion of the semiconductor substrate 210 relatively shallowly from the front side FS of the semiconductor substrate 210 with an insulating material. For example, the area isolation structure 215 may include silicon oxide. The area isolation structure 215 may be a shallow trench isolation (STI) structure.

The plurality of photoelectric conversion devices 220 may absorb incident light, and accumulate an electric charge corresponding to an amount of the incident light. Each of the photoelectric conversion devices 220 may include a photodiode 221 and a pinning layer 222 formed in the pixel area A of the semiconductor 210. The photodiode 221 and the pinning layer 222 may be formed by performing an ion implantation process in the pixel area A of the semiconductor substrate 210, and doping impurities of different types. The photodiode 221 may extend substantially from the front surface FS toward the back side BS of the semiconductor substrate 210, and the pinning layer 222 may be formed to be relatively shallow from the front surface FS toward the back side BS of the semiconductor substrate 210. The electric charge generated by the incident light may be accumulated in the photodiode 221.

The device isolation structure 230 may be formed between the photoelectric conversion devices 220, and may physically isolate the photoelectric conversion devices 220.

The device isolation structure 230 may extend substantially from the back side BS to the front side FS of the semiconductor substrate 210, and a front end FE of the device isolation structure 230 may be coplanar with the front side FS of the semiconductor substrate 210. A back end BE of the device isolation structure 230 may be in the semiconductor substrate 210, and may be relatively nearer to the back side BS than the front side FS of the semiconductor substrate 210. A cross section of the device isolation structure 130 may be in the form of a grid (see FIG. 3A).

The device isolation structure 230 may include a device isolation insulating pattern 231 conformally formed on an inner wall of a device isolation trench 230T penetrating or projecting into a portion of the semiconductor substrate 210 up to a substantial depth from the front side FS of the semiconductor substrate 210, and a device isolation conductive pattern 232 formed to fill the inside of the device isolation trench 230T on the device isolation insulating pattern 231.

The device isolation insulating pattern 231 may be formed as a single layer or a multi-layer. For example, the device isolation insulating pattern 231 may include silicon nitride and/or tantalum oxide. Further, the device isolation insulating pattern 231 may be formed by stacking silicon nitride and tantalum oxide.

The device isolation conductive patterns 232 may include an excellent conductive material, and may be formed to have a thickness sufficient to fill the inside of the device isolation trench 230T. For example, the device isolation conductive pattern 232 may include doped polysilicon. The device isolation structure 230 may be or include deep trench isolation (DTI) structure.

The voltage applying device 235 may be electrically connected to the device isolation structure 230, and apply a desired, or alternatively predetermined voltage. Further, the voltage applying device 235 may monitor a dark current generated by the device isolation structure 230. The voltage applying device 235 may be configured to remove the dark current by applying a voltage (for example, a negative voltage) corresponding to the monitored dark current to the device isolation structure 230. For example, the voltage applying device 235 may include a metal oxide semiconductor (MOS) transistor. In FIG. 3B, the voltage applying device 235 is illustrated as one, but a plurality of the voltage applying devices 235 (see FIG. 3A) may be electrically connected to the device isolation structure 230.

The insulating layer 255 may be entirely formed on the front side FS of the semiconductor substrate 210. In FIG. 3B, the insulating layer 255 is illustrated as a single layer, but the insulating layer 255 may be formed in a multi-layer. For example, the insulating layer 255 may include silicon oxide.

The internal circuit 260 may be arranged in the insulating layer 255, and may be electrically connected to the voltage applying device 235, and/or the device isolation structure 230. The internal circuit 260 may include a plurality of inner wires 261 and a plurality of inner vias 262. The inner wire 261 may transfer an electric signal in a horizontal direction. The inner wire 261 may include a device connection inner wire 261a electrically connected to the voltage applying device 235 and/or the device isolation structure 230, and a pad connection inner wire 261b connected to an external circuit or exposed such that a solder ball 295 is stacked. The internal vias 262 may be vertically connected to the voltage applying device 235, the device isolation structure 230, and/or the inner wires 261, and transfer electric signals. The internal vias 262 may include a device connection inner via 262a connecting the voltage applying device 235 and the device connection inner wire 261a vertically and electrically, and a voltage connection inner via 262b connecting the device isolation structure 230 and the device connection inner wire 261a vertically and electrically. The internal circuit 260 may be covered or surrounded by the insulating layer 255. The internal circuit 260 may include a conductor such as doped silicon, a metal, a metal silicide, a metal alloy, or a metal compound.

The voltage connection structure 240 may electrically connect to the device isolation structure 230 and/or the voltage applying device 235. The voltage connection structure 240 may include a voltage connection contact plug 241 being in direct contact with the internal circuit 260 (for example, the device connection inner wire 261a) electrically connected to the device isolation structure 230 and/or the voltage applying device 235, and a voltage connection insulating area 242 being spaced apart from, and covering a side of, the voltage connection contact plug 241.

The voltage connection contact plug 241 may include a first voltage connection conductive pattern 241a conformally formed on an inner wall of the voltage connection contact hole 241H vertically penetrating or projecting into the semiconductor substrate 210 in the voltage connection area B, and a second voltage connection conductive pattern 241b formed to fill the inside of the voltage connection contact hole 241H on the first voltage connection conductive pattern 241a.

The voltage connection contact hole 241H may penetrate the semiconductor substrate 210, be recessed further into the insulating layer 255 formed on the front side FS of the semiconductor substrate 210, and expose the internal circuit 260 (for example, a device connection inner wire 261a) electrically connected to the voltage applying device 235. Accordingly, the first voltage connection conductive pattern 241a may be in direct contact with the exposed internal circuit 260 (for example, the device connection inner wire 261a).

The first and second voltage connection conductive patterns 241a and 241b may include a low-resistance conductive material. The first voltage connection conductive pattern 241a may include a material capable of being conformally formed to a lower portion of the voltage connection contact hole 241H. For example, the first voltage connection conductive pattern 241a may include tungsten (W). The first voltage connection conductive pattern 241a may be materially in continuity with the first device isolation conductive pattern 232. The second voltage connection conductive pattern 241b may include an excellent conductive material, and the voltage connection contact hole 241H may have a thickness sufficient to fill the inside of the voltage connection contact hole 241H. For example, the second voltage connection conductive pattern 241b may include aluminum (Al) and doped polysilicon.

The voltage connection insulating area 242 may include a voltage connection insulating pattern 242a filling the inside of the voltage connection insulating trench 242T vertically penetrating or projecting into the semiconductor substrate 210 of being spaced apart by a desired, or alternatively predetermined distance from and covering a side of the voltage connection contact plug 241. Here, the voltage connection insulating trench 242T may penetrate the semiconductor substrate 210, and be recessed further into the insulating layer 255 formed on the front side FS of the semiconductor substrate 210. The voltage connection insulating pattern 242a may be materially in continuity with the anti-reflective layer 270. The voltage connection insulating pattern 242a may include silicon nitride and/or tantalum oxide. The voltage connection insulating pattern 242a may be formed by stacking silicon nitride and tantalum oxide. A cross section of the voltage connection insulating area 242 may have the shape of a ring with a circular, elliptical, or polygon shape.

The through via structure 250 may vertically penetrate the semiconductor substrate 210, and be electrically connected to the internal circuit 260. The through via structure 250 may include a through via contact plug 251 being in direct contact with the internal circuit 260, and a through via insulating area 252 being spaced apart from, and covering a side of, the through via contact plug 251.

The through via contact plug 251 may include a first through via conductive pattern 251a conformally formed on an inner wall of the through via contact hole 251H vertically penetrating or projecting into the semiconductor substrate 210 in the pad area C, and a second through via conductive pattern 251b formed to fill the inside of the through via contact hole 251H on the first through via conductive pattern 251a.

The through via contact hole 251H may penetrate the semiconductor substrate 210, be recessed further into the insulating layer 255 formed on the front side FS of the semiconductor substrate 210, and expose the internal circuit 260 (for example, a pad connection inner wire 261b). Accordingly, the first through via conductive pattern 251a may be in direct contact with the exposed internal circuit 260 (for example, the pad connection inner wire 261b).

The first and second through via conductive patterns 251a and 251b may include a low-resistance conductive material. The first through via conductive pattern 251a may include a material that can be conformally formed to a lower portion of the through via contact hole 251H. For example, the first through via conductive pattern 251a may include tungsten (W). The first through via conductive pattern 251a may be the same material formed in the same level as the first voltage connection conductive pattern 241a. The second through via conductive pattern 251b may include an excellent conductive material, and be formed to have a thickness sufficient to fill the inside of the through via contact hole 251H. For example, the second through via conductive pattern 251b may include aluminum (Al) and doped polysilicon. The second through via conductive pattern 251b may be the same material formed in the same level as the second voltage connection conductive pattern 241b. A portion of an upper surface of the second through via conductive pattern 251b may be exposed, and the second through via conductive pattern 251b may be used as a through via pad.

The through via insulating area 252 may include a through via insulating pattern 252a filling the inside of the through via insulating trench 252T vertically penetrating or projecting into the semiconductor substrate 210 and being spaced apart by a desired, or alternatively predetermined distance from, and covering a side of, the through via contact plug 251. The through via insulating trench 252T may penetrate the semiconductor substrate 210, and may be further recessed into the insulating layer 255 formed on the front side FS of the semiconductor substrate 210. The through via insulating pattern 252a may be materially in continuity with the anti-reflective layer 270 and the voltage connection insulating pattern 242a. The through via insulating pattern 252a may include silicon nitride and/or tantalum oxide. Further, the through via insulating pattern 252a may be formed by stacking silicon nitride and tantalum oxide. A cross section of the through via insulating pattern 252a may have the shape of a ring with a circular, elliptical, or polygon shape. The through via structure 250 may be formed in the same level as the voltage connection structure 240.

The protective film 275 may be conformally formed on the anti-reflective layer 270, the device isolation structure 230, the voltage connection structure 240, and the through via structure 250. The protective film 275 may have a first pad connection opening $O_{11}$ exposing a portion of an upper surface of the second through via conductive pattern 251b. The protective film 275 may include silicon nitride, silicon oxide, or silicon oxynitride.

The planarized film 280 may be formed on the protective film 275. The planarized film 280 may include a second pad connection opening $O_{21}$ being vertically aligned with the first pad connection opening $O_{11}$, and exposing a portion of an upper surface of the second through via conductive pattern 251b. The planarized film 280 may include an organic material such as photoresist.

In this example embodiment, a solder ball 295 may be bonded on the second through via conductive pattern 251b exposed through the first and second pad connection openings $O_{11}$ and $O_{21}$.

The color filter 285 may be formed to include a corresponding pigment on the planarized film 280 to overlap each of the photoelectric conversion devices 220 in the pixel area A of the semiconductor substrate 210.

The microlens 290 may be formed on the color filter 285. The microlens 290 may be formed by reflowing a photoresist pattern.

Figure 4:
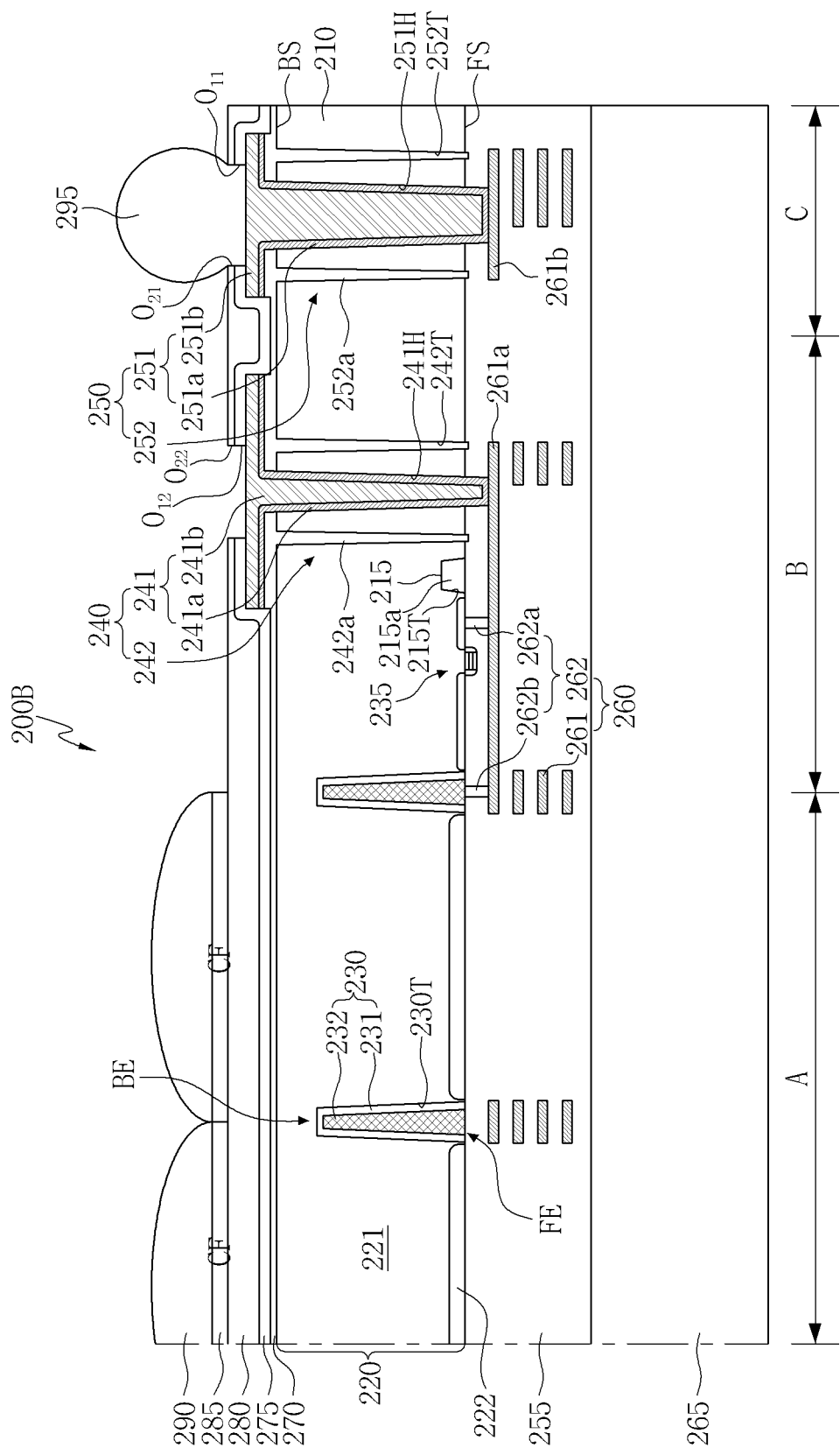
FIG. 4 is a longitudinal-sectional view taken along line II-II' of the image sensor shown in FIG. 3A according to at least one example embodiment of the inventive concepts.

FIG. 4 is a cross-sectional view taken along line II-II' of the image sensor 200B shown in FIG. 3A according to at least one example embodiments of the inventive concepts. Since an image sensor 200B according to an example embodiment of the inventive concepts shown in FIG. 4 has the same structure as the image sensor 200A according to the example embodiment of the inventive concepts shown in FIG. 3B excluding the protective film 275 and the planarized film 280, detailed description for the same structure will be replaced with the foregoing description.

Referring to FIGS. 3A and 4, an image sensor 200B according to at least one example embodiment of the inventive concepts may include a semiconductor substrate 210, an area isolation structure 215, a plurality of photoelectric conversion devices 220, a device isolation structure 230, a voltage applying device 235, a voltage connection structure 240, a through via structure 250, an insulating layer 255, and an internal circuit 260. Further, the image sensor 200B according to an example embodiment of the inventive concepts may further include a protective film 275, a planarized film 280, a color filter 285, and a microlens 290. The image sensor 200B according to at least one example embodiment of the inventive concepts may be a backside illuminated image sensor (BSI).

The protective film 275 may be conformally formed on the anti-reflective layer 270, the voltage connection structure 240, and the through via structure 250. The protective film 275 may include a first pad connection opening $O_{11}$ exposing a portion of an upper surface of the second through via conductive pattern 251b, and a first voltage connection opening $O_{12}$ exposing a portion of an upper surface of the second voltage connection conductive pattern 241b. The protective film 275 may include silicon nitride, silicon oxide, or silicon oxynitride.

The planarized film 280 may be formed on the protective film 275. The planarized film 280 may include a second pad connection opening $O_{21}$ being vertically aligned with the first pad connection opening $O_{11}$ and exposing a portion of the upper surface of the second through via conductive pattern 251b, and a second voltage connection opening $O_{22}$ being vertically aligned with the first voltage connection opening $O_{12}$ and exposing a portion of the upper surface of the second voltage connection conductive pattern 241b. The planarized film 280 may include an organic material such as photoresist.

In this example embodiment, the second through via conductive pattern 251b exposed through the first and second pad connection openings $O_{11}$ and $O_{21}$ may be used as a through via pad, and a solder ball 295 may be bonded on the second through via conductive pattern 251b. The second voltage connection conductive pattern 241b exposed through the first and second voltage connection openings $O_{12}$ and $O_{22}$ may be used as a voltage connection pad, and an external circuit (for example, a voltage applying module) may be connected on the second voltage connection conductive pattern 241b. The external circuit may apply a desired, or alternatively predetermined voltage (for example, a negative voltage) to the device isolation structure 230 through the voltage connection structure 240 and the internal circuit 260 including the device connection inner wire 261a and a voltage connection inner via 262b. When the voltage is applied to the device isolation structure 230, a dark current generated on a boundary surface of the device isolation structure 230 and the semiconductor substrate 210 can be reduced.

Figure 5A:
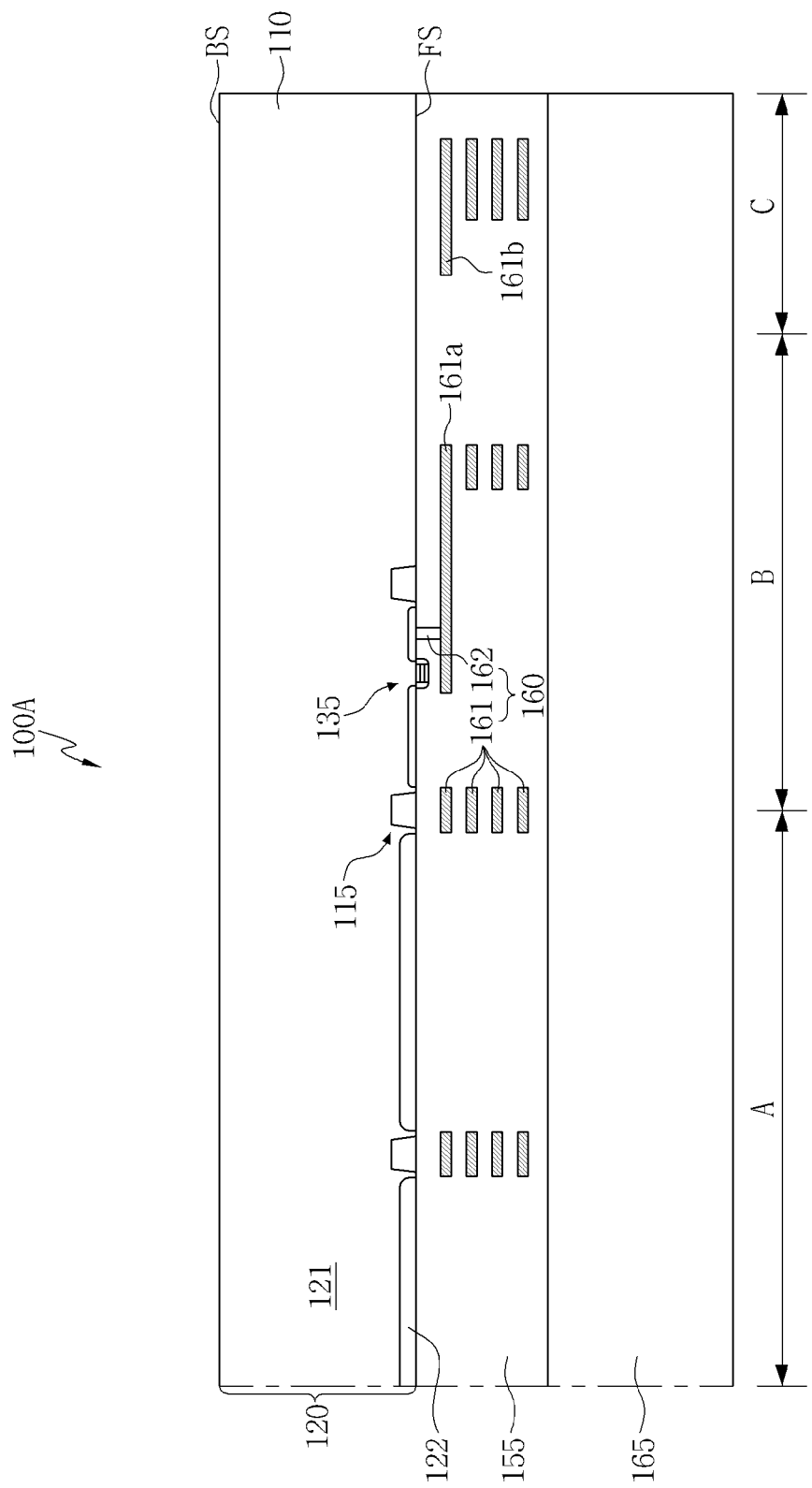
FIGS. 5A to 5S are longitudinal-sectional views illustrating a method of manufacturing an image sensor according to at least one example embodiment of the inventive concepts.
Figure 5B:
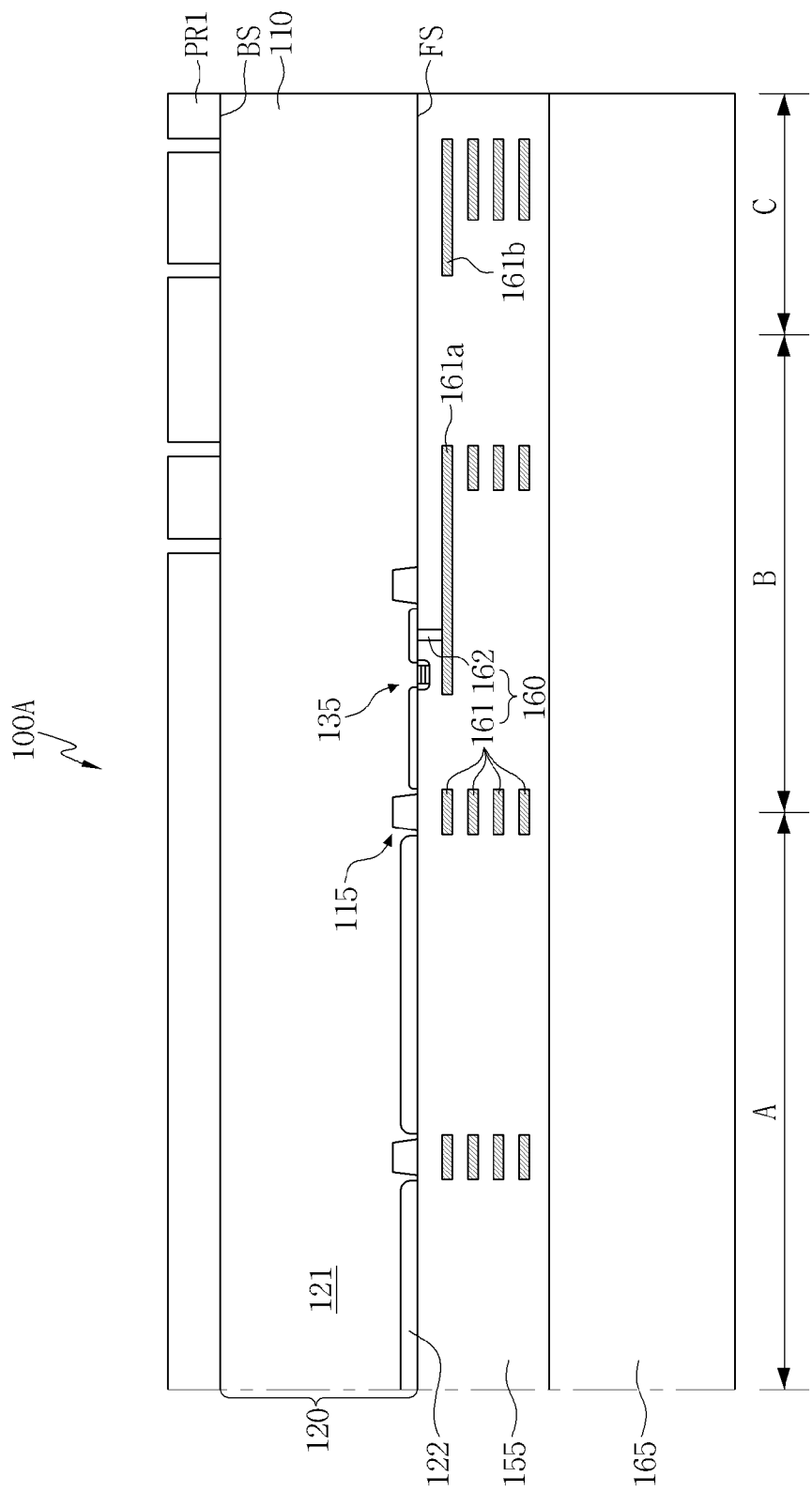
Figure 5C:
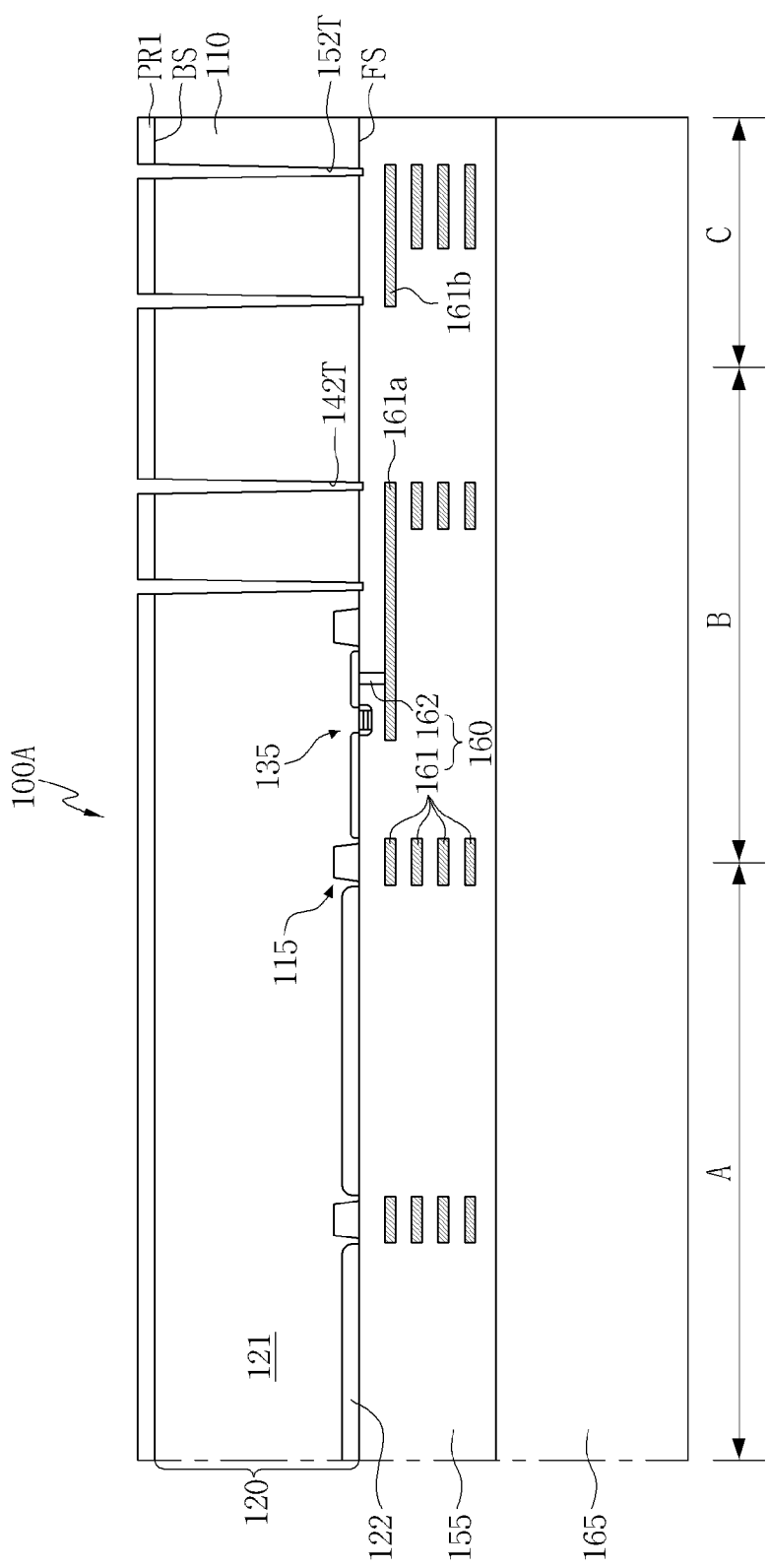
Figure 5D:
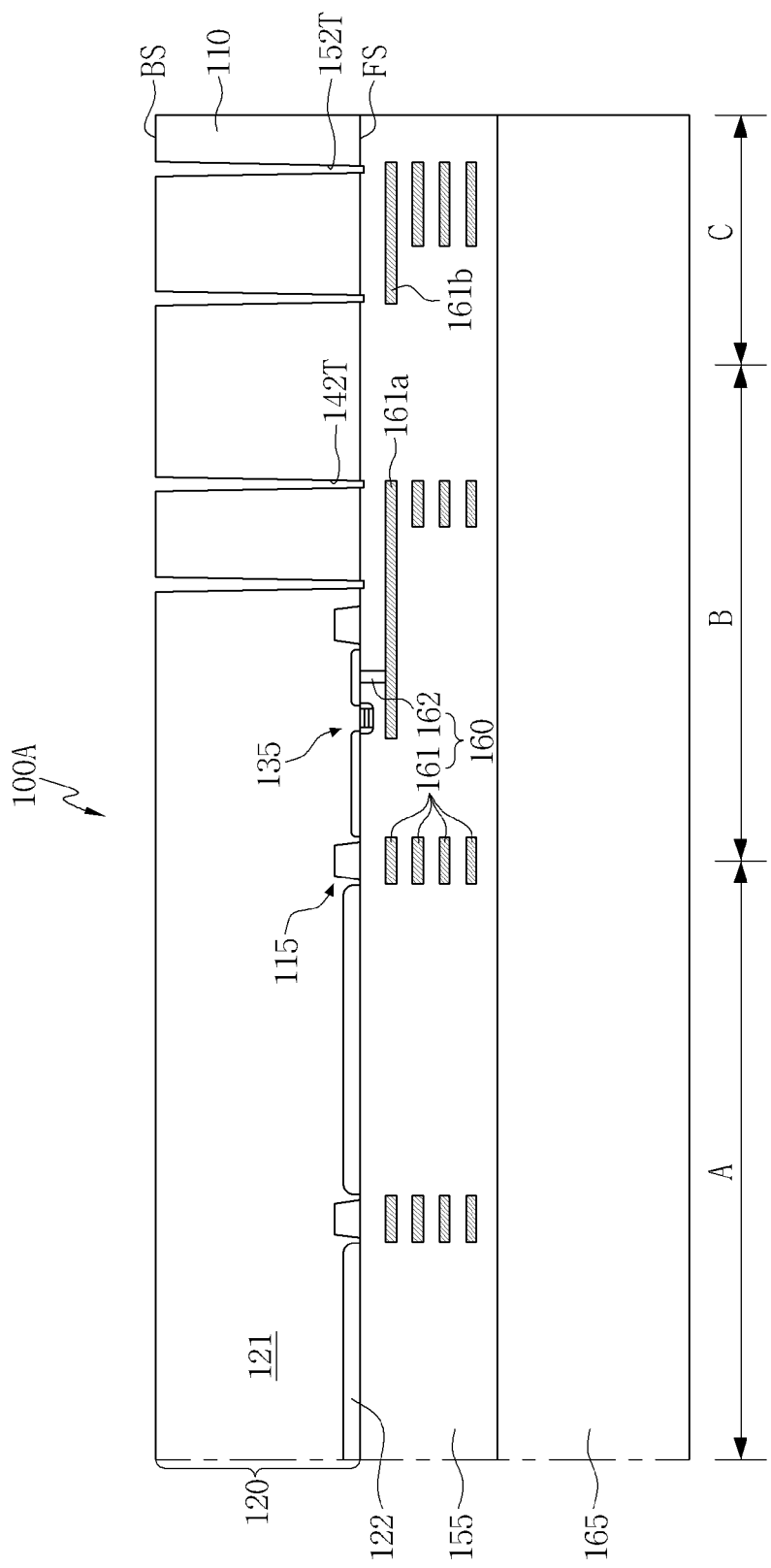
Figure 5E:
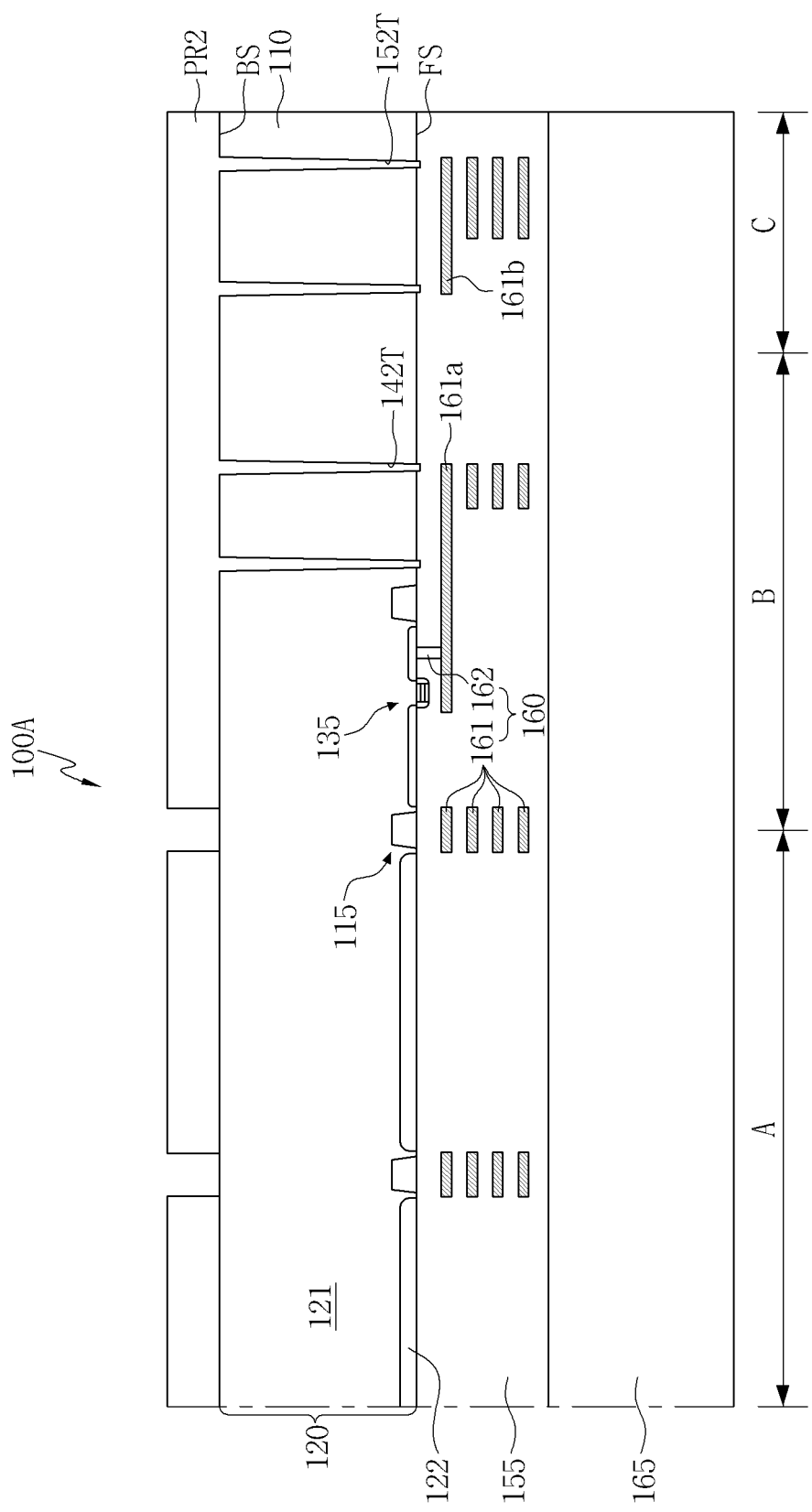
Figure 5F:
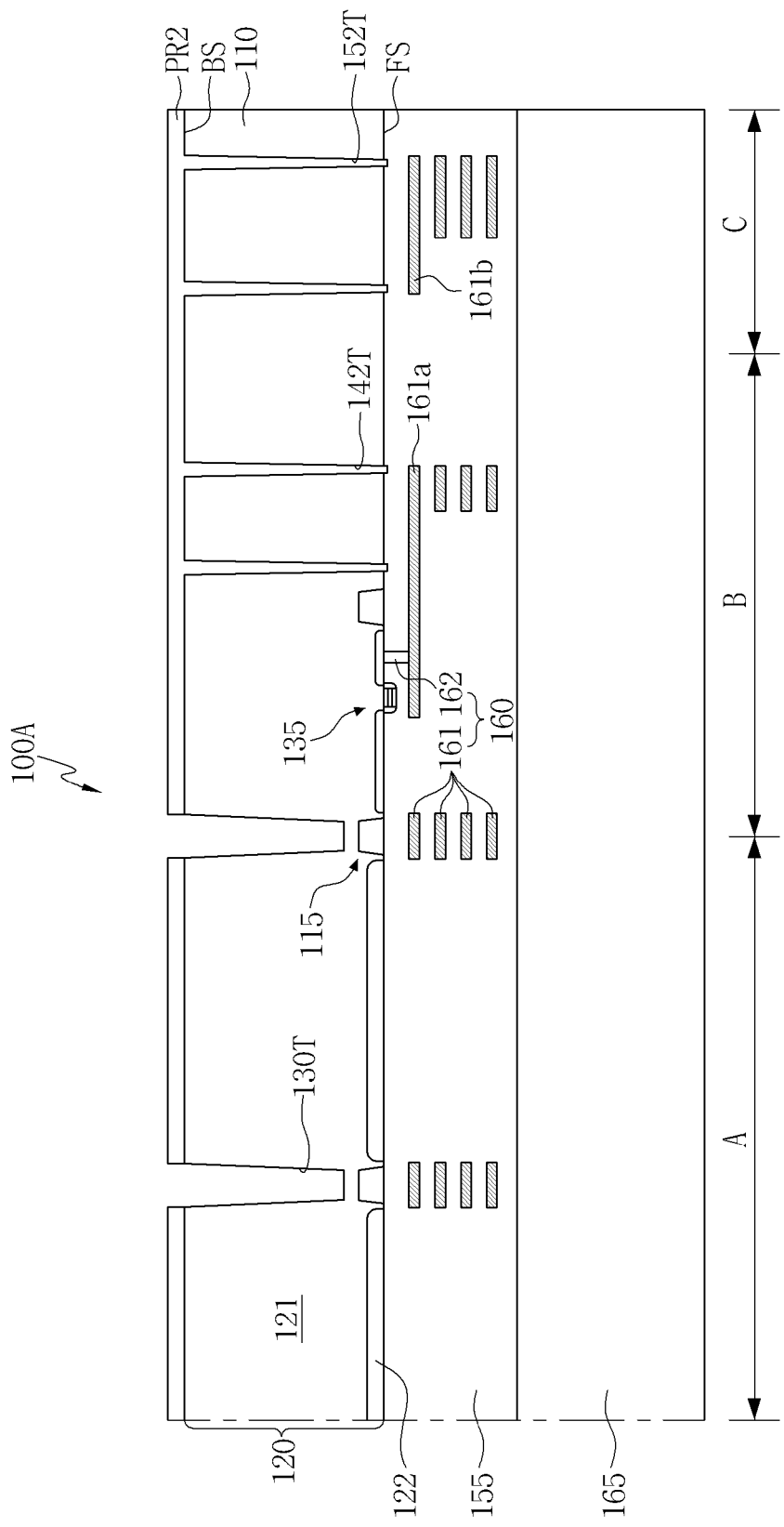
Figure 5G:
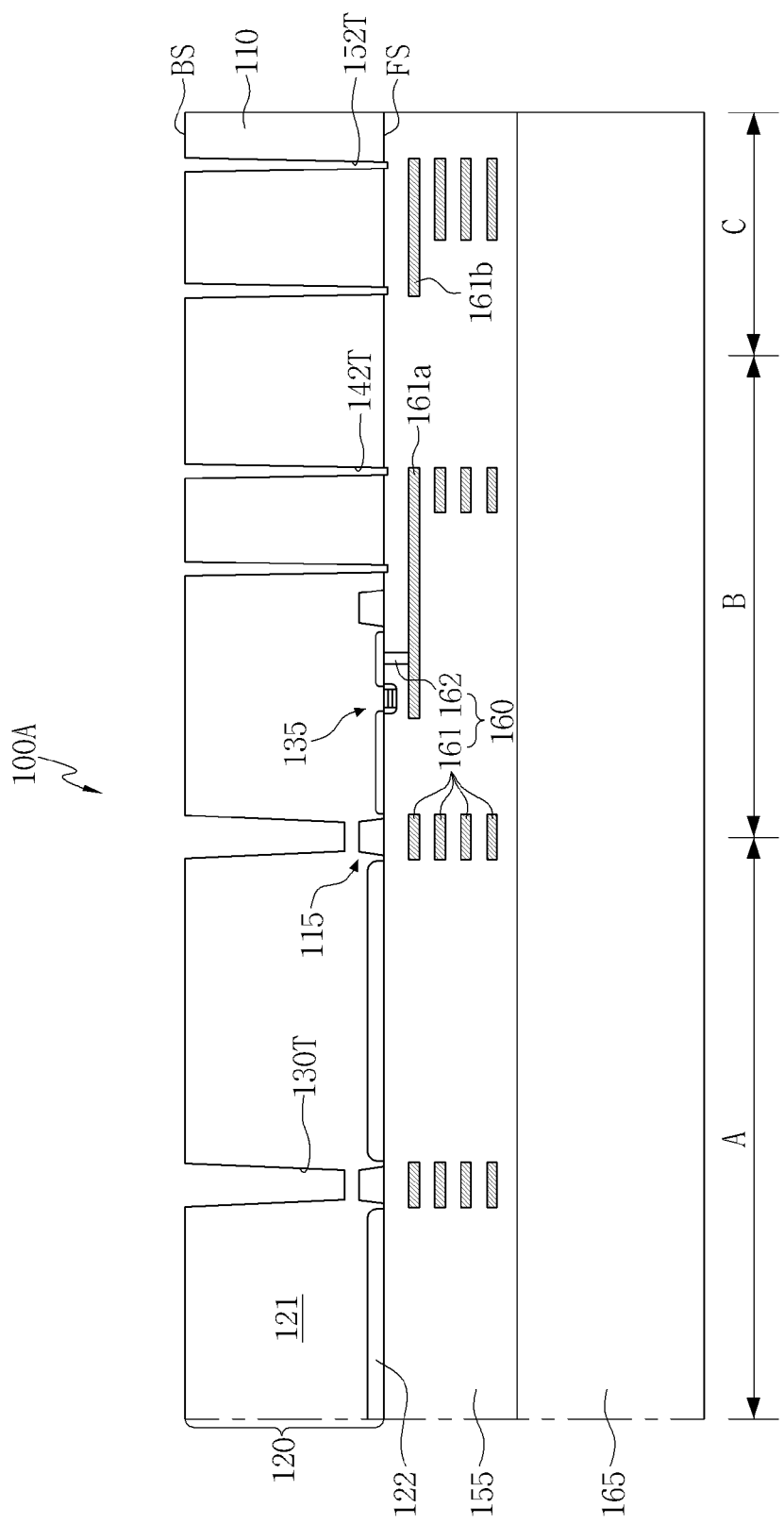
Figure 5H:
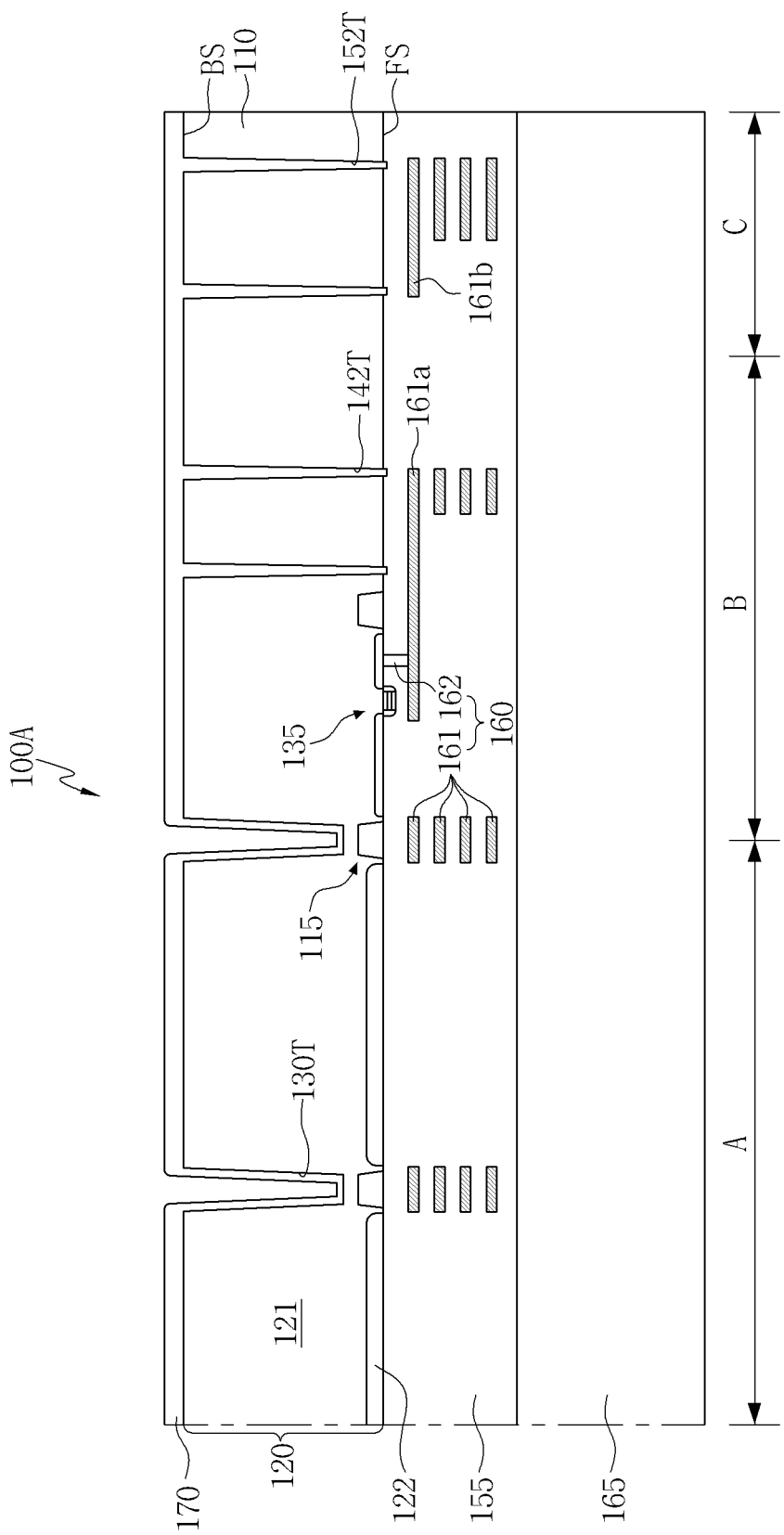
Figure 5I:
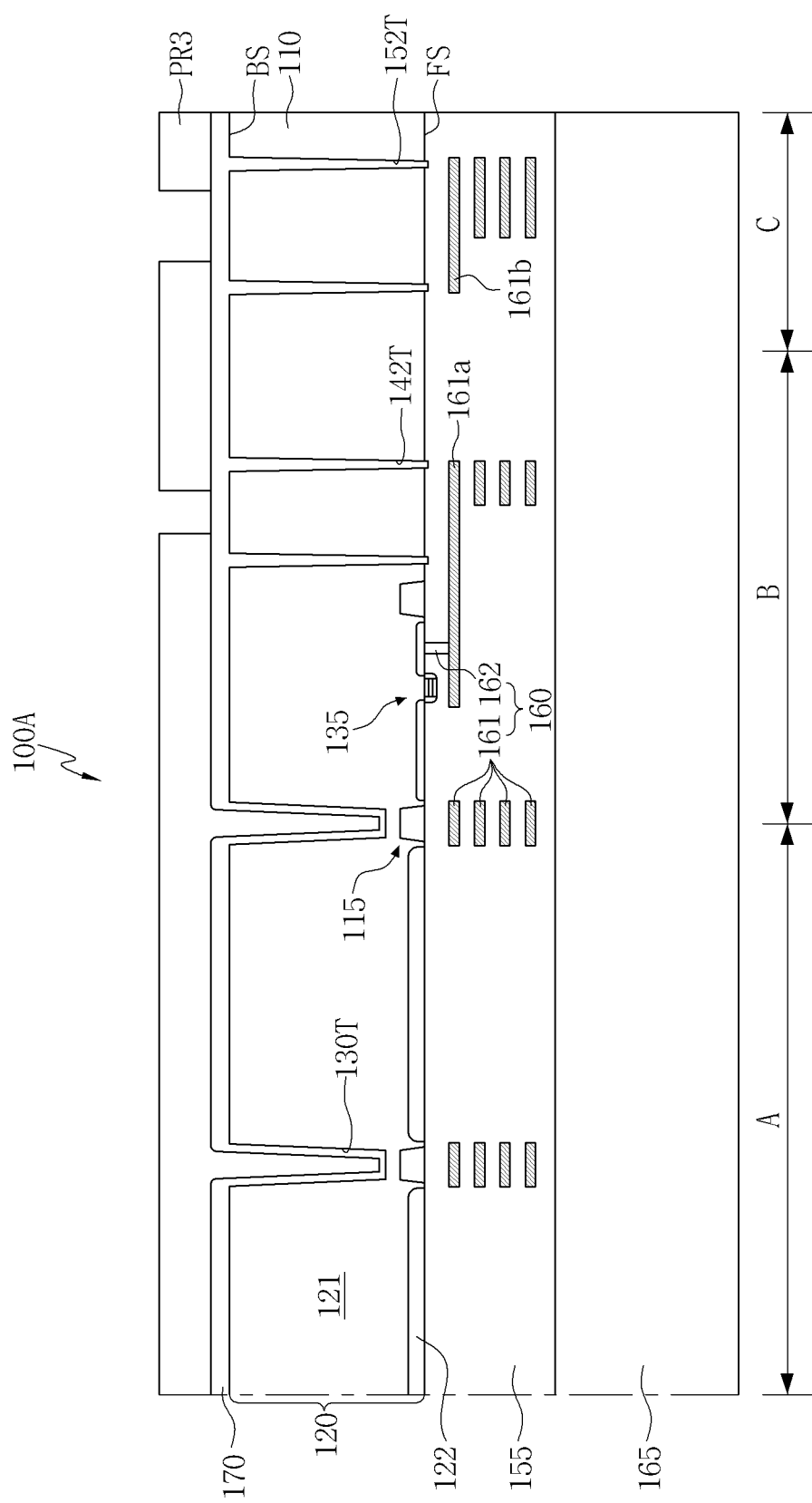
Figure 5J:
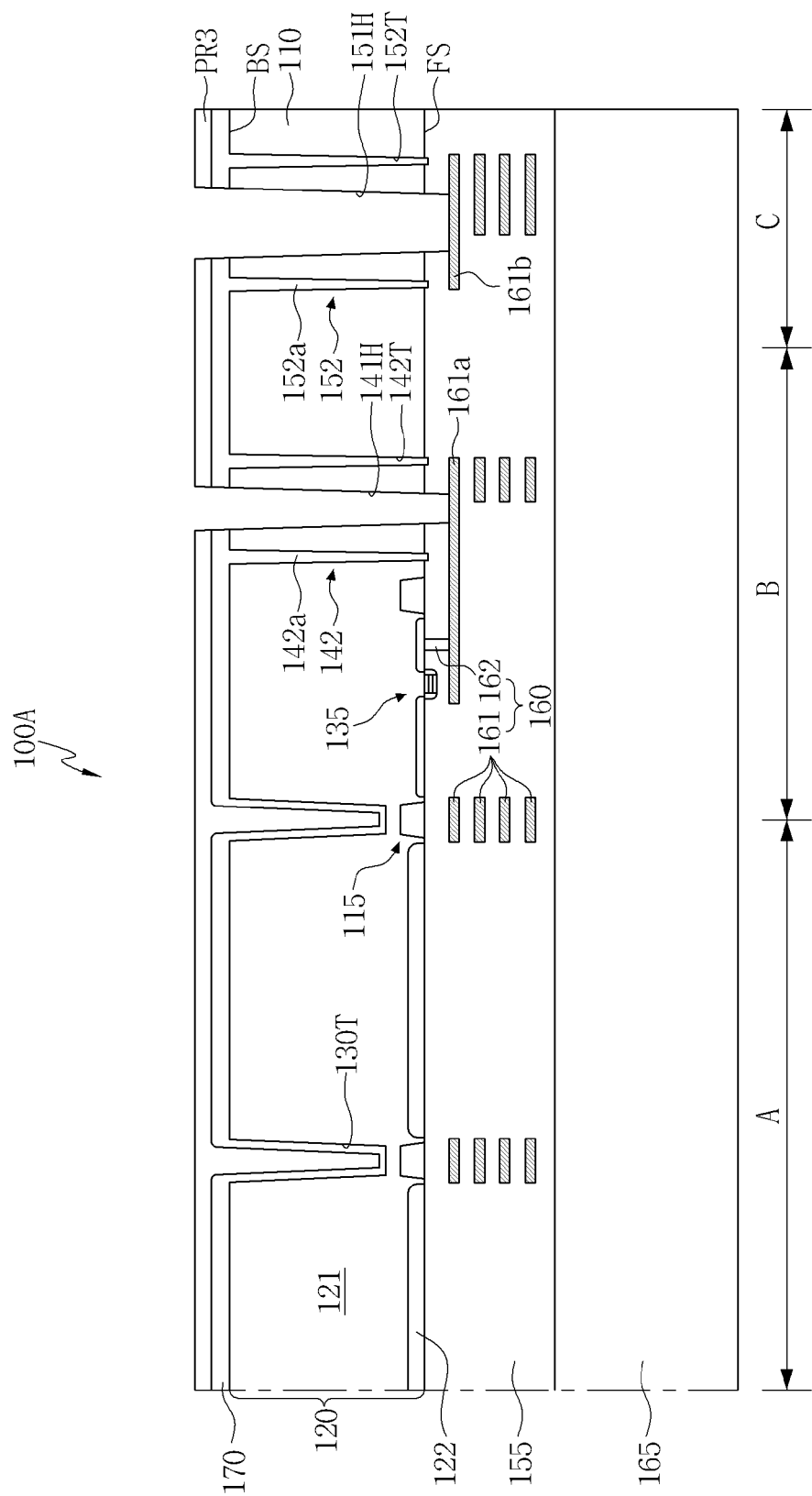
Figure 5K:
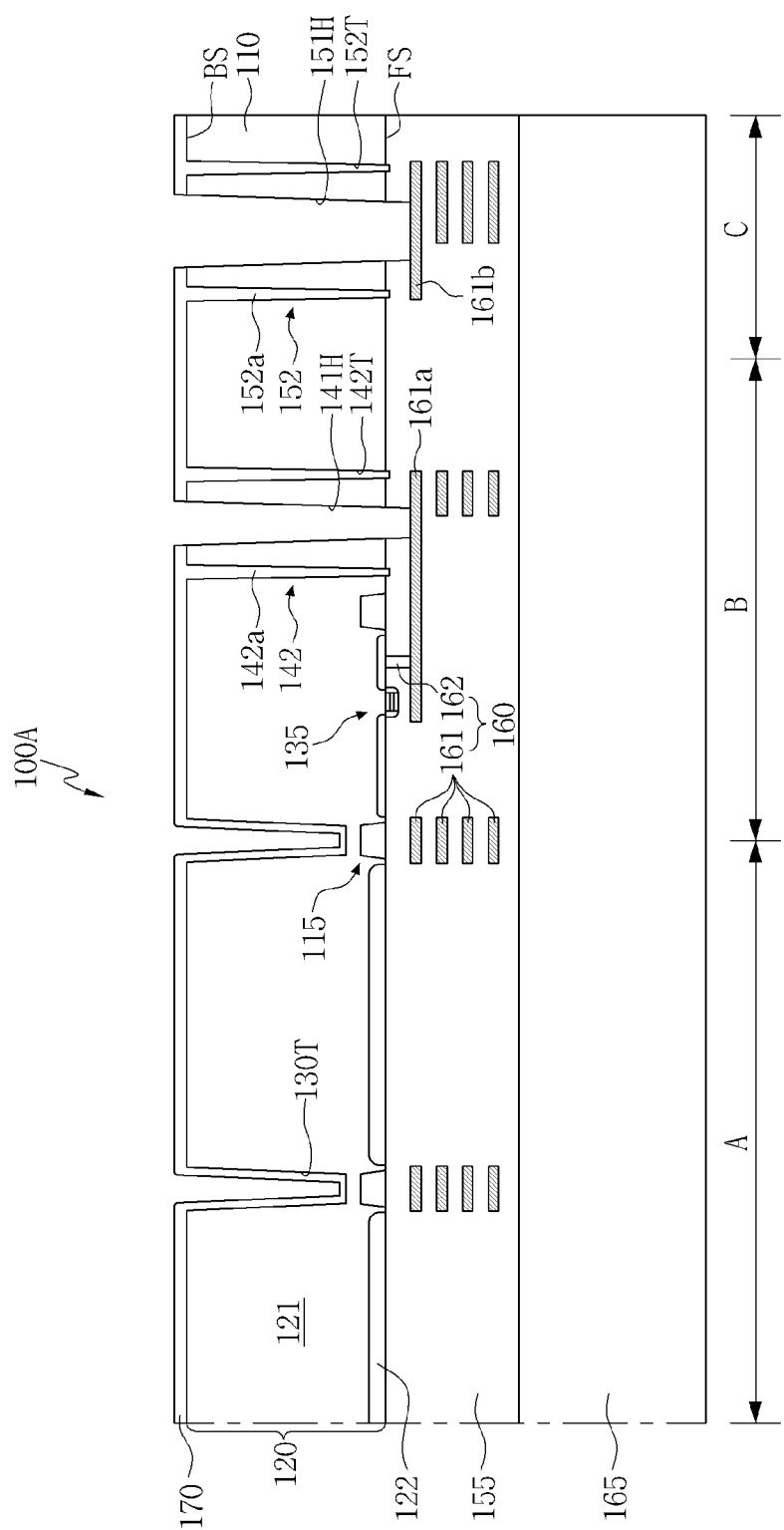
Figure 5L:
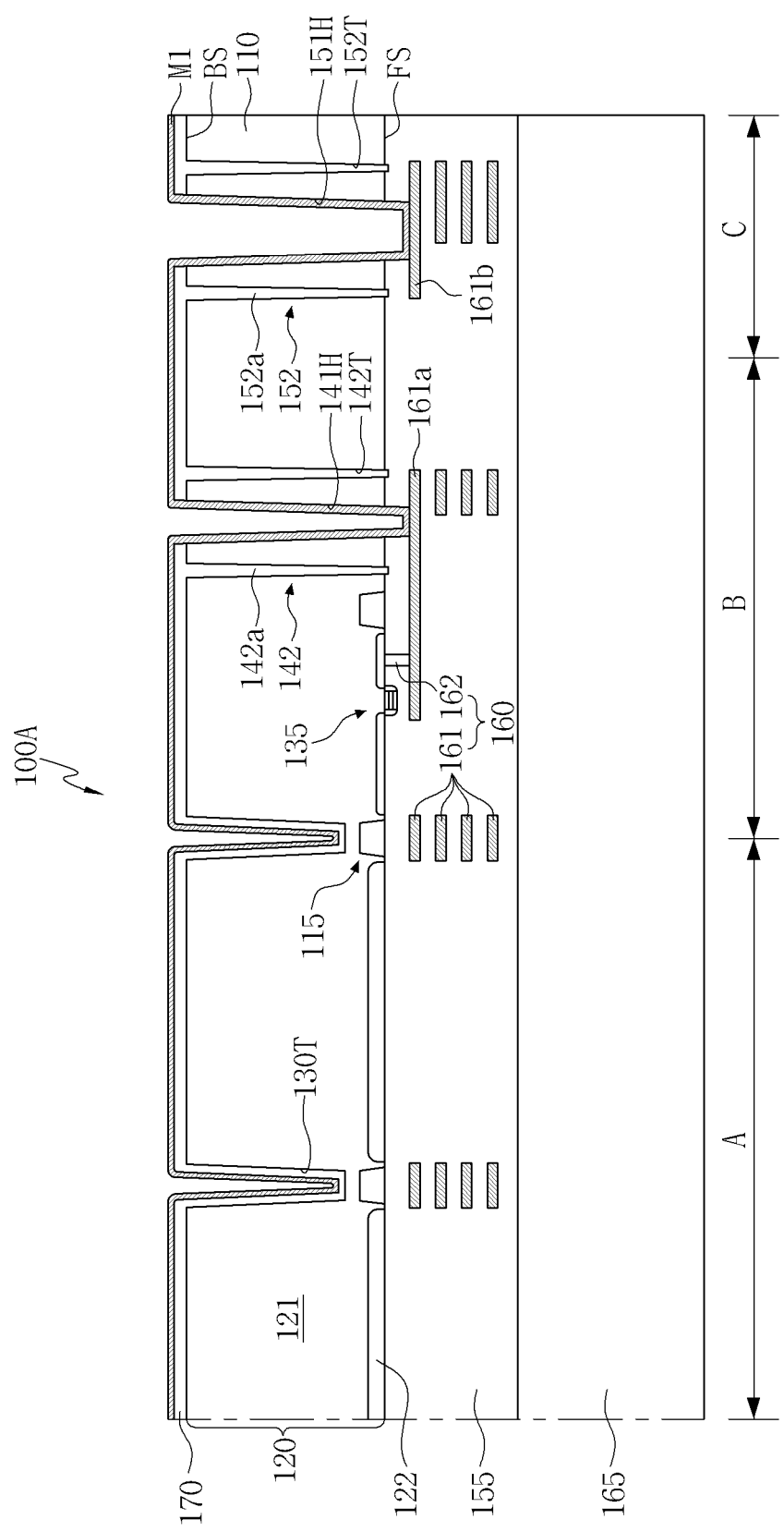
Figure 5M:
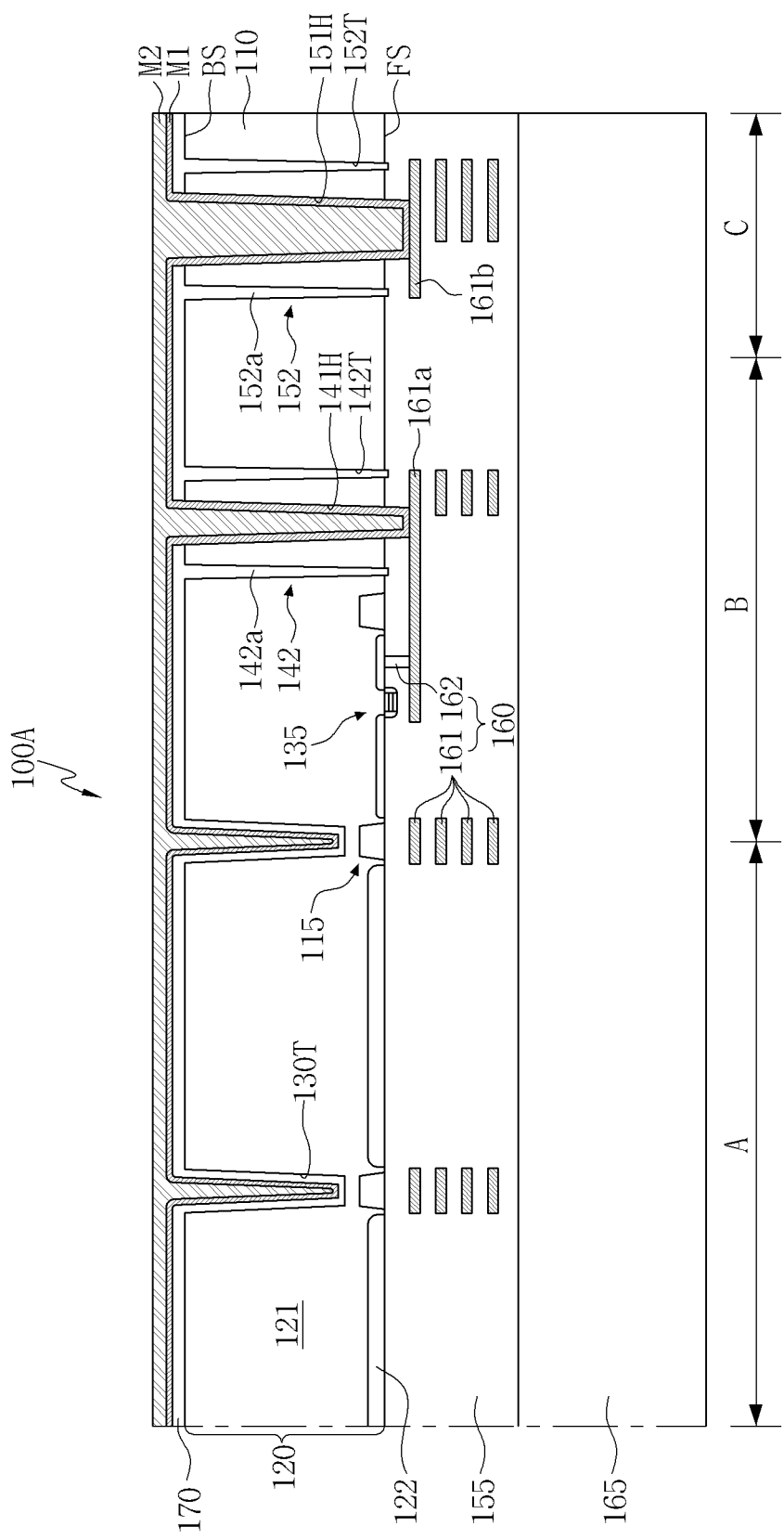
Figure 5N:
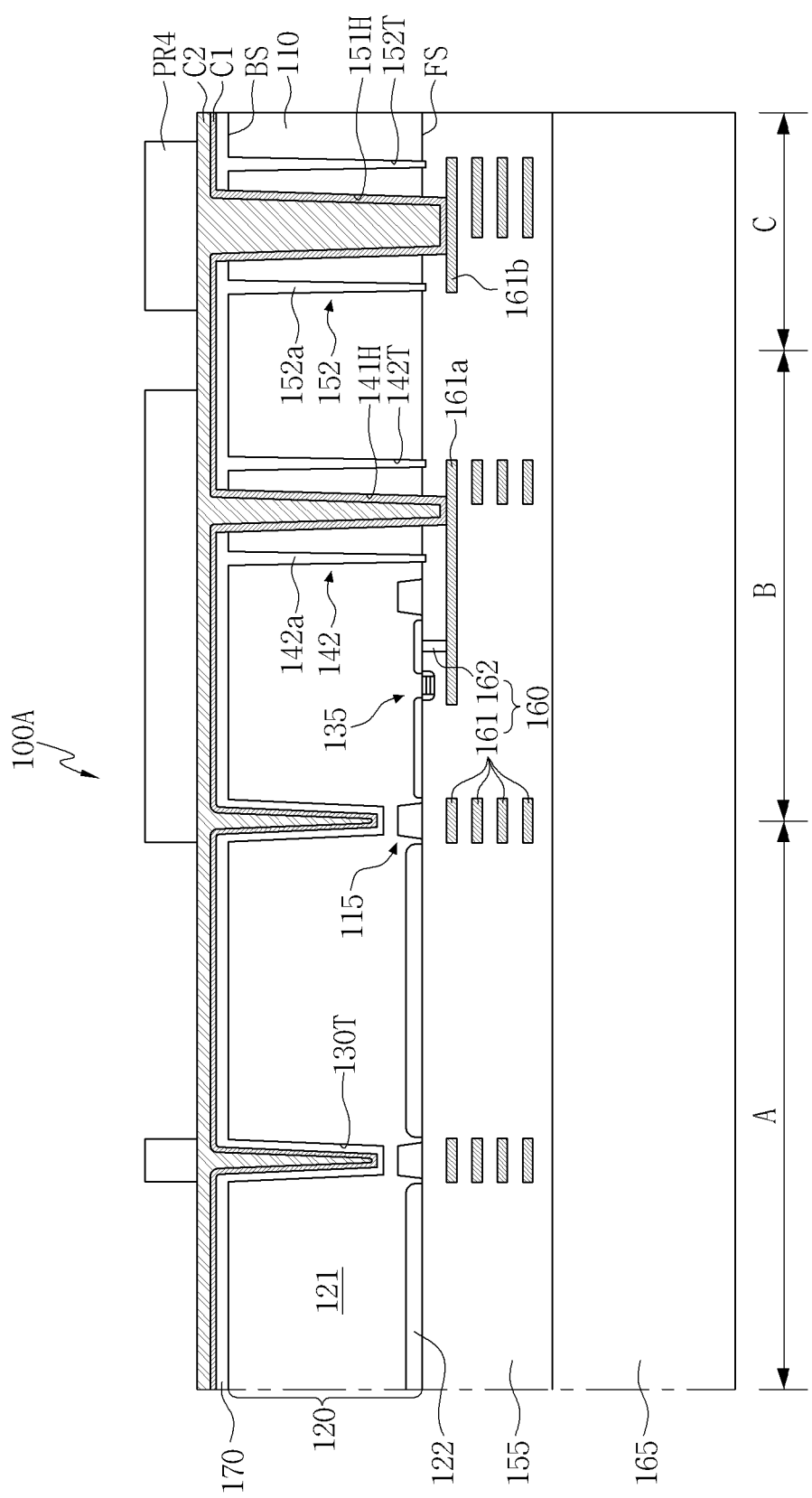
Figure 50:
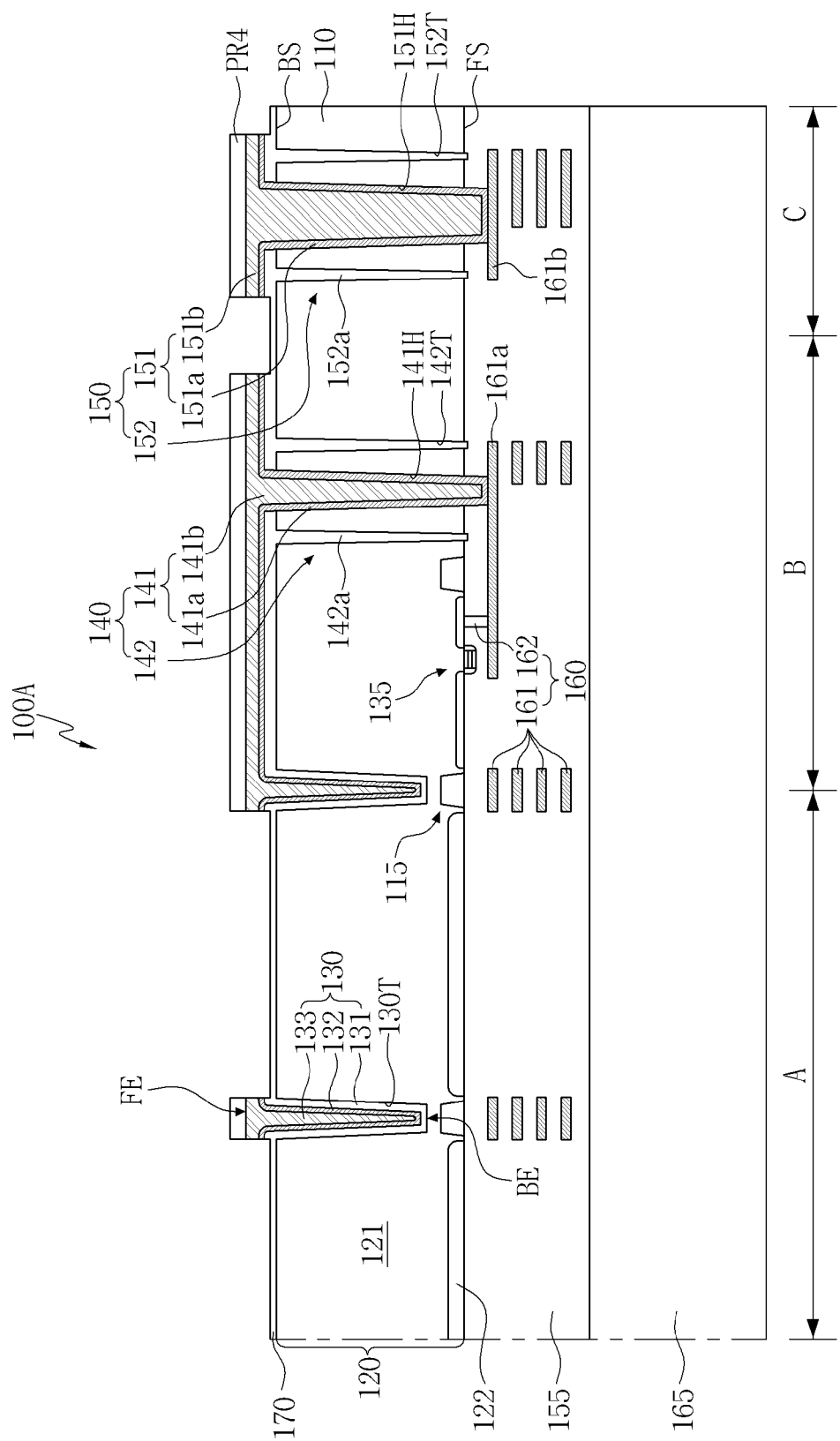
Figure 5P:
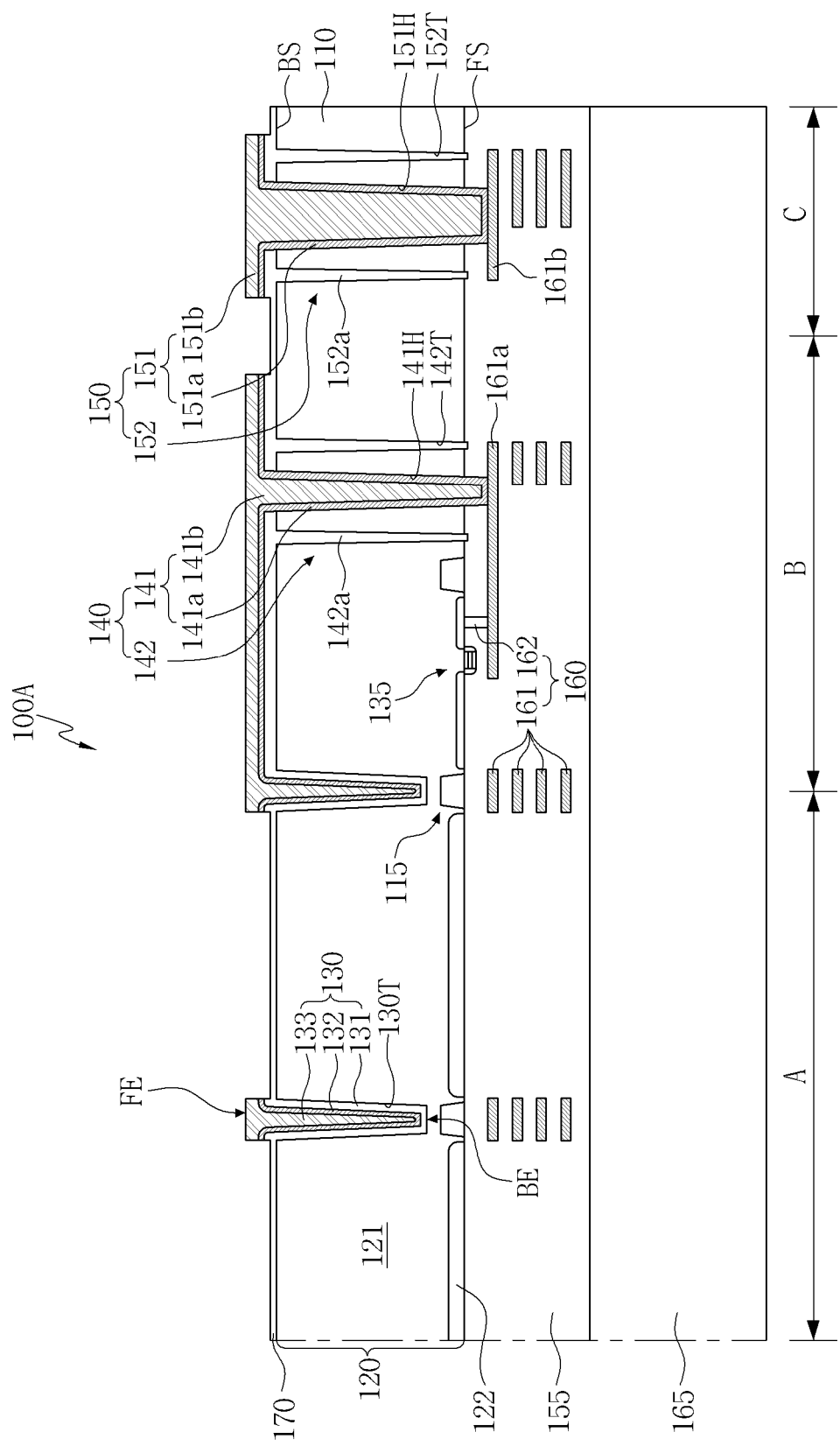
Figure 5Q:
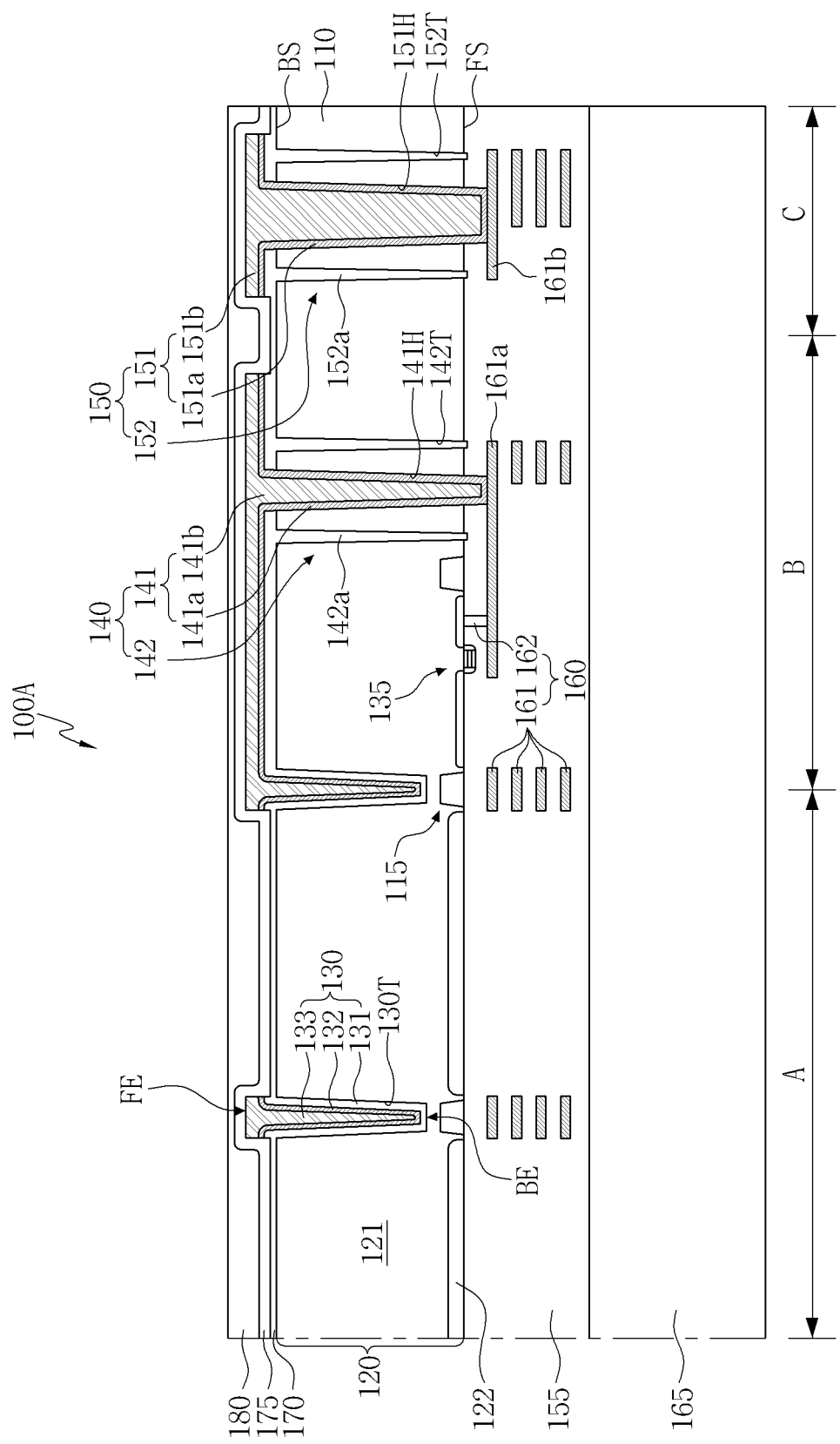
Figure 5R:
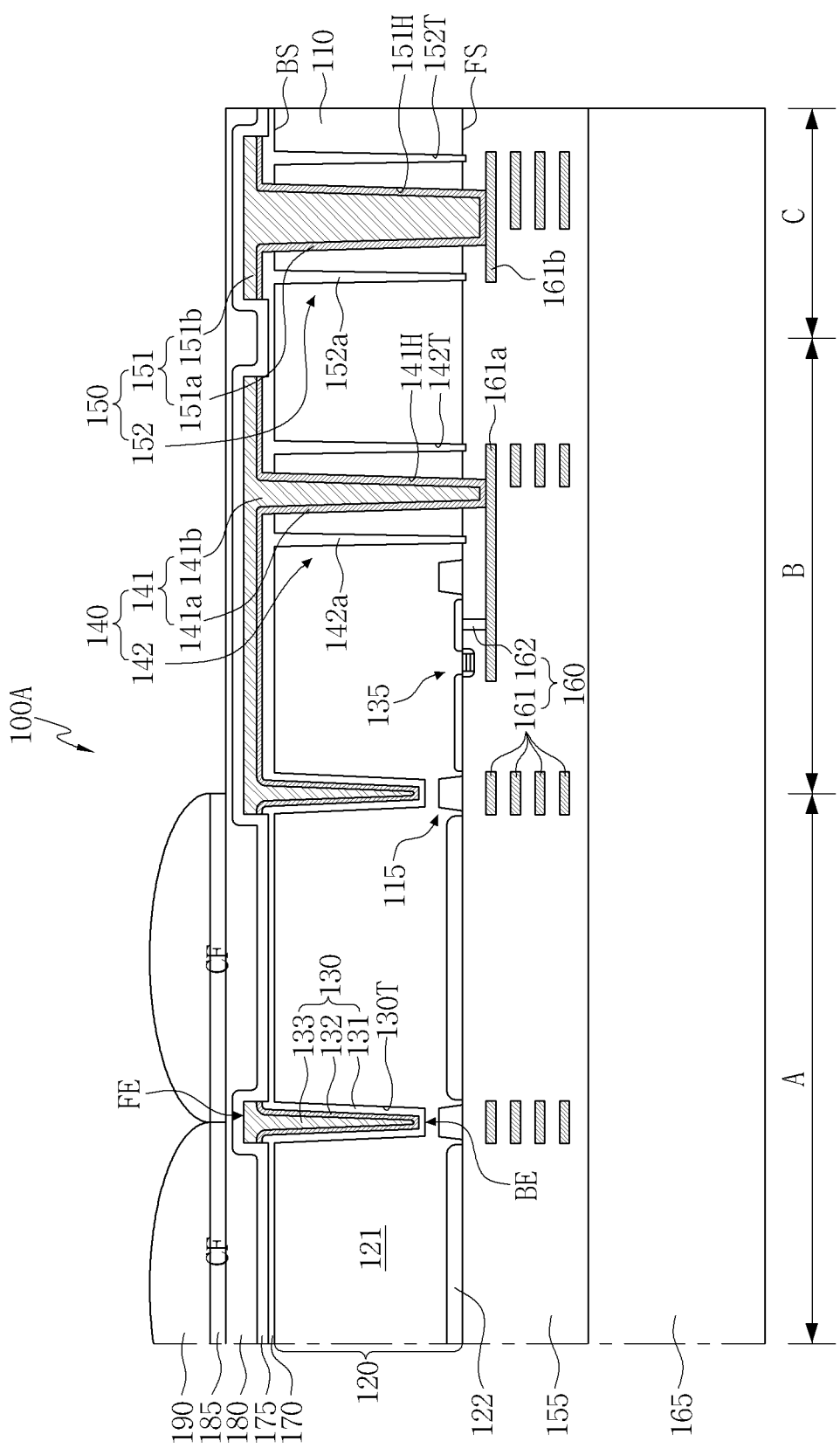
Figure 5S:
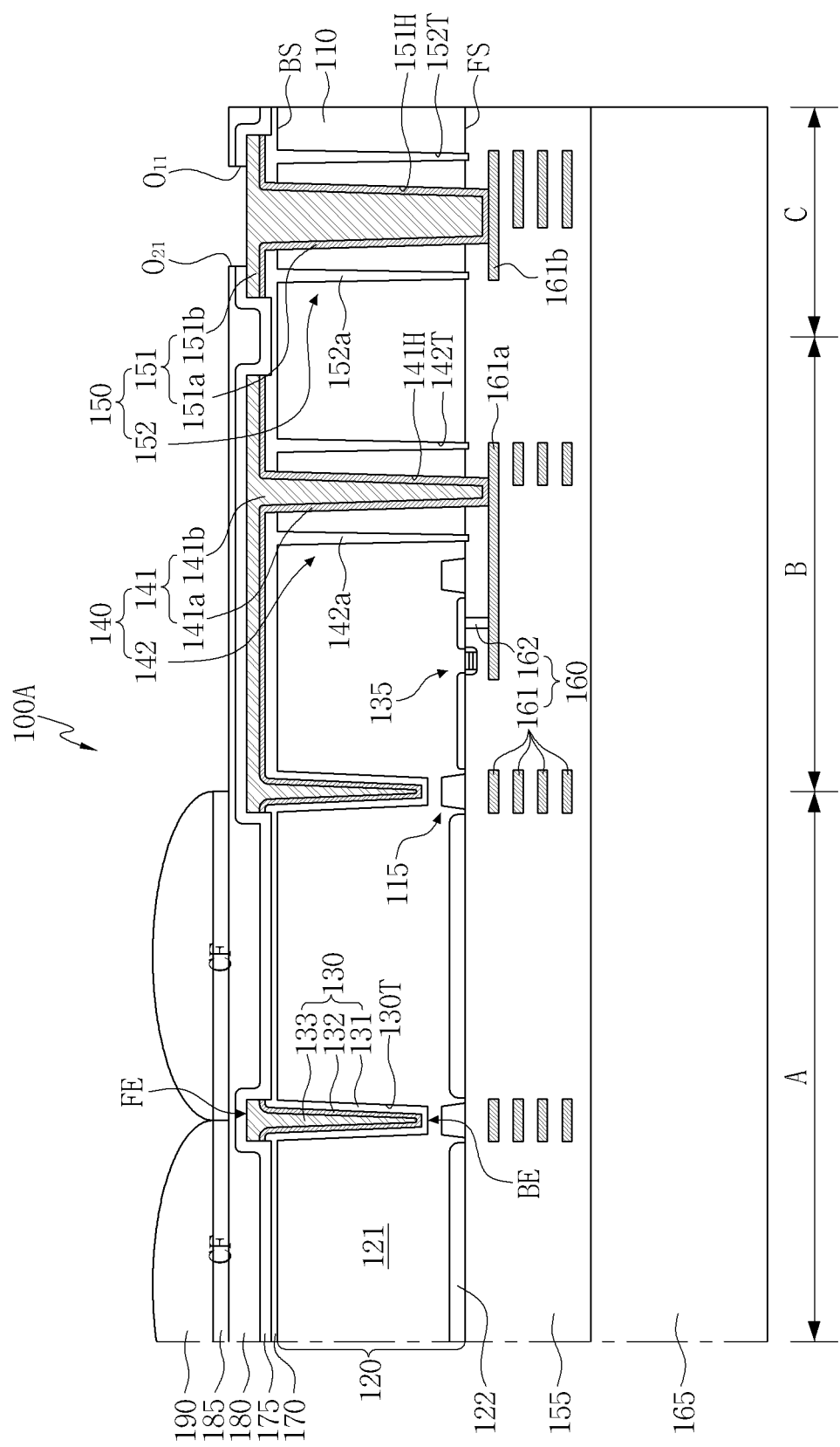

FIGS. 5A to 5S are longitudinal-sectional views illustrating a method of manufacturing an image sensor 100A according to at least one example embodiment of the inventive concepts.

Referring to FIG. 5A, the method of manufacturing an image sensor 100A according to one example embodiment of the inventive concepts may include preparing a semiconductor substrate 110 including a front side FS and a back side BS facing each other, defining a pixel area A, a voltage connection area B, and a pad area C in the semiconductor substrate 110 by forming an area isolation structure 115 penetrating or projecting into from the front side FS to the inside of the semiconductor substrate 110 relatively shallowly, forming a voltage applying device 135 on the voltage connection area B, forming an insulating layer 155 on the front side FS of the semiconductor substrate 110, and forming an internal circuit 160 in the insulating layer 155. Further, a supporting substrate 165 may be formed on the insulating layer 155.

Referring to FIG. 5B, the example method may include forming a first mask pattern PR1 defining a voltage connection insulating trench 142T and a through via insulating trench 152T in the voltage connection area B and the pad area C of the semiconductor substrate 110 on the back side BS of the semiconductor substrate 110, respectively. The first mask pattern PR1 may include an organic material such as silicon oxide, silicon nitride, silicon oxynitride, or photoresist.

Referring to FIG. 5C, the method may include forming a voltage connection insulating trench 142T and a through via insulating trench 152T with the shape of a ring vertically penetrating or projecting into the semiconductor substrate 110 in the voltage connection area B and the pad area C of the semiconductor substrate 110, respectively, by performing an etching process using the first mask pattern PR1 as an etching mask. Bottoms of the voltage connection insulating trench 142T and the through via insulating trench 152T may be recessed into the insulating layer 155 by completely penetrating or projecting into the semiconductor substrate 110. In this process, the first mask pattern PR1 may become thin.

Referring to FIG. 5D, the method may include removing the thinned first mask pattern PR1 by an ashing process.

Referring to FIG. 5E, the method may include forming a second mask pattern PR2 defining a device isolation trench 130T in the pixel area A of the semiconductor substrate 110 on the back side BS of the semiconductor substrate 110. The second mask pattern PR2 may include an organic material such as silicon oxide, silicon nitride, silicon oxynitride, or photoresist.

Referring to FIG. 5F, the method may include forming a device isolation trench 130T penetrating or projecting into from the back side BS toward the inside of the semiconductor substrate 110 relatively deeply in the pixel area A of the semiconductor substrate 100 by performing an etching process using the second mask pattern PR2 as an etching mask. A bottom of the device isolation trench 130T may be in the semiconductor substrate 110, and be relatively nearer to the front side FS than the back side BS of the semiconductor substrate 110. In this process, the second mask pattern PR2 may become thin.

Referring to FIG. 5G, the method may include removing the thinned second mask pattern PR2 by performing an ashing process.

Referring to FIG. 5H, the method may include conformally forming an anti-reflective layer 170 on the back side BS of the semiconductor substrate 110, and on inner walls of the device isolation trench 130T, the voltage connection insulating trench 142T, and the through via insulating trench 152T by performing a deposition process. A material and a thickness, etc. of the anti-reflective layer 170 may be varied according to a wavelength of light using in a photolithography process, and the anti-reflective layer 170 may be formed in a single layer or a multi-layer. The anti-reflective layer 170 may include silicon nitride and/or tantalum oxide. The anti-reflective layer 170 may be formed by stacking silicon nitride and tantalum oxide. In this process, the voltage connection insulating trench 142T and the through via insulating trench 152T may be filled with the anti-reflective layer 170.

Referring to FIG. 5I, the method may include forming a third mask pattern PR3 defining a voltage connection contact hole 141H and a through via contact hole 151H in the voltage connection area B and the pad area C of the semiconductor substrate 110, respectively, on the anti-reflective layer 170. The third mask pattern PR3 may include an organic material such as silicon oxide, silicon nitride, silicon oxynitride, or photoresist. In this process, the inside of the device isolation trench 130T may be filled with the third mask pattern PR3.

Referring to FIG. 5J, the method may include forming a voltage connection contact hole 141H exposing the internal circuit 160 (for example, a device connection inner wire 161a) electrically connected to the voltage applying device 135 and a through via contact hole 151H exposing the internal circuit 160 (for example, a pad connection inner wire 161b) of the pad area C by performing an etching process using the third mask pattern PR3 as an etching mask.

In this process, the third mask pattern PR3 may become thin. Further, a voltage connection insulating area 142 filled with a voltage connection insulating pattern 142a that the anti-reflective layer 170 is changed inside the voltage connection insulating trench 142T, and a through via insulating area 152 filled with the through via insulating pattern 152a that the anti-reflective layer 170 is changed inside the voltage connection insulating trench 152T may be formed. The voltage connection insulating pattern 142a and the through via insulating pattern 152a may be materially in continuity with the anti-reflective layer 170 formed on the back side BS of the semiconductor substrate 110.

Meanwhile, the voltage connection insulating area 142 may be spaced apart by a desired, or alternatively predetermined distance from, and cover a side of, the voltage connection contact hole 141H, and the through via insulating area 152 may be spaced apart by a desired, or alternatively predetermined distance from and cover a side of the through via contact hole 151H.

Referring to FIG. 5K, the method may include removing the thinned third mask pattern PR3 by performing an ashing process. In this process, the anti-reflective layer 170 may be thinner.

Referring to FIG. 5L, the method may include conformally forming a first conductive layer M1 on the anti-reflective layer 170, and on inner walls of the voltage connection contact hole 141H and the through via contact hole 151H. The first conductive layer M1 may include a low-resistance conductive material, and may include a material that can be conformally formed to lower portions of the voltage connection contact hole 141H and the through via contact hole 151H. For example, the first conductive layer M1 may include tungsten (W).

Referring to FIG. 5M, the method may include forming a second conductive layer M2 on the first conductive layer M1. The second conductive layer M2 may have a thickness that is sufficient to fill the insides of the device isolation trench 130T, the voltage connection contact hole 141H, and the through via contact hole 151H. The second conductive layer M2 may include an excellent low-resistance conductive material. For example, the second conductive layer M2 may include aluminum (Al) and doped polysilicon.

Referring to FIG. 5N, the method include forming a fourth mask pattern PR4 to be patterned for removing the first and second conductive layers M1 and M2 of the pixel area A, and removing the first and second conductive layers M1 and M2 between the voltage connection area B and the pad area C on the second conductive layer M2. The fourth mask pattern PR4 may include an organic material such as silicon oxide, silicon nitride, silicon oxynitride, or photoresist.

Referring to FIG. 5O, the method may include partially removing the first and second conductive layers M1 and M2 by performing an etching process using the fourth mask pattern PR4 as an etching mask.

In this process, the anti-reflective layer 170 may be exposed on the pixel area A of the semiconductor substrate 110, and the anti-reflective layer 170 between the voltage connection area B and the pad area C of the semiconductor substrate 110 may be also exposed. Further, in this process, the fourth mask pattern PR4 may be thin, and the exposed anti-reflective layer 170 may become thinner.

In this process, a device isolation structure 130 including a device isolation pattern 131, a first device isolation conductive pattern 132 and the second device isolation conductive pattern 133 into which the anti-reflective layer 170, the first conductive layer M1 and the second conductive layer M2 are changed, respectively, may be formed in the device isolation trench 130T.

A voltage connection contact plug 141 including a first voltage connection conductive pattern 141a and a second voltage connection conductive pattern 141b that the first conductive layer M1 and the second conductive layer M2 are changed, respectively, may be formed in the voltage connection contact hole 141H. Accordingly, a voltage connection structure 140 including the voltage connection contact plug 141 and the voltage connection insulating area 142 may be formed.

A through via contact plug 151 including a first through via conductive pattern 151a and a second through via conductive pattern 151b that the first conductive layer M1 and the second conductive layer M2 are converted, respectively, may be formed in the through via contact hole 151H. A through via structure 150 including the through via contact plug 151 and the through via insulating area 152 may be formed.

Further, the first voltage connection conductive pattern 141a may be materially in continuity with the first device isolation conductive pattern 132, and the second voltage connection conductive pattern 141b may be materially in continuity with the second device isolation conductive pattern 133. Further, the anti-reflective layer 170, the device isolation insulating pattern 131, the voltage connection insulating pattern 142a, and the through via insulating pattern 152a may be materially in continuity with each other.

Referring to FIG. 5P, the method may include removing the thinned fourth mask pattern PR4 by removing an ashing process.

Referring to FIG. 5Q, the method may include conformally forming a protective film 175 on the anti-reflective layer 170, the device isolation structure 130, the voltage connection structure 140, and the through via structure 150 by performing a deposition process, and forming a planarized film 180 on the protective film 175 by performing the deposition process.

Referring to FIG. 5R, the method may include forming a color filter 185 including a corresponding pigment on the planarized film 180 to overlap each of the photoelectric conversion devices 120 in the pixel area A of the semiconductor substrate 110. The method may also include forming a microlens 190 on the color filter 185. The microlens 190 may be formed by performing a reflow process after forming a photoresist pattern on the color filter 185.

Referring to FIG. 5S, the method may include removing portions of the protective film 175 and the planarized film 180 by performing an etching process, and exposing the second through via conductive pattern 151b of the through via structure 150. Here, the exposed second through via conductive pattern 151b may be used as a through via pad. In this process, a first pad connection opening $O_{11}$ exposing the second through via conductive pattern 151b may be formed in the protective film 175, and a second pad connection opening $O_{21}$ exposing the second through via conductive pattern 151b may be formed in the planarized film 180. The first pad connection opening $O_{11}$ and the second pad connection opening $O_{21}$ may be vertically aligned with each other.

Referring to FIG. 1B further, the method may further include stacking a solder ball 195 on the second through via conductive pattern 151b exposed by the first and second pad connection openings $O_{11}$ and $O_{21}$.

Figure 6:
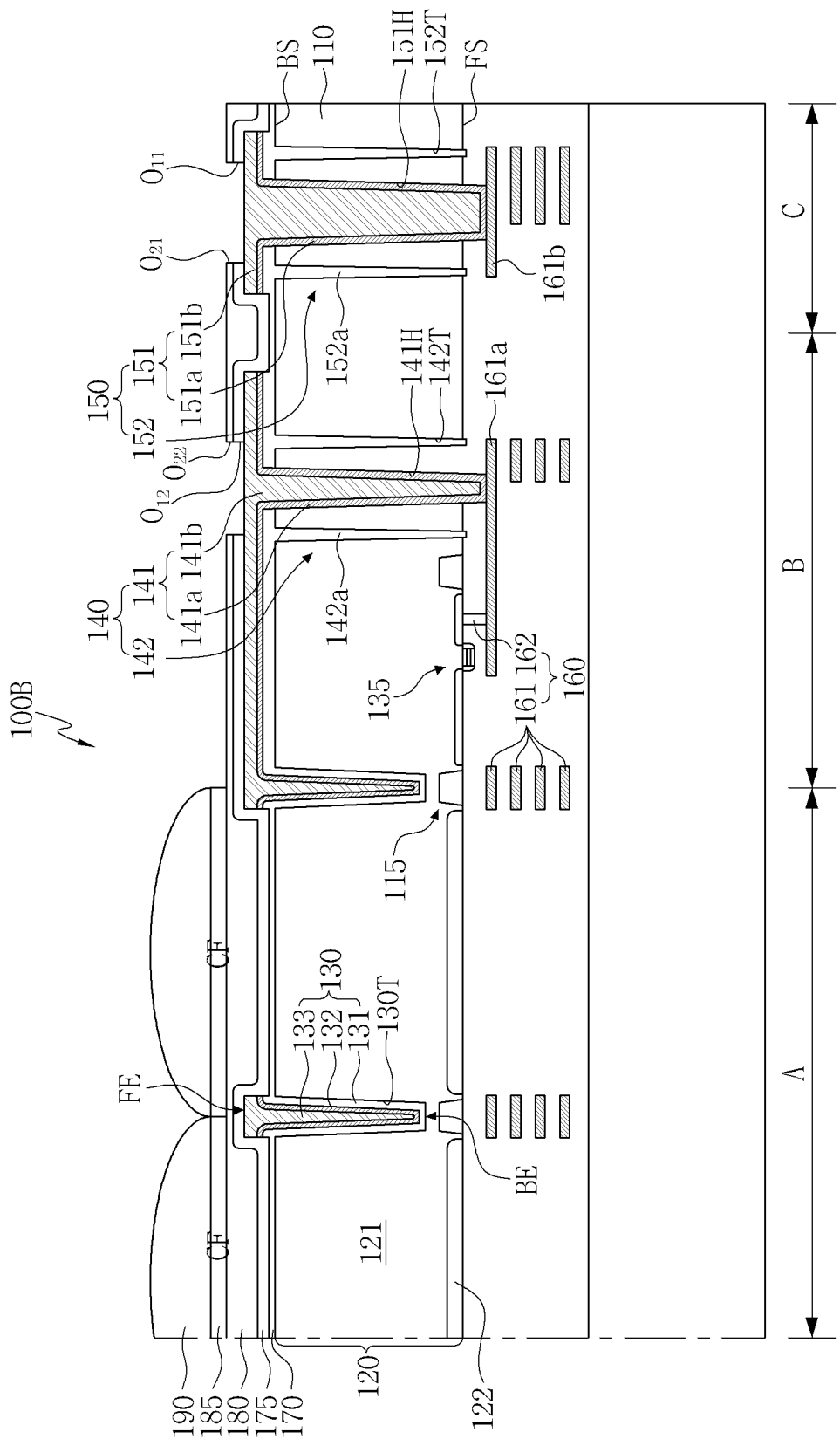
FIG. 6 is a longitudinal-sectional view illustrating a method of manufacturing an image sensor according to at least one example embodiment of the inventive concepts.

FIG. 6 is a longitudinal-sectional view illustrating a method of manufacturing an image sensor 100B according to at least one example embodiment of the inventive concepts. Since a method of manufacturing an image sensor 100B according to an example embodiment of the inventive concepts is equal to or same as the method of manufacturing the image sensor 100A according to an example embodiment of the inventive concepts excluding the example method explained with reference to FIG. 5S, detailed description for the same method will be replaced with the foregoing description.

Referring to FIGS. 5A to 5R, and 6, the method may include removing portions of the protective film 175 and the planarized film 180 by performing an etching process, and exposing the second through via conductive pattern 151b of the through via structure 150, and the second voltage connection conductive pattern 141b of the voltage connection structure 140. For example, the exposed second through via conductive pattern 151b may be used as a through via pad, and the exposed second voltage connection conductive pattern 141b may be used as a voltage connection pad. In this process, a first pad connection opening $O_{11}$ exposing the second through via conductive pattern 151b and a first voltage connection opening $O_{12}$ exposing the second voltage connection conductive pattern 141b may be formed in the protective film 175, and a second pad connection opening $O_{21}$ exposing the second through via conductive pattern 151b and a second voltage connection opening $O_{22}$ exposing the second voltage connection conductive pattern 141b may be formed in the planarized film 180. The first pad connection opening $O_{11}$ and the second pad connection opening $O_{21}$ may be vertically aligned with each other, and the first voltage connection opening $O_{12}$ and the second voltage connection opening $O_{22}$ may be vertically aligned with each other.

Referring to FIG. 2 further, the method may further include stacking a solder ball 195 on the second through via conductive pattern 151b exposed by the first and second pad connection openings $O_{11}$ and $O_{21}$. Further, the method may further include connecting an external circuit (for example, a voltage applying module) on the second voltage connection conductive pattern 141b exposed by the first and second voltage connection openings $O_{12}$ and $O_{22}$. The external circuit may apply a desired, or alternatively predetermined voltage (for example, a negative voltage) to the device isolation structure 130 through the voltage connection structure 140. Accordingly, when the voltage is applied to the device isolation structure 130, a dark current generated on a boundary surface of the device isolation structure 130 and the semiconductor substrate 110 can be reduced.

Figure 7A:
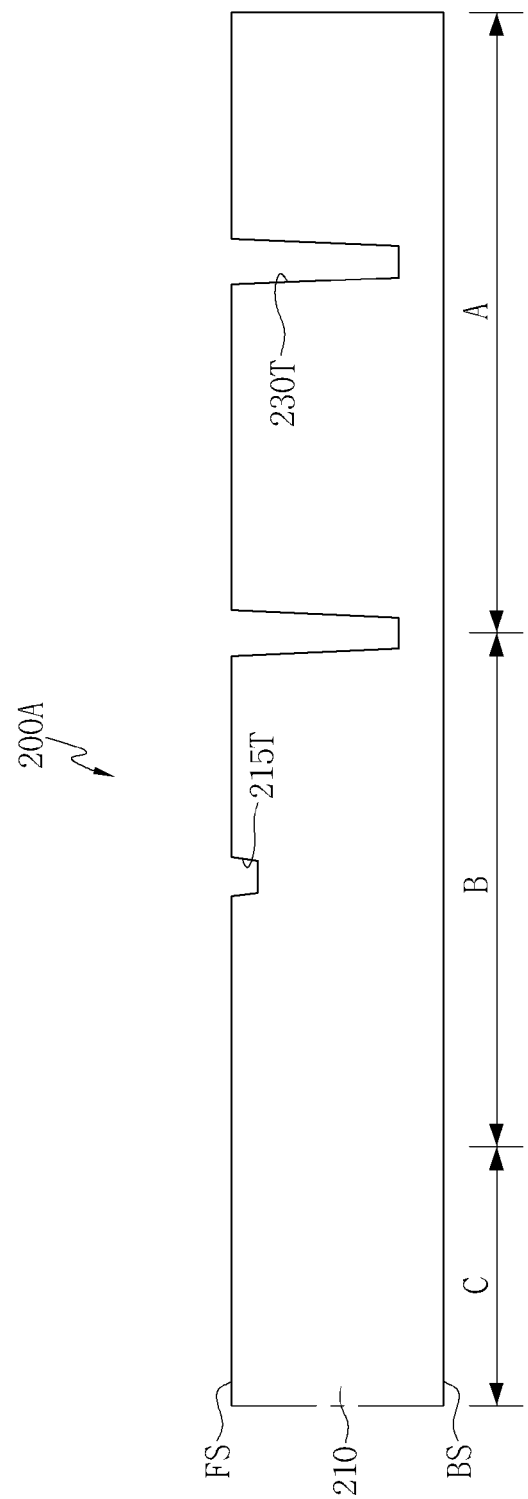
FIGS. 7A to 7T are longitudinal-sectional views illustrating a method of manufacturing an image sensor according to at least one example embodiment of the inventive concepts.
Figure 7B:
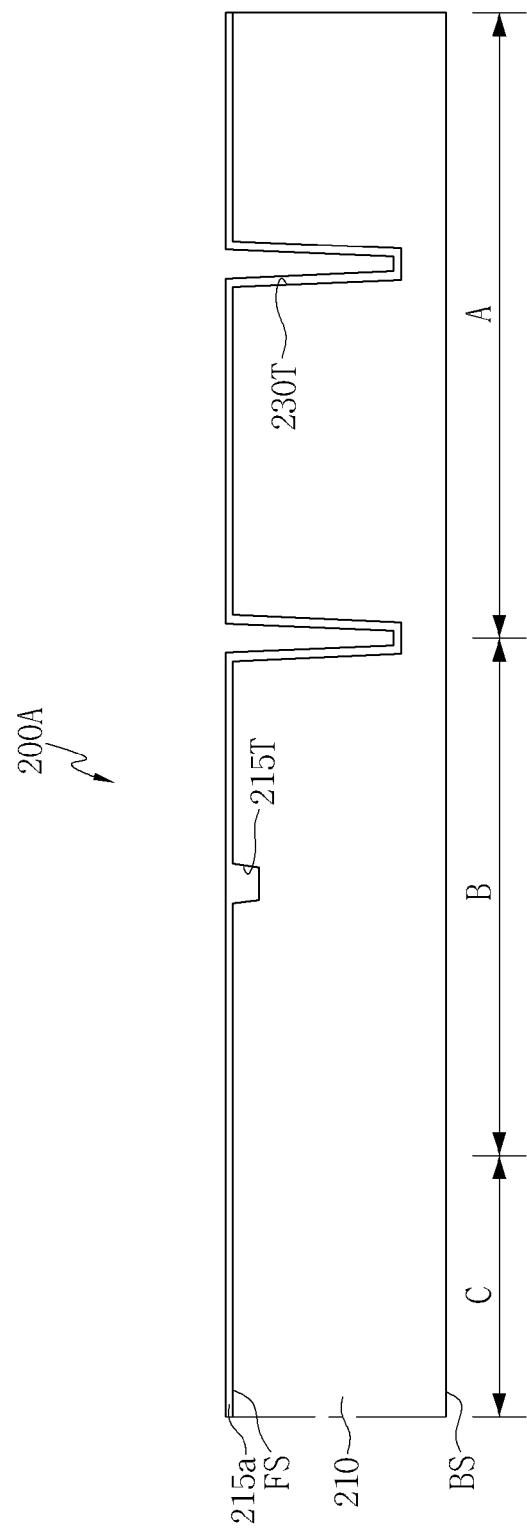
Figure 7C:
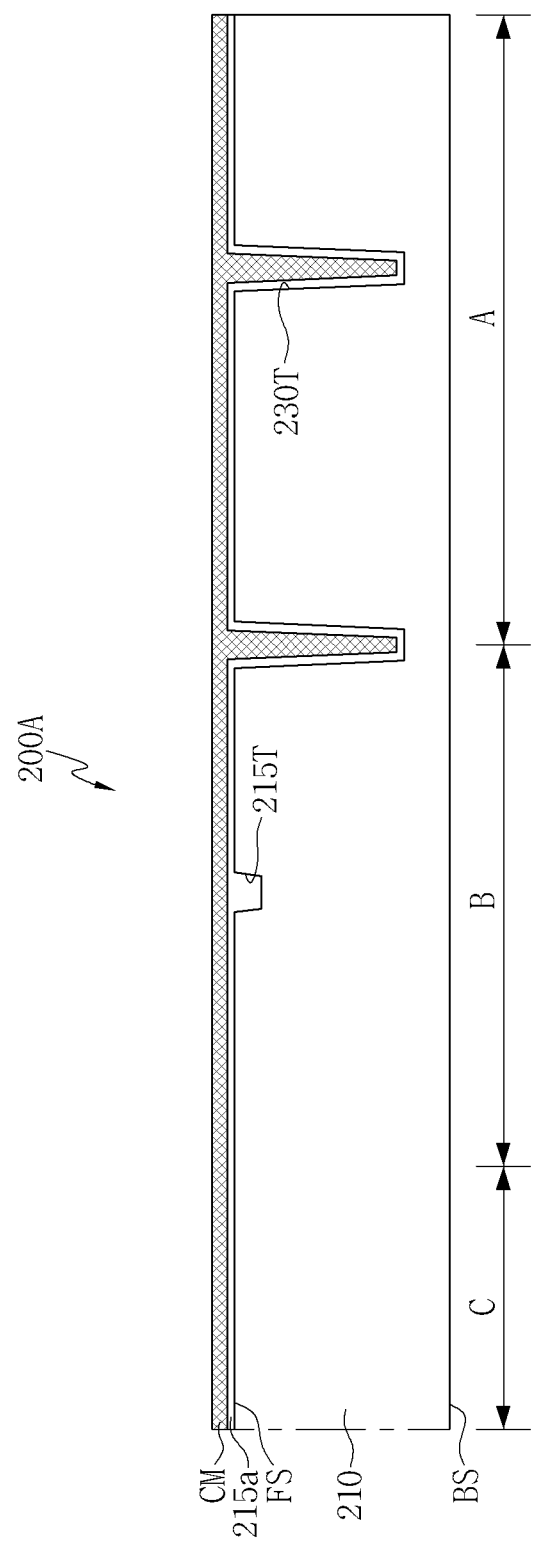
Figure 7D:
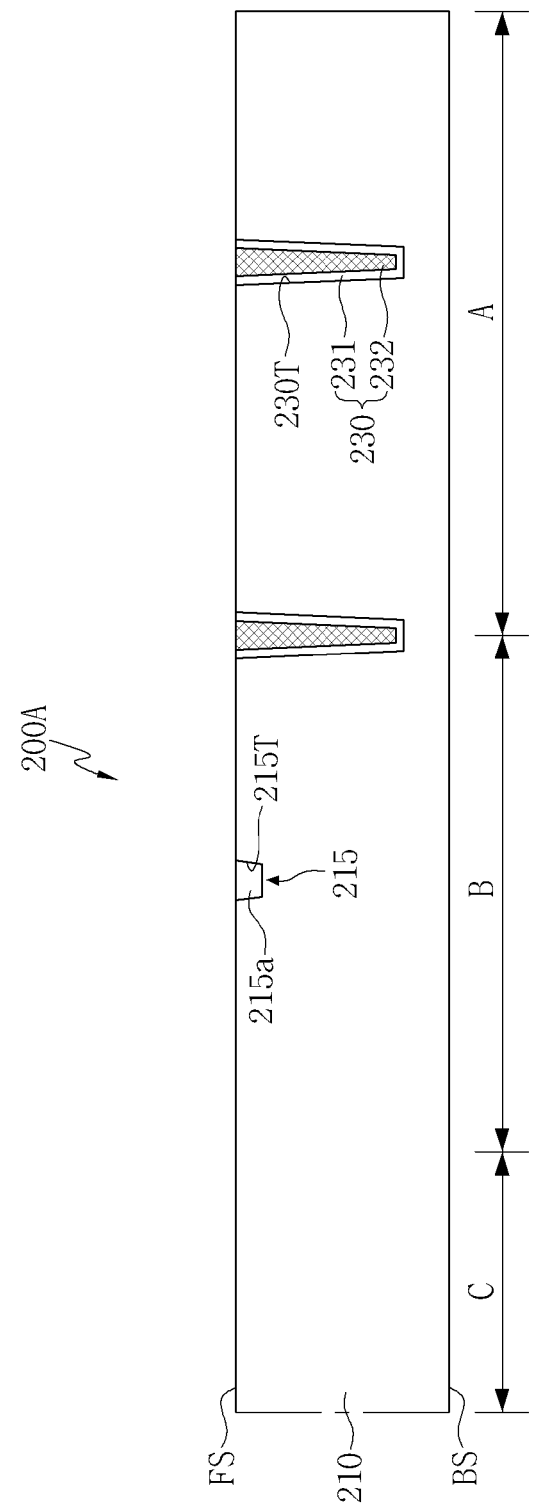
Figure 7E:
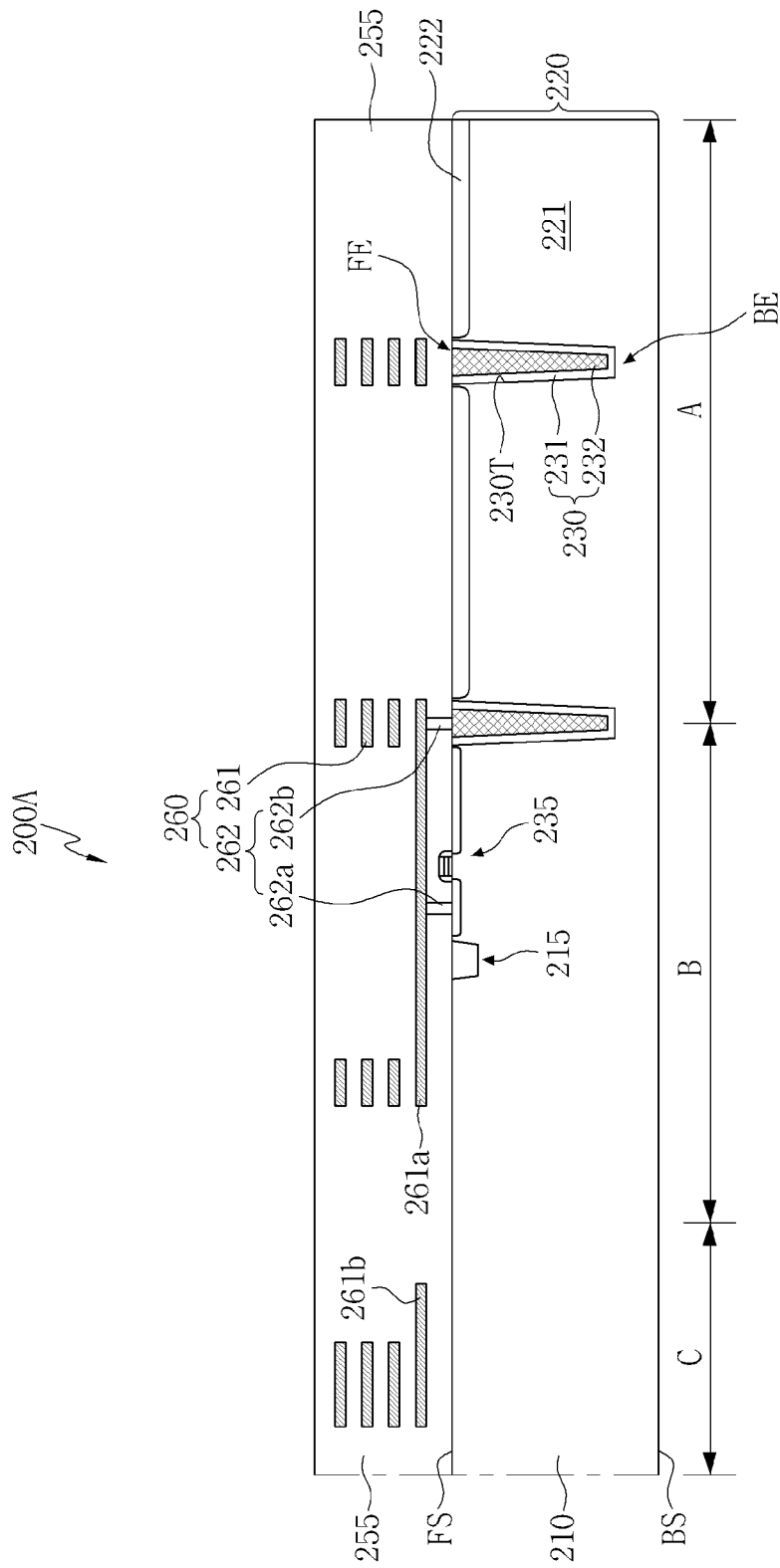
Figure 7F:
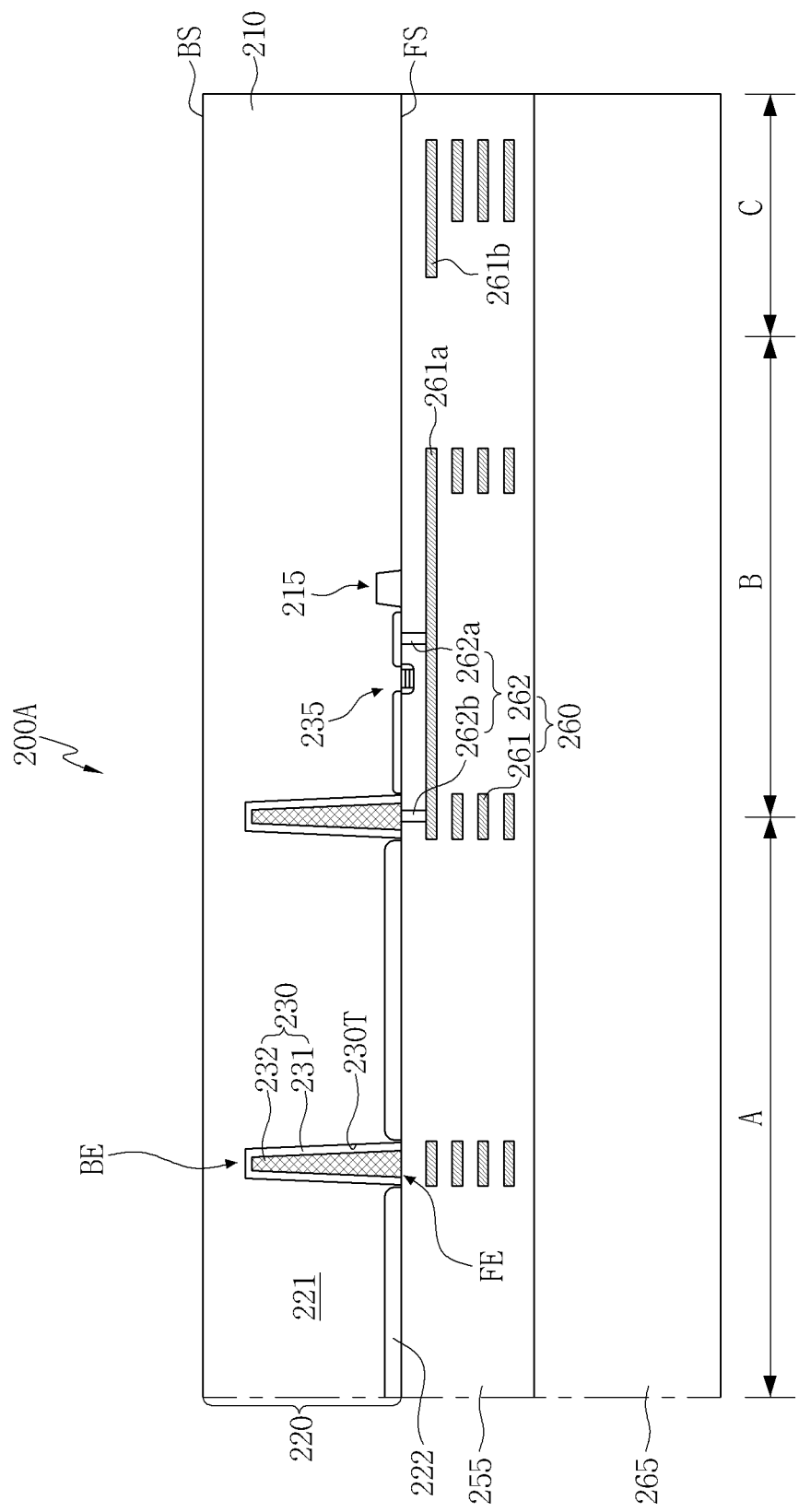
Figure 7G:
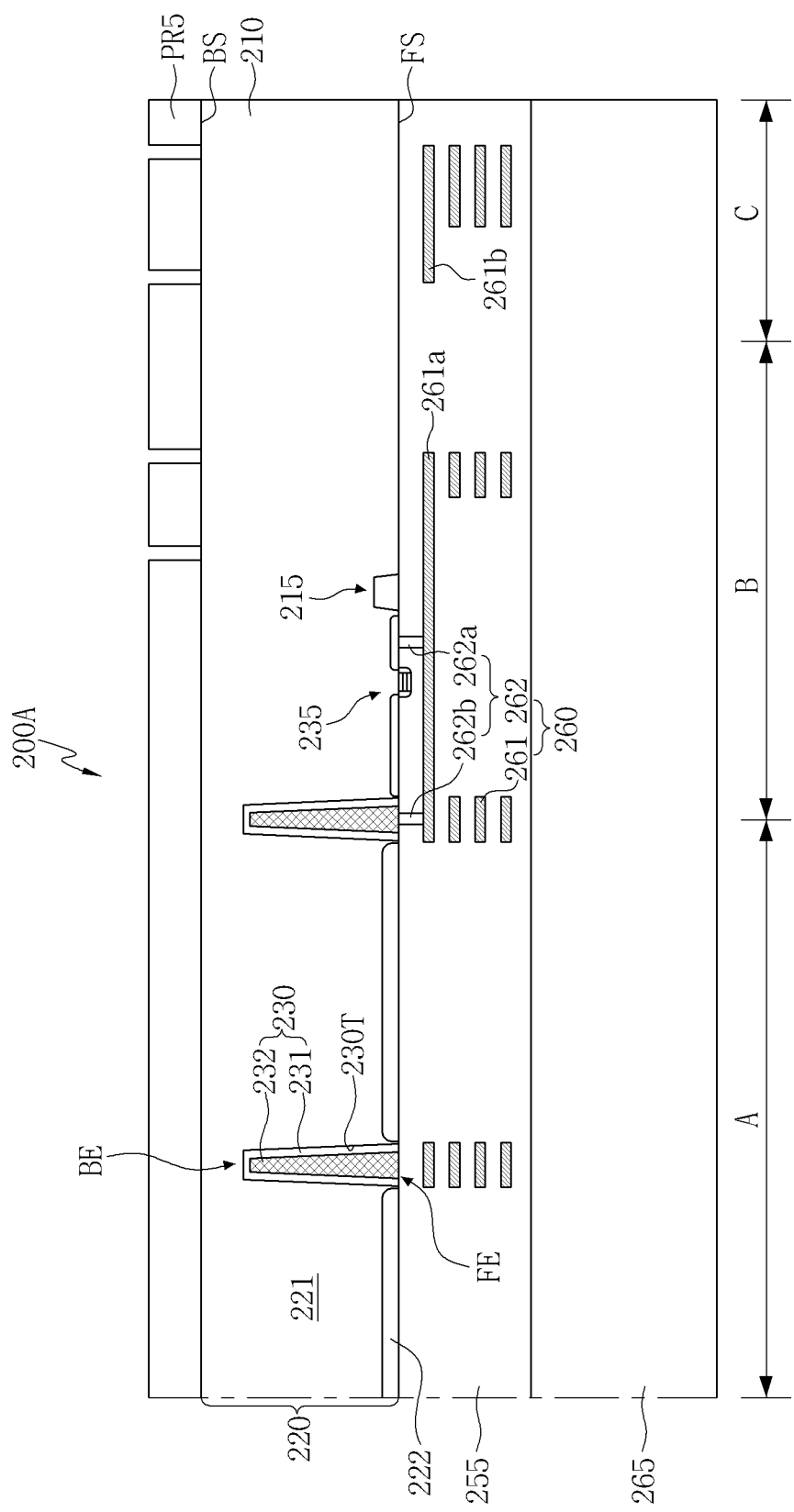
Figure 7H:
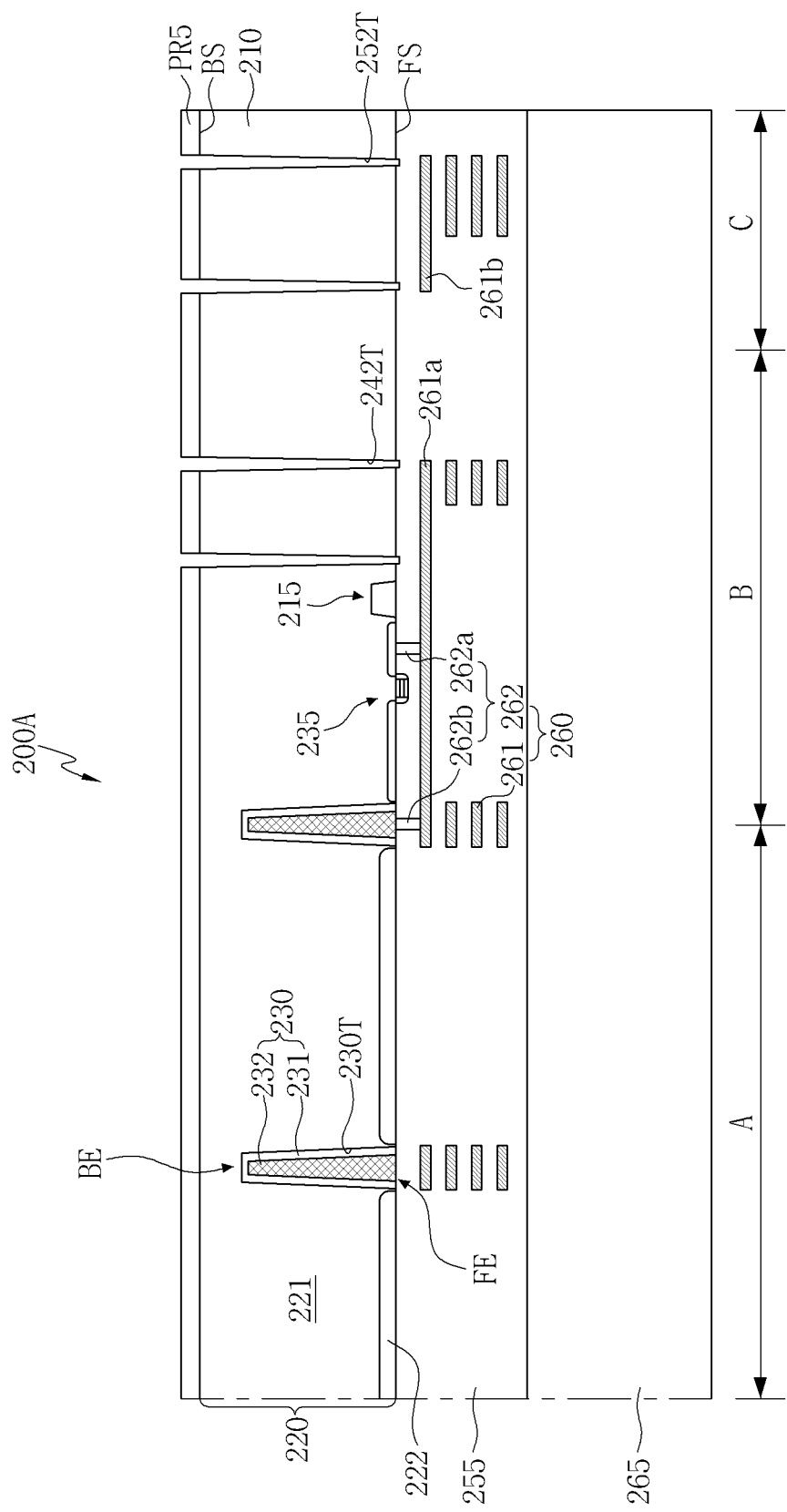
Figure 7I:
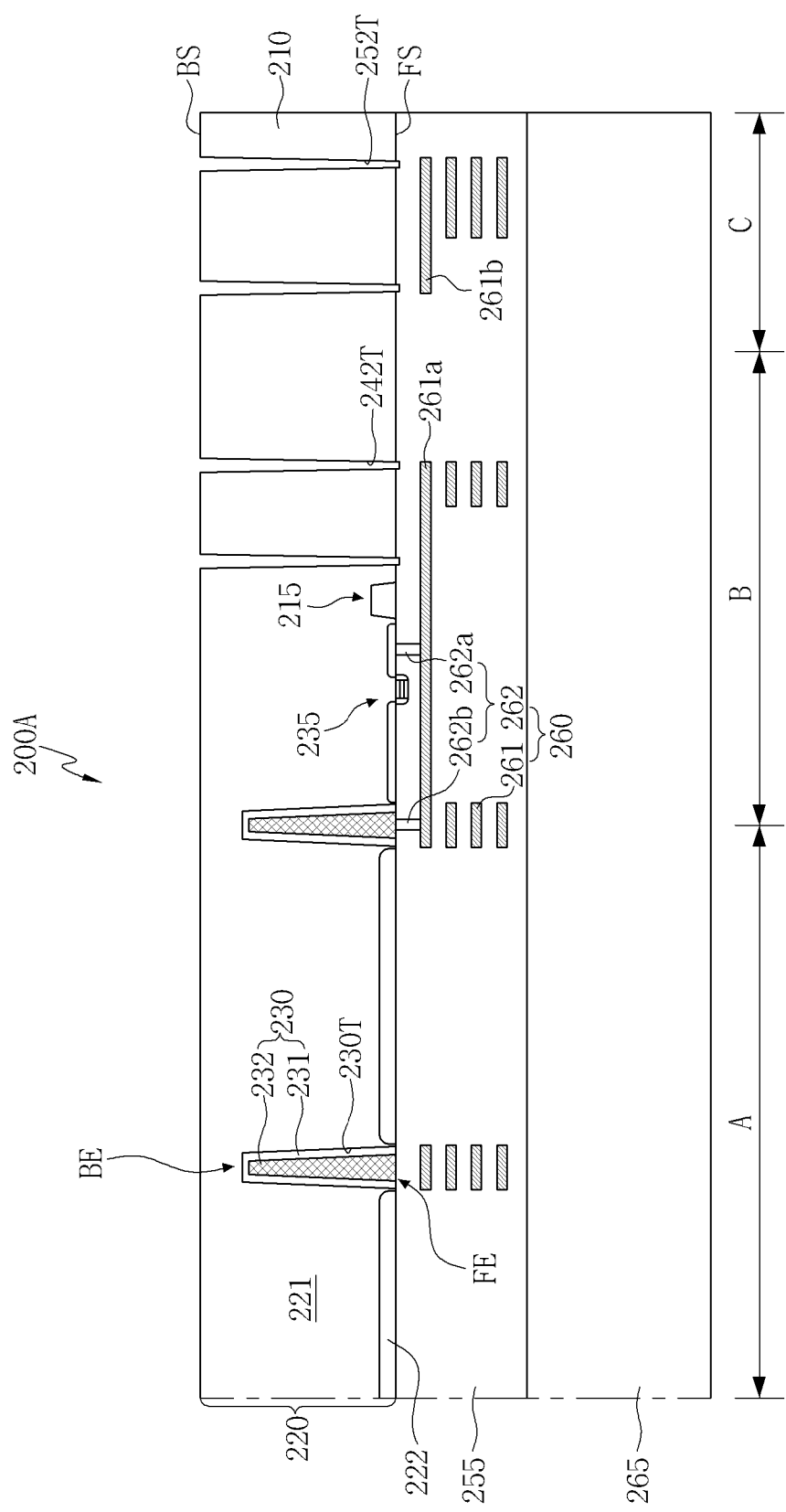
Figure 7J:
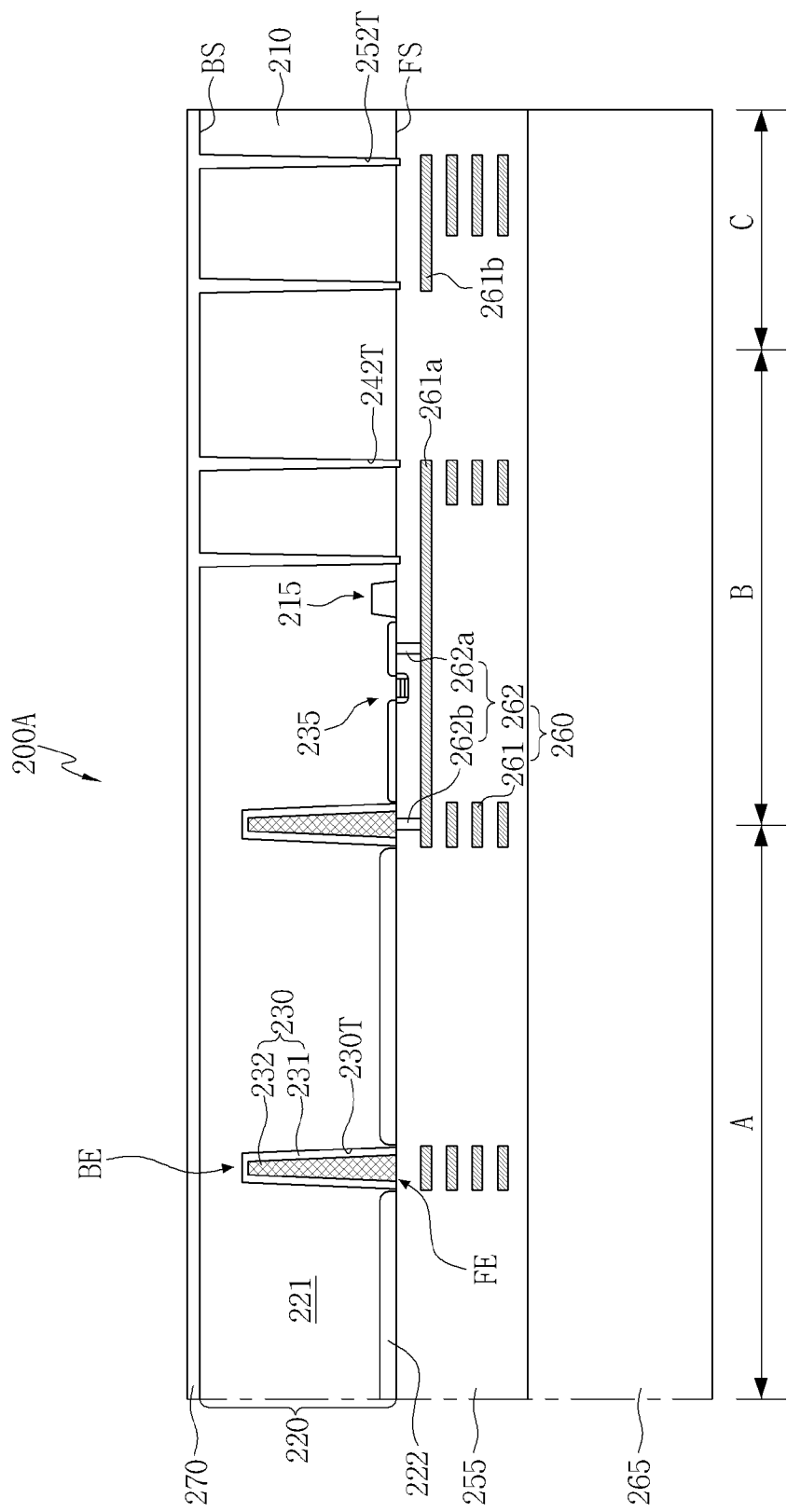
Figure 7K:
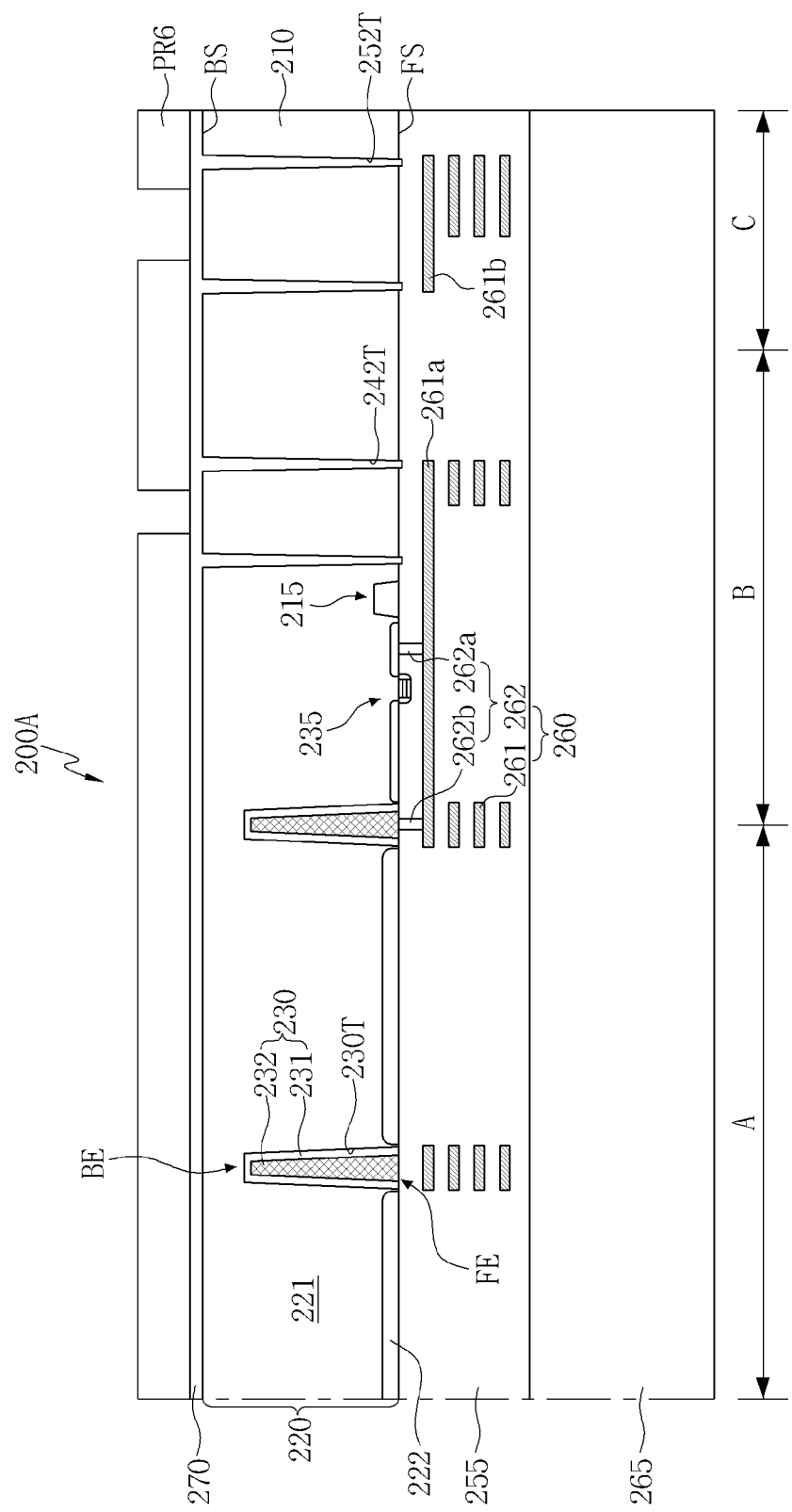
Figure 7L:
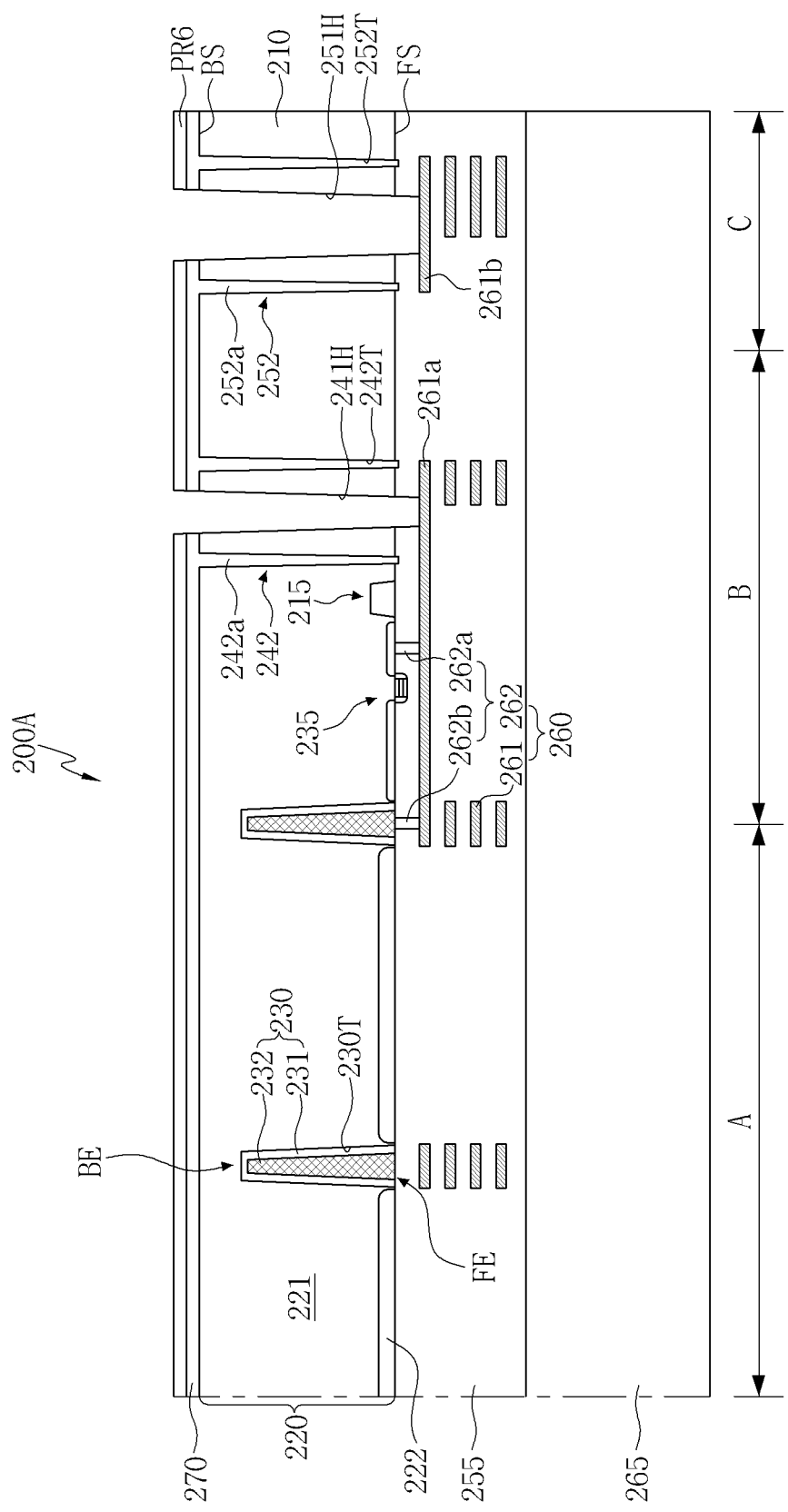
Figure 7M:
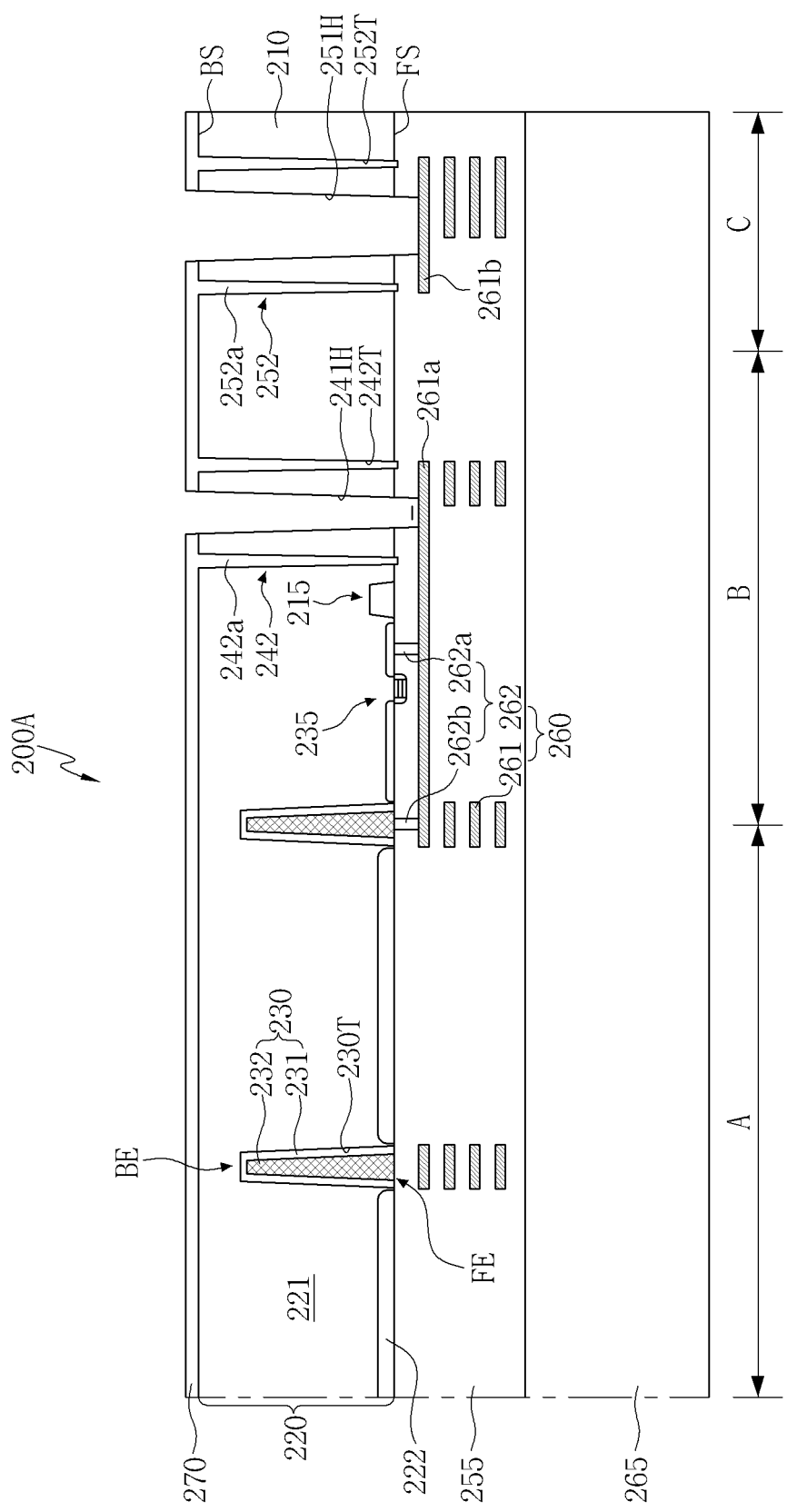
Figure 7N:
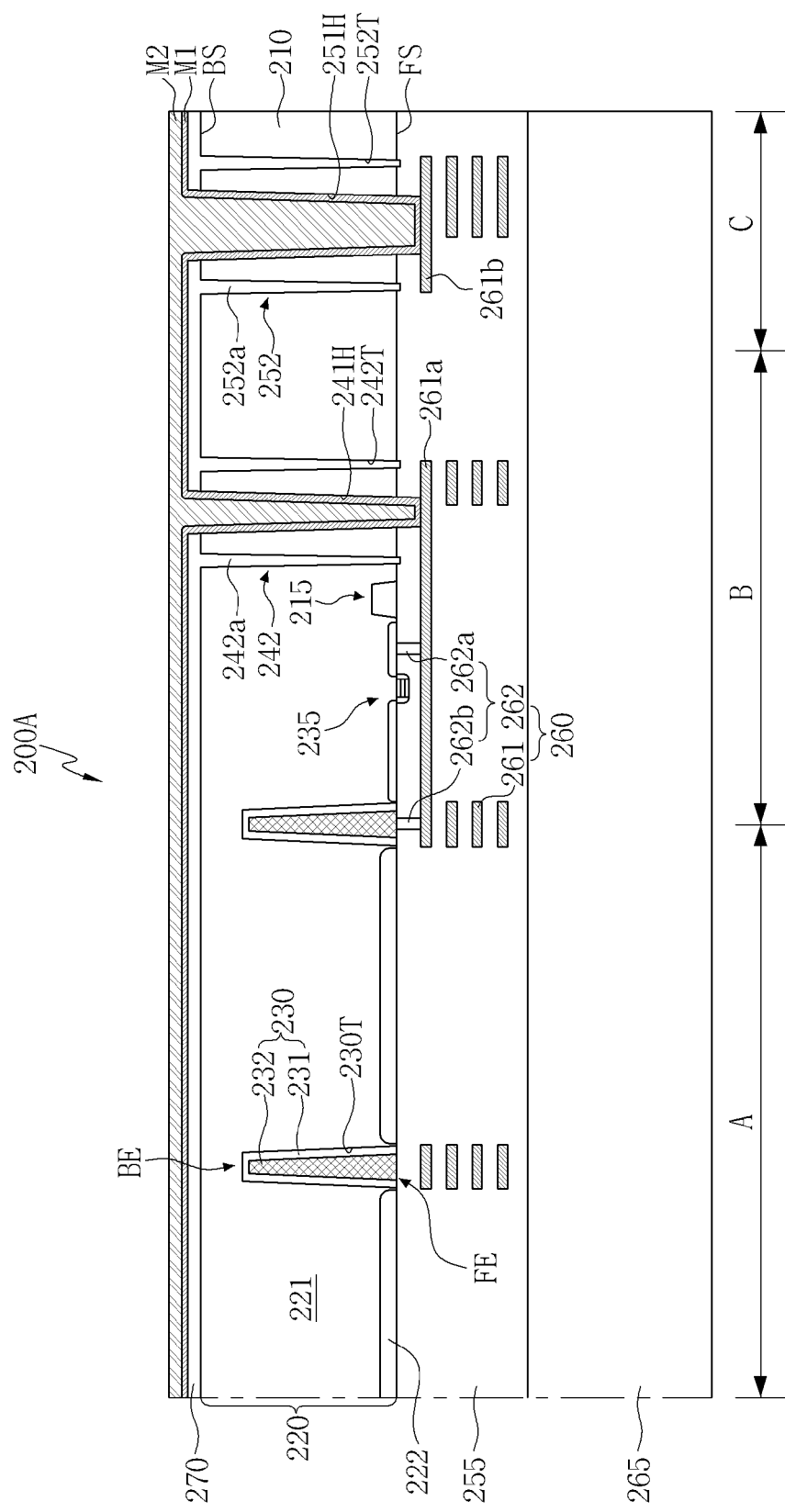
Figure 70:
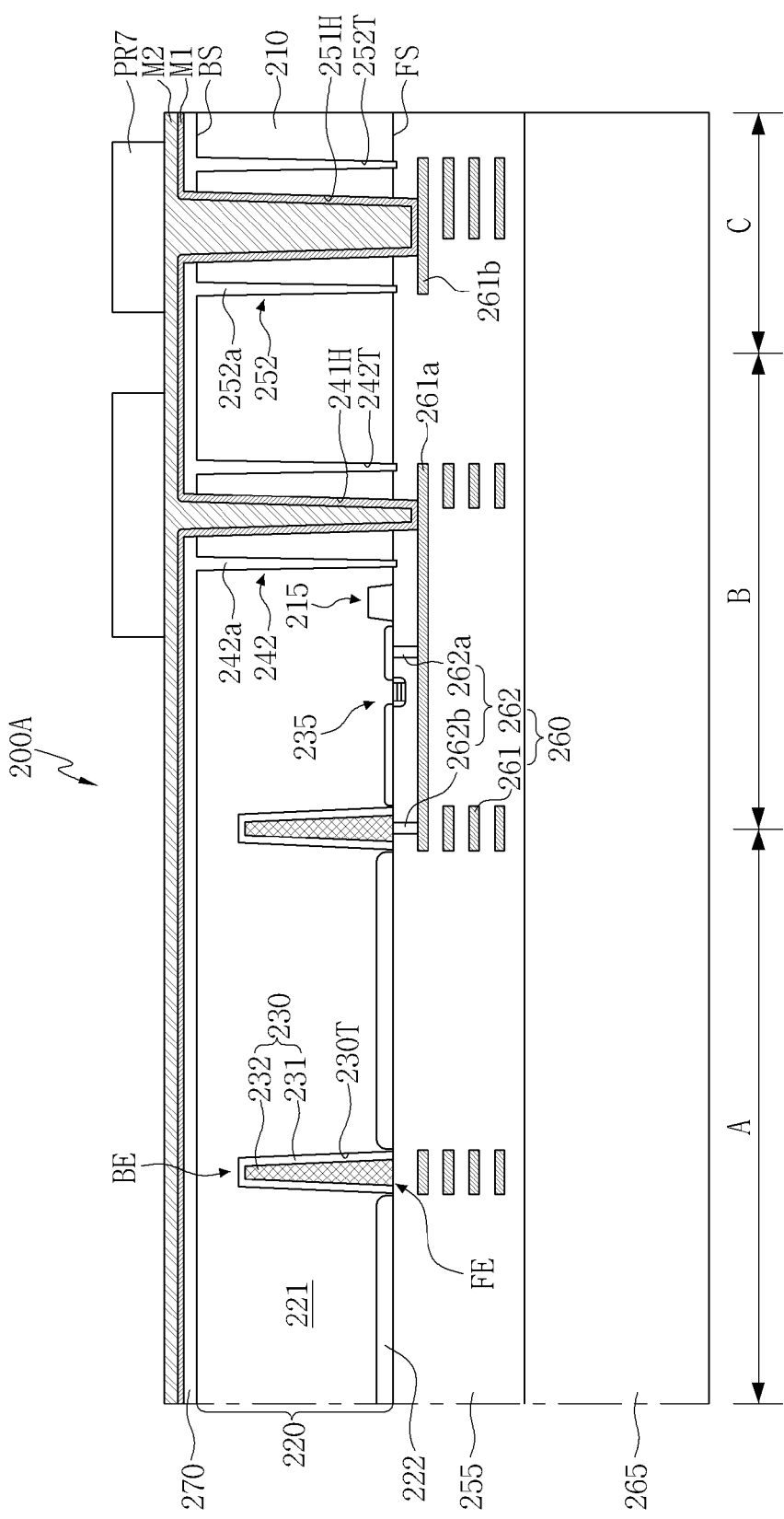
Figure 7P:
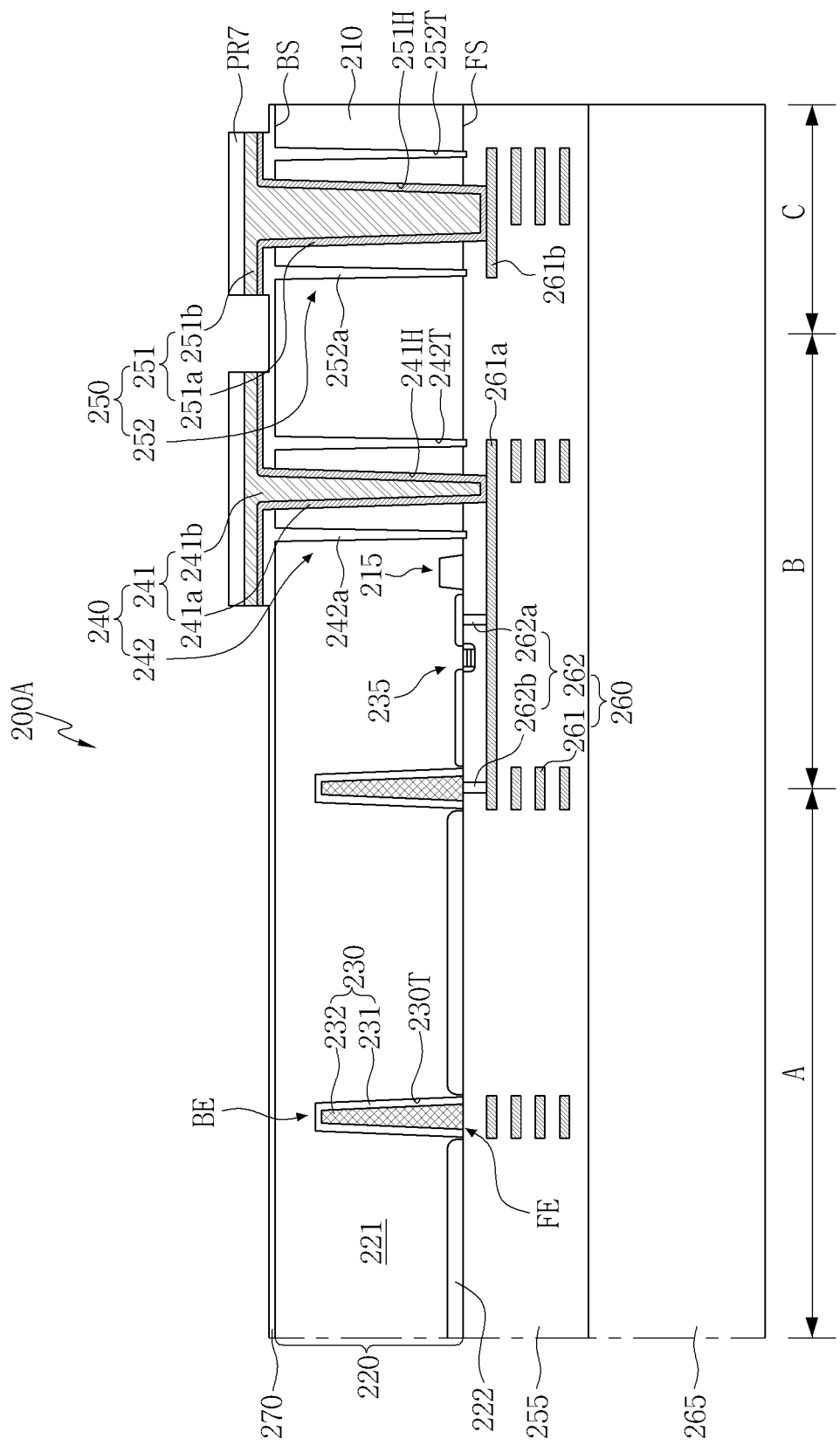
Figure 7R:
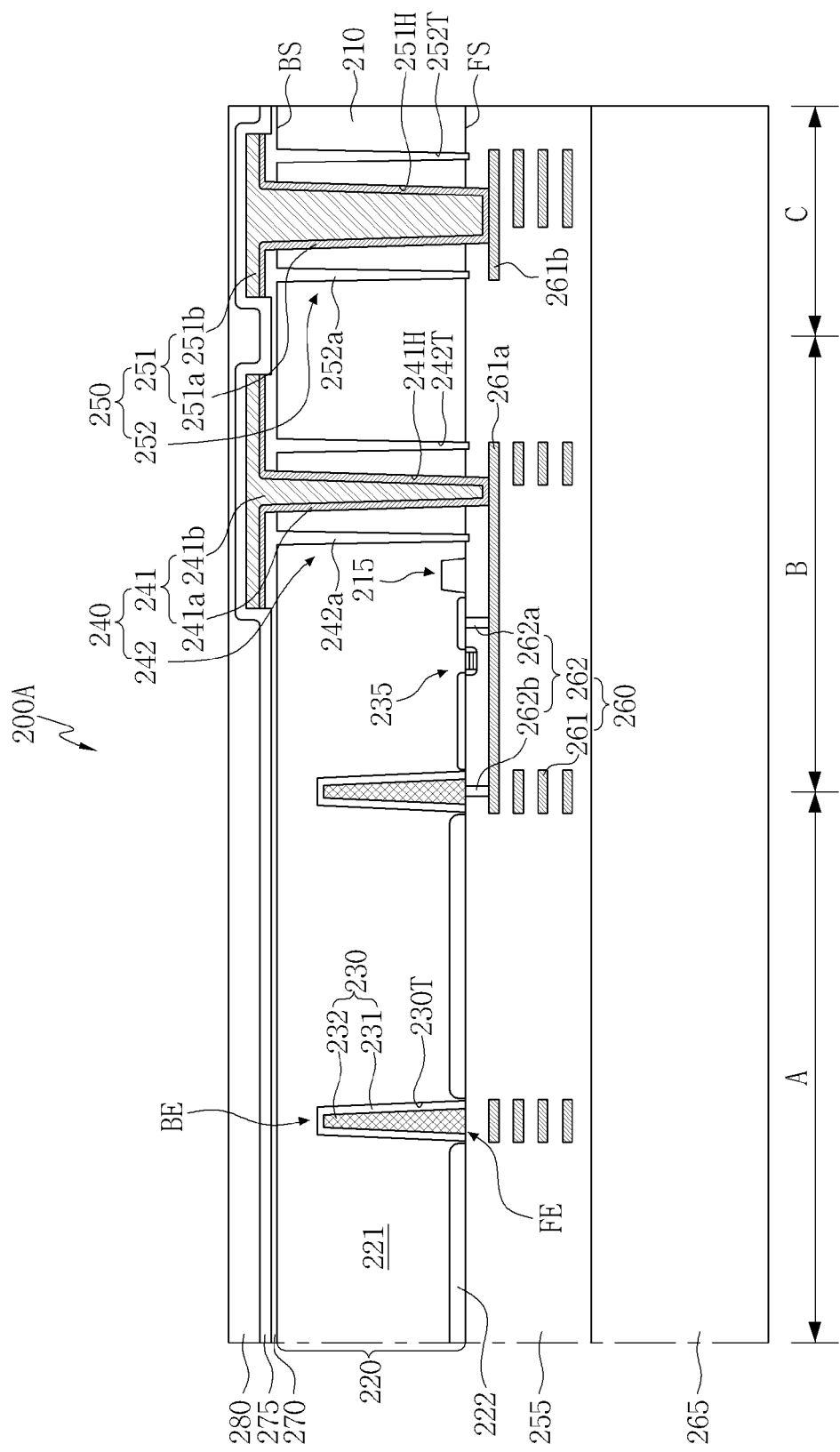
Figure 7S:
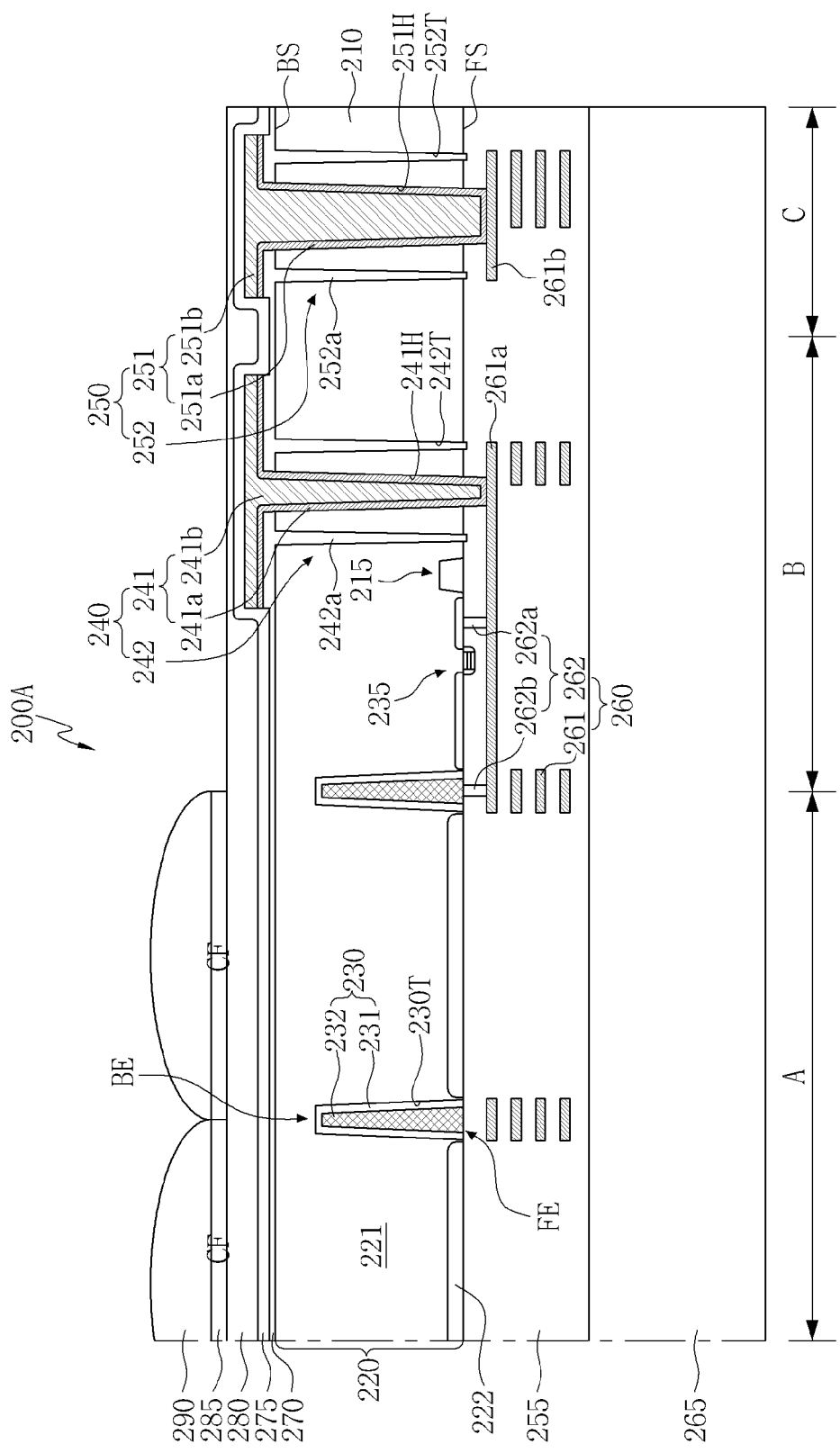
Figure 7T:
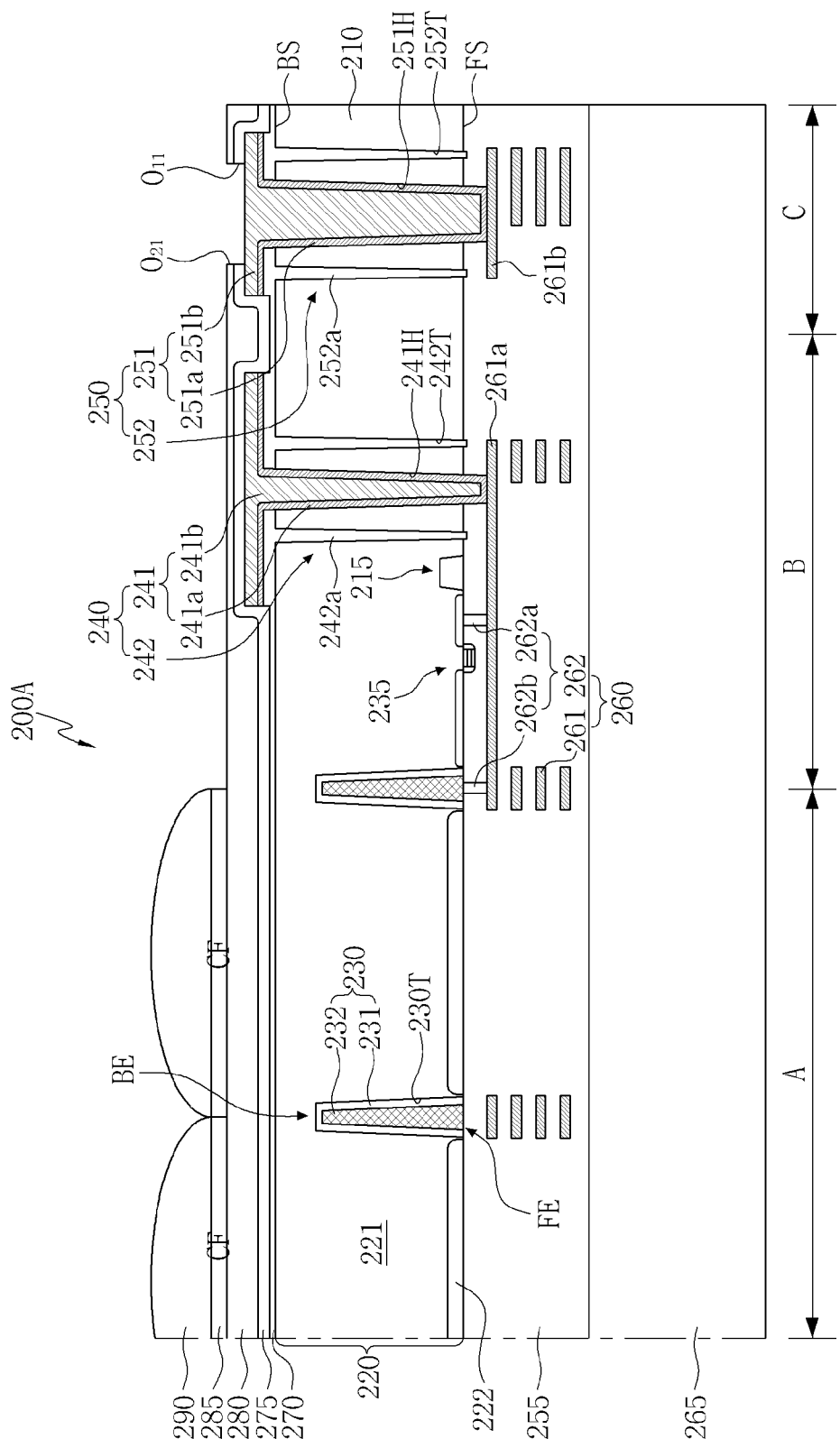

FIGS. 7A to 7T are longitudinal-sectional views illustrating a method of manufacturing an image sensor 200A according to still another embodiment of the inventive concepts.

Referring to FIG. 7A, the method may include preparing a semiconductor substrate 210 including a front side FS and a back side BS facing each other, forming a shallow area isolation trench 215T on the front side FS to the inside of the semiconductor substrate 210, and forming a device isolation trench 230T penetrating or projecting into a substantial length inside the semiconductor substrate 210. A bottom of the area isolation trench 215T is in the semiconductor substrate 210, and may be nearer the front side FS than the back side BS of the semiconductor substrate 210. A bottom of the device isolation trench 230T may be in the semiconductor substrate 210, and may be nearer the back side BS than the front side FS of the semiconductor substrate 210.

Referring to FIG. 7B, the method may include conformally forming an insulating material layer 215a on the front side FS of the semiconductor substrate 210, and on inner walls of the area isolation trench 215T and the device isolation trench 230T by performing a deposition process. In this process, the insulating material layer 215a may fill the inside of the area isolation trench 215T. The insulating material layer 215a may include silicon oxide.

Referring to FIG. 7C, the method may include forming a conductive material layer CM on the insulating material layer 215a. The conductive material layer CM may be formed to have a sufficient thickness to fill the inside of the device isolation trench 230T. For example, the conductive material layer CM may include a doped polysilicon.

Referring to FIG. 7D, the method may include removing the insulating material layer 215a and the conductive material layer CM to expose the front side FS of the semiconductor substrate 210 by performing an etching process.

In this process, an area isolation structure 215 filled with the insulating material layer 215a in the area isolation trench 215T may be formed. Numbers 215T and 215a in the area isolation structure 215 will be omitted below for brevity. Further, a device isolation structure 230 including a device isolation insulating pattern 231 and a device isolation conductive pattern 232 where the insulating material layer 215a and the conductive material layer CM are changed, respectively, may be formed in the device isolation trench 230T. The area isolation structure 215 and the device isolation structure 230 may define a pixel area A, a voltage connection area B, and a pad area C in the semiconductor substrate 210.

Referring to FIG. 7E, the method may include forming a voltage applying device 235 on the voltage connection area B of the semiconductor substrate 210, forming an insulating layer 255 on the front side FS of the semiconductor substrate 210, and forming an internal circuit 260 in the insulating layer 255.

Referring to FIG. 7F, the method may include turning the semiconductor substrate 210 and the insulating layer 255, and bonding the semiconductor substrate 210 and the insulating layer 255 on a supporting substrate 265.

Referring to FIG. 7G, the method may include forming a fifth mask pattern PR5 defining a voltage connection insulating trench 242T and a through via insulating trench 252T in the voltage connection area B and the pad area C of the semiconductor substrate 210, respectively, on the back side BS of the semiconductor substrate 210. The fifth mask pattern PR5 may include an organic material such as silicon oxide, silicon nitride, silicon oxynitride, or photoresist.

Referring to FIG. 7H, the method may include forming a voltage connection insulating trench 242T and a through via insulating trench 252T with a form of a ring vertically penetrating or projecting into the semiconductor substrate 210 in the voltage connection area B and the pad area C of the semiconductor substrate 210, respectively, by performing an etching process using the fifth mask pattern PR5 as an etching mask. Bottoms of the voltage connection insulating trench 242T and the through via insulating trench 252T may be recessed into the insulating layer 255 by completely penetrating or projecting into the semiconductor substrate 210. In this process, the fifth mask pattern PR5 may become thin.

Referring to FIG. 7I, the method may include removing the thinned fifth mask pattern PR5 by performing an ashing process.

Referring to FIG. 7J, the method may include conformally forming an anti-reflective layer 270 on the back side BS of the semiconductor substrate 210, and on inner walls of the voltage connection insulating trench 242T and the through via insulating trench 252T by performing a deposition process. Material and thickness, etc. of the anti-reflective layer 270 may be varied according to, for example, a wavelength of light used in a photolithography process, and the anti-reflective layer 270 may be formed in a single layer or a multi-layer. The anti-reflective layer 270 may include silicon nitride and/or tantalum oxide. Further, the anti-reflective layer 270 may be formed by stacking silicon nitride and tantalum oxide. In this process, the voltage connection insulating trench 242T, and the through via insulating trench 252T may be filled with the anti-reflective layer 270.

Referring to FIG. 7K, the method may include forming a sixth mask pattern PR6 defining a voltage connection contact hole 241H and a through via contact hole 151H in the voltage connection area B and the pad area C of the semiconductor substrate 210, respectively, on the anti-reflective layer 270. The sixth mask pattern PR6 may include an organic material such as silicon oxide, silicon nitride, silicon oxynitride, or photoresist.

Referring to FIG. 7L, the method may include forming a voltage connection contact hole 241H exposing the internal circuit 260 (for example, a device connection inner wire 261a) electrically connected to the voltage applying device 235, and a through via contact hole 251H exposing the internal circuit 260 (for example, a pad connection inner wire 261b) of the pad area C, by performing an etching process using the sixth mask pattern PR6 as an etching mask.

In this process, the sixth mask pattern PR6 may become thin. Further, a voltage connection insulating area 242 filled with a voltage connection insulating pattern 242a that the anti-reflective layer 270 is changed may be formed inside the voltage connection insulating trench 242T, and a through via insulating area 252 filled with a through via insulating pattern 252a where the anti-reflective layer 270 is changed may be formed inside the through via insulating trench 252T. The voltage connection insulating pattern 242a and the through via insulating pattern 252a may be materially in continuity with the anti-reflective layer 270 formed on the back side BS of the semiconductor substrate 210.

Meanwhile, the voltage connection insulating area 242 may be spaced a desired, or alternatively predetermined distance from, and cover a side of, the voltage connection contact hole 241H, and the through via insulating area 252 may be spaced a desired, or alternatively predetermined distance from, and cover a side of, the through via contact hole 251H.

Referring to FIG. 7M, the method may include removing the thinned sixth mask pattern PR6 by performing an ashing process.

Referring to FIG. 7N, the method may include conformally forming a first conductive layer M1 on the anti-reflective layer 270, and on inner walls of the voltage connection contact hole 241H and the through via contact hole 251H, and forming a second conductive layer M2 on the first conductive layer M1.

The first conductive layer M1 may include a low-resistance conductive material, and may include a material that can be conformally formed to lower portions of the voltage connection contact hole 241H and the through via contact hole 251H. For example, the first conductive layer M1 may include tungsten (W). The second conductive layer M2 may be formed to have a thickness sufficient to fill the insides of the voltage connection contact hole 242H and the through via contact hole 251H. The second conductive layer M2 may include a low-resistance conductive material. For example, the second conductive layer M2 may include aluminum (Al) and doped polysilicon.

Referring to FIG. 7O, the example method may include forming a seventh mask pattern PR7 to be patterned for removing the first and second conductive layers M1 and M2 of the pixel area A, and removing the first and second conductive layers M1 and M2 between the voltage connection area B and the pad area C on the second conductive layer M2. The seventh mask pattern PR7 may include an organic material such as silicon oxide, silicon nitride, silicon oxynitride, or photoresist.

Referring to FIG. 7P, the method may include partially removing the first and second conductive layers M1 and M2 by performing an etching process using the seventh mask pattern PR7 as an etching mask.

In this process, the anti-reflective layer 270 may be exposed on the pixel area A of the semiconductor substrate 210, and the anti-reflective layer 270 between the voltage connection area B and the pad area C of the semiconductor substrate 210 may also be exposed. Further, in this process, the seventh mask pattern PR7 may become thin, and the exposed anti-reflective layer 270 may become thinner.

In this example process, a voltage connection contact plug 241 including a first voltage connection conductive pattern 241a and a second voltage connection conductive pattern 241b where the first conductive layer M1 and the second conductive layer M2 are changed, respectively, may be formed inside the voltage connection contact hole 241H. Accordingly, a voltage connection structure 240 including the voltage connection contact plug 241 and the voltage connection insulating area 242 may be formed.

A through via contact plug 251 including a first through via conductive pattern 251a and a second through via conductive pattern 251b where the first conductive layer M1 and the second conductive layer M2 are changed, respectively, may be formed inside the through via contact hole 251H. Accordingly, a through via structure 250 including the through via contact plug 251 and the through via insulating area 252 may be formed.

Further, the anti-reflective layer 270, the voltage connection insulating pattern 242a, and the through via insulating pattern 252a may be materially in continuity with each other.

Referring to FIG. 7Q, the method may include removing the thinned seventh mask pattern PR7 by performing an ashing process.

Referring to FIG. 7R, the method may include conformally forming a protective film 275 on the anti-reflective layer 270, the voltage connection structure 240, and the through via structure 250 by performing a deposition process, and forming a planarized film 280 on the protective film 275 by performing the deposition process.

Referring to FIG. 7S, the method may include forming a color filter 285 including a corresponding pigment on the planarized film 280 to overlap each of the photoelectric conversion devices 220 in the pixel area A of the semiconductor substrate 210, and forming a microlens 290 on the color filter 285. The microlens 290 may be formed by performing a reflow process after forming a photoresist pattern on the color filter 285.

Referring to FIG. 7T, the method may include removing portions of the protective film 275 and the planarized film 280 by performing an etching process, exposing the second through via conductive pattern 251b of the through via structure 250. Here, the exposed second through via conductive pattern 251b may be used as a through via pad. In this process, a first pad connection opening $O_{11}$ exposing the second through via conductive pattern 251b may be formed in the protective film 275, and a second pad connection opening $O_{21}$ exposing the second through via conductive pattern 251b may be formed in the planarized film 280. The first pad connection opening $O_{11}$ and the second pad connection opening $O_{21}$ may be vertically aligned with each other.

Referring to FIG. 3B further, the method may further include stacking a solder ball 295 on the second through via conductive pattern 251b exposed by the first and second pad connection openings $O_{11}$ and $O_{21}$.

Figure 8:
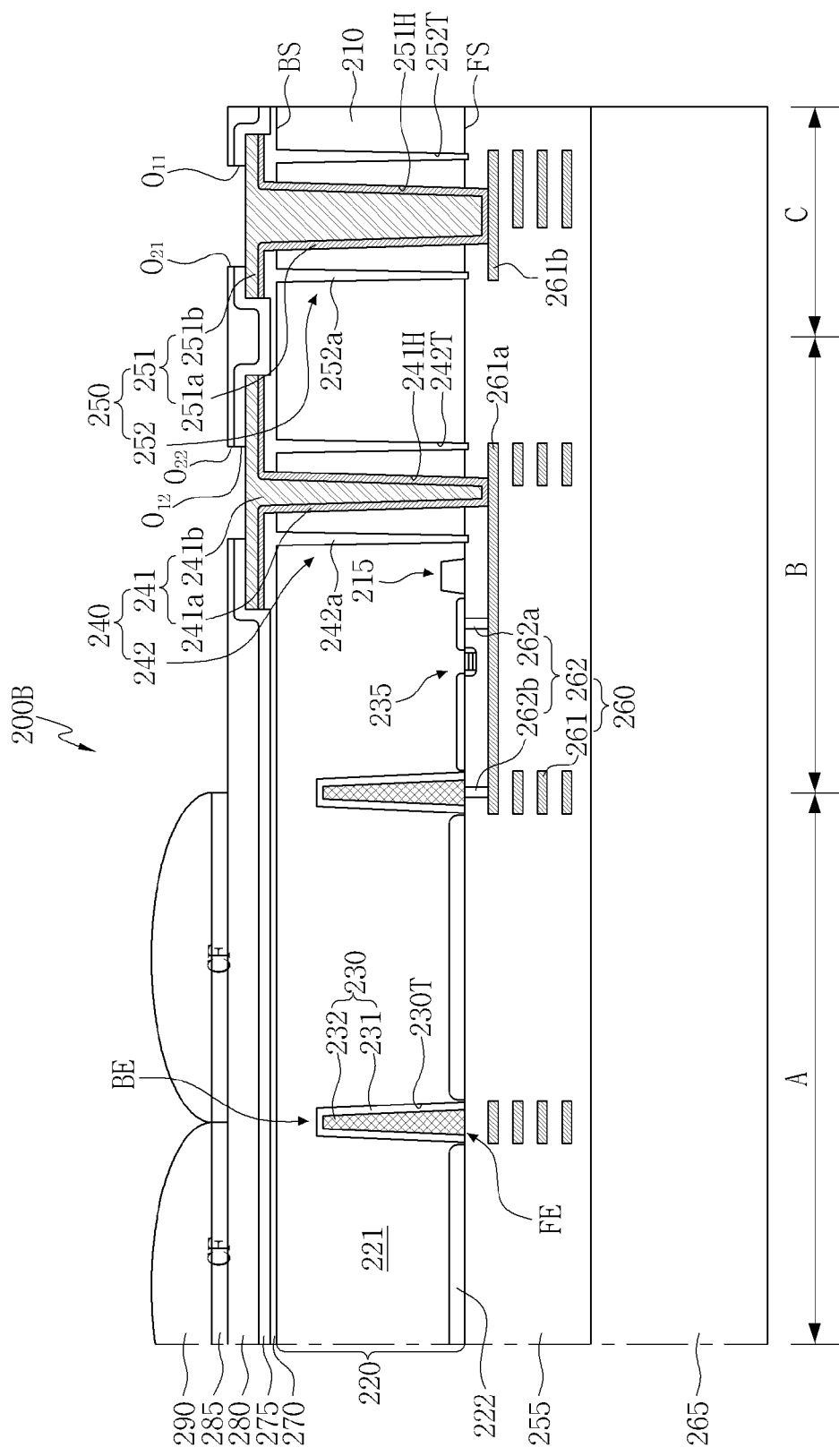
FIG. 8 is a longitudinal-sectional view illustrating a method of manufacturing an image sensor according to at least one example embodiment of the inventive concepts.

FIG. 8 is a longitudinal-sectional view illustrating a method of manufacturing an image sensor 200B according to at least one example embodiment of the inventive concepts. Since a method of manufacturing an image sensor 200B according to an example embodiment of the inventive concepts is equal to or same as the method of manufacturing the image sensor 200A according to an example embodiment of the inventive concepts excluding the method explained with reference to FIG. 7T, detailed description for the same method will be replaced with the foregoing description.

Referring to FIGS. 7A to 7S, and 8, the example method may include removing portions of the protective film 275 and the planarized film 280 by performing an etching process, and exposing the second through via conductive pattern 251b of the through via structure 250 and the second voltage connection conductive pattern 241b of the voltage connection structure 240. Here, the exposed second through via conductive pattern 251b may be used as a through via pad, and the exposed second voltage connection conductive pattern 241b may be used as a voltage connection pad. In this example process, a first pad connection opening $O_{11}$ exposing the second through via conductive pattern 251b and a first voltage connection opening $O_{12}$ exposing the second voltage connection conductive pattern 241b may be formed in the protective film 275, and a second pad connection opening $O_{21}$ exposing the second voltage through via conductive pattern 241b and a second voltage connection opening $O_{22}$ exposing the second voltage connection conductive pattern 241b may be formed in the planarized pattern 280. The first pad connection opening $O_{11}$ and the second pad connection opening $O_{21}$ may be vertically aligned with each other, and the first voltage connection opening $O_{12}$ and the second voltage connection opening $O_{22}$ may be vertically aligned with each other.

Referring to FIG. 4 further, the example method may further include stacking a solder ball 295 on the second through via conductive pattern 251b exposed by the first and second pad connection openings $O_{11}$ and $O_{21}$. The example method may further include connecting an external circuit (for example, a voltage applying module) on the second voltage connection conductive pattern 241b exposed by the first and second voltage connection openings $O_{12}$ and $O_{22}$. The external circuit may apply a desired, or alternatively predetermined voltage (for example, a negative voltage) to the device isolation structure 230 through the voltage connection structure 240 and an internal circuit 260 (for example, a first device connection inner wire 261a and a second voltage connection inner via 262b). Accordingly, when the voltage is applied to the device isolation structure 230, a dark current generated on a boundary surface of the device isolation structure 230 and the semiconductor substrate 210 can be reduced.

Figure 9:
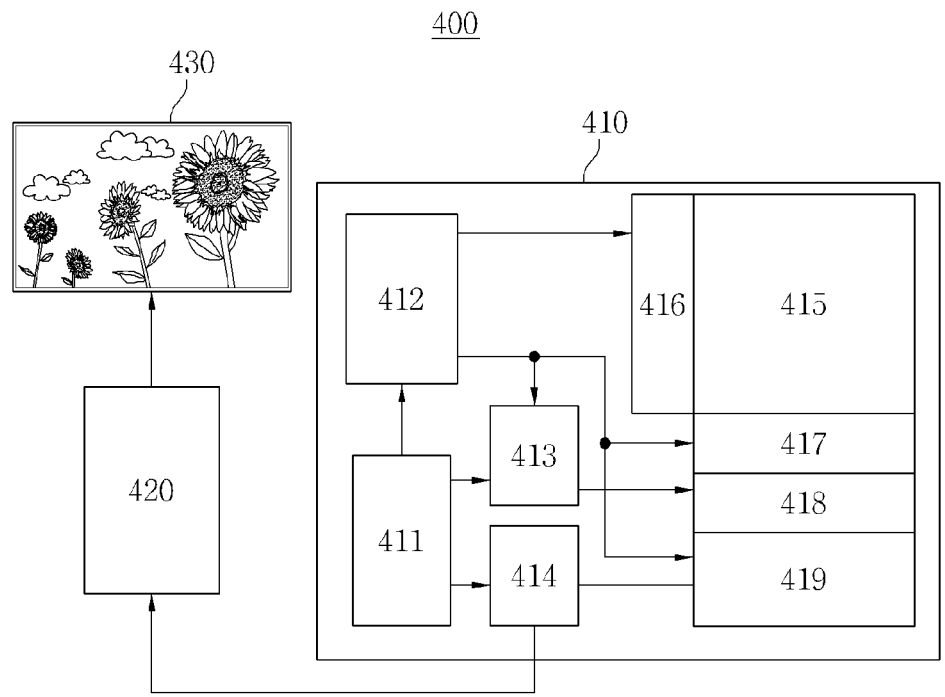
FIG. 9 is a schematic block diagram illustrating a camera system including any one of the image sensors according to at least one example embodiment of the inventive concepts.

FIG. 9 is a schematic block diagram illustrating a camera system including any one of the image sensors 100A, 100B, 200A, and 200B according to various example embodiments of the inventive concepts.

Referring to FIG. 9, a camera system 400 including the image sensors according to at least one example embodiment of the inventive concepts may include an image sensing unit 410, an image signal processing unit 420, and an image display unit 430. The image sensing unit 410 may include a control register unit 411, a timing generator 412, a lamp signal generator 413, a buffer unit 414, an active pixel sensor array 415, a row driver 416, a correlated double sampler 417, a comparator 418, and an analog to digital converter 419. The control register unit 411 may control overall operations of the image sensing unit 410. Specifically, the control register unit 411 may directly transfer operation signals to the timing generator 412, the lamp signal generator 413, and the buffer unit 414. The timing generator 412 may generate a reference signal for an operation timing of various elements of the image sensing unit 410. The reference signal for the operation timing generated from the timing generator 412 may be transferred to the row driver 416, the correlated double sampler 417, the comparator 418, and/or the analog to digital converter 419, etc. The lamp signal generator 413 may generate and transfer a lamp signal used in the correlated double sampler 417 and/or the comparator 418, etc. The buffer unit 414 may include a latch. The buffer unit 414 may temporarily store an image signal being transmitted to the outside. The active pixel sensor array 415 may sense an external image. The active pixel sensor array 415 may include a plurality of active pixel sensors, and each of the active pixel sensors may include a backside illuminated image sensor (BSI) according to the inventive concepts. The row driver 416 may selectively activate a row of the active pixel sensor array 415. The correlated double sampler 417 may sample an analog signal generated from the active pixel sensor array 415, and output the sampled signal. The comparator 418 may compare a gradient, etc. of the feedback lamp signal according to data transmitted from the correlated double sampler 417 and analog reference voltages, and generate various reference signals. The analog to digital converter 419 may convert an analog image data into a digital image data.

Figure 10:
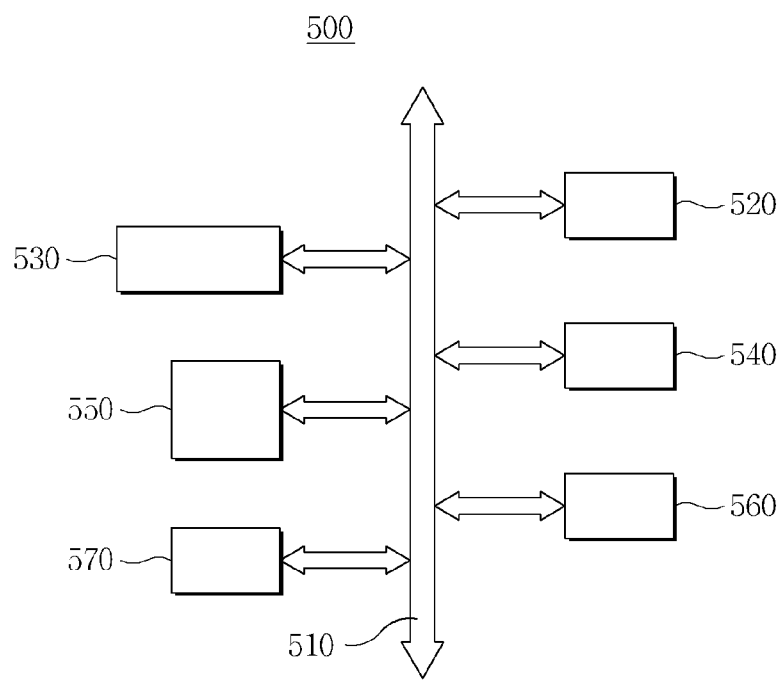
FIG. 10 is a schematic block diagram illustrating an electronic system including any one of the image sensors according to at least one example embodiment of the inventive concepts.
Figure 11A:
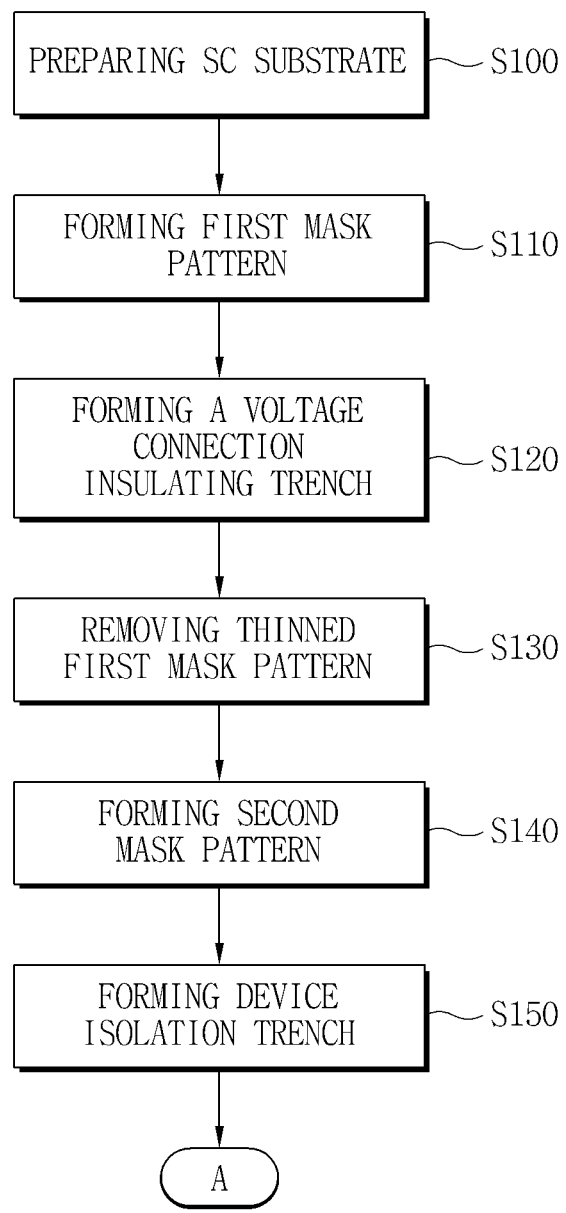
Figure 11B:
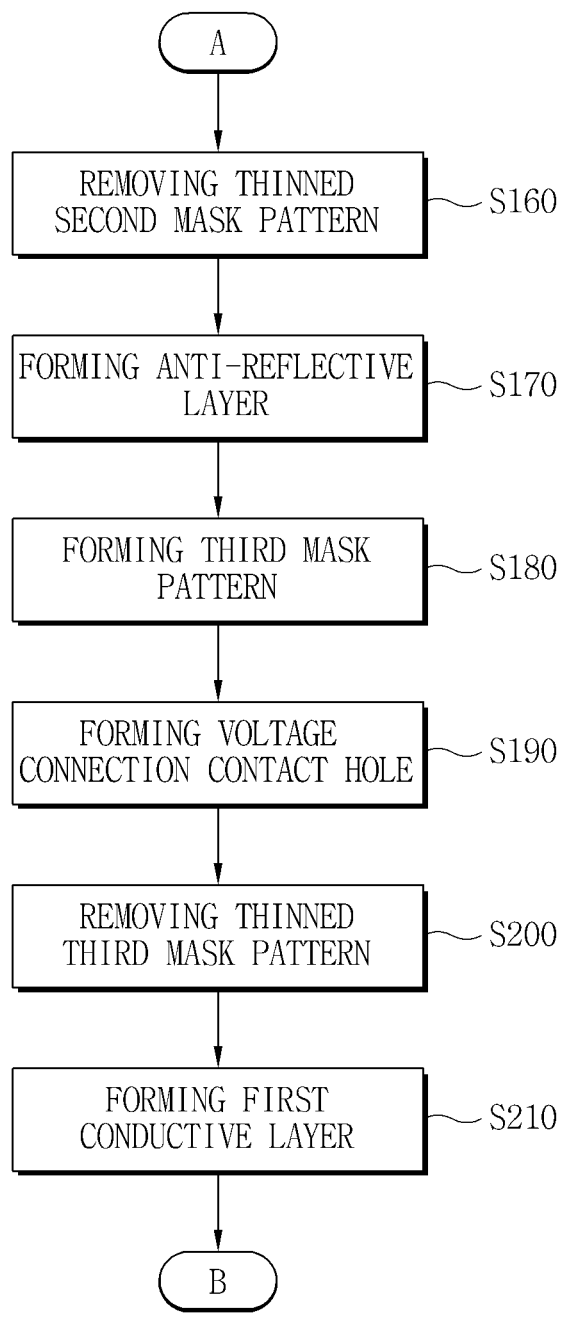
Figure 11D:
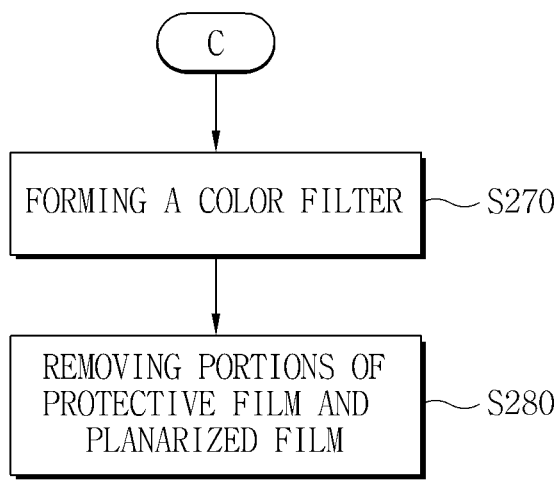

FIG. 10 is a schematic block diagram illustrating an electronic system including one of the image sensors 100A, 100B, 200A, and 200B according to various example embodiments of the inventive concepts.

Referring to FIG. 10, an electronic system 500 according to at least one example embodiment of the inventive concepts may include a bus 510, an image sensing unit 520 capable of inputting and outputting signals or data through the bus 510, a central processing unit 530, and an input/output unit 540. The electronic system 500 may further include a memory drive 550. The electronic system 500 may further include an optical disc drive (ODD) 560. The electronic system 500 may further include an external communication unit 570. The image sensing unit 520 may include a backside illuminated image sensor (BSI) according to the inventive concepts. The central processing unit 530 may include a microprocessor. The input/output unit 540 may include one among various input devices including an operation button, a switch, a keyboard, a mouse, a keypad, a touch pad, a scanner, a camera, an optical sensor, etc., or one among a liquid crystal display (LCD), a light emitting diode (LED) and/or a cathode ray tube (CRT) monitor, a printer, and/or a device for displaying various visual information. The memory drive 550 may include a dynamic random access memory (DRAM), a static random access memory (SRAM), a phase changeable random access memory (PRAM), a resistive random access memory (RRAM), a magnetic random access memory (MRAM), a non-volatile memory (NVM), a flash memory, a solid state drive (SSD), a hard disk (HD), and/or various memory devices, or a drive thereof. For example, the ODD 560 may include a compact disc-read only memory (CD-ROM) drive, a digital video disc (DVD) drive, etc. The external communication unit 570 may include a modem, a local area network (LAN) card, or a universal serial bus (USB), etc., and may include an external memory, a wireless broadband internet (WiBro) communication device, an infrared ray communication device, etc.

The image sensors according various example embodiments of the inventive concepts may improve a dark current property that may be generated in a process of manufacturing a device isolation structure by employing the device isolation structure capable of applying a voltage. Further, crosstalk and blooming phenomena between image pixels can also be considerably improved by the improved dark current property.

FIGS. 11(A)-11(D) are flow charts illustrating a method of manufacturing an image sensor, according to at least one example embodiment. In FIGS. 11(A)-11(D), the method starts at S100, where a semiconductor substrate is formed. At S110, a first mask pattern is formed, and a voltage connection insulating trench is formed at S120. At S130, the thinned first mask pattern is removed at S130, and a second mask pattern is formed at S140. At S150, a device isolation trench is formed. At S160, the thinned second mask pattern is removed, and an anti-reflective layer S170 is formed. A third mask pattern is formed at S180, and a voltage connection contact hole is formed at S190. At S200, the thinned third mask pattern is removed, and a first conductive layer is formed at S210. At S220, a second conductive layer is formed, and at S230, a fourth mask pattern is formed. At S240, the first and/or second conductive layers may be partially removed, and the thinned fourth mask layer is removed at S250. At S260, a protective film is formed, a color filter is formed at S270, and portions of the protective film and the planarized film are removed at S280.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures.

What is claimed is:

1. A back side illuminated image (BSI) sensor, comprising:
   a semiconductor substrate comprising a front side and a back side opposite to the front side;
   a pair of photodiodes formed between the front side and the back side;
   a pair of color filters formed over the back side and corresponding to the pair of photodiodes, respectively; and
   a device isolation structure comprising a first device isolation conductive pattern formed between the pair of photodiodes and extending in a first direction, the first device isolation conductive pattern including,
   a first portion over the back side and further away from the front side than the back side, and
   a second portion under the back side and disposed in a device isolation trench; and wherein
   a maximum width of the first portion in a second direction is greater than a maximum width of the second portion in the second direction, the second direction being substantially perpendicular with respect to the first direction.

2. The BSI sensor of claim 1, further comprising:
   a second device isolation conductive pattern formed between the first device isolation conductive pattern and the device isolation trench.

3. The BSI sensor of claim 2, wherein the device isolation structure further comprises a device isolation insulating pattern that is disposed between the second device isolation conductive pattern and the device isolation trench and disposed on the back side of the semiconductor substrate.

4. The BSI sensor of claim 3, wherein the device isolation insulating pattern is formed in a multi-layer.

5. The BSI sensor of claim 3, wherein the device isolation insulating pattern comprises tantalum oxide.

6. The BSI sensor of claim 1, further comprising:
an insulating layer disposed on the back side and an internal circuit disposed in the insulating layer.

7. The BSI sensor of claim 1, further comprising:
a voltage connection structure disposed in the semiconductor substrate and on the back side, the voltage connection structure electrically connected to the device isolation structure.

8. The BSI sensor of claim 7, further comprising:
a voltage applying device electrically connected to the device isolation structure via the voltage connection structure.

9. The BSI sensor of claim 8, wherein the voltage applying device comprises a MOS transistor.

10. A back side illuminated image (BSI) sensor, comprising:
a semiconductor substrate comprising a front side and a back side opposite to the front side;
a pair of photodiodes formed between the front side and the back side;
a pair of color filters formed over the back side and corresponding to the pair of photodiodes, respectively; and
a device isolation structure comprising a first device isolation conductive pattern formed between the pair of photodiodes and extending in a first direction, the first device isolation conductive pattern including,
a first portion over the back side and further away from the front side than the back side, and
a second portion under the back side and disposed in a device isolation trench; and wherein
the first portion has a first width and a second width and the second portion has a third width, respectively in the second direction that is substantially perpendicular with respect to the first direction, the first width being greater than the second width, the second width being greater than the third width.

11. The BSI sensor of claim 10, further comprising:
a second device isolation conductive pattern formed between the first device isolation conductive pattern and the device isolation trench.

12. The BSI sensor of claim 11, wherein the device isolation structure further comprises a device isolation insulating pattern that is disposed between the second device isolation conductive pattern and the device isolation trench and disposed on the back side of the semiconductor substrate.

13. The BSI sensor of claim 12, wherein the device isolation insulating pattern is formed in a multi-layer.

14. The BSI sensor of claim 12, wherein the device isolation insulating pattern comprises tantalum oxide.

15. The BSI sensor of claim 10, further comprising:
an insulating layer disposed on the back side and an internal circuit disposed in the insulating layer.

16. The BSI sensor of claim 10, further comprising:
a voltage connection structure disposed in the semiconductor substrate and on the back side, the voltage connection structure electrically connected to the device isolation structure.

17. The BSI sensor of claim 16, further comprising:
a voltage applying device that is electrically connected to the device isolation structure via the voltage connection structure.

18. The BSI sensor of claim 17, wherein the voltage applying device comprises a MOS transistor.

19. A back side illuminated image (BSI) sensor, comprising:
a semiconductor substrate comprising a front side and a back side opposite to the front side;
a pair of photodiodes formed between the front side and the back side;
a pair of color filters formed over the back side and corresponding to the pair of photodiodes, respectively; and
a device isolation structure comprising a first device isolation conductive pattern between the pair of photodiodes and extending in a first direction, the first device isolation conductive pattern including,
a first portion over the back side and further away from the front side than the back side, and
a second portion under the back side and disposed in a device isolation trench;
the device isolation structure further comprising a second isolation conductive pattern and a device isolation insulating pattern, the second isolation conductive pattern disposed between the first isolation conductive pattern and the device isolation insulation pattern; and wherein
the first device isolation conductive pattern and the second device isolation conductive pattern have shoulders disposed on the back side of the semiconductor substrate.

20. The BSI sensor of claim 19, wherein the device isolation insulating pattern is disposed between the second device isolation conductive pattern and the device isolation trench and disposed on the back side of the semiconductor substrate.

21. The BSI sensor of claim 20, wherein the device isolation insulating pattern is formed in a multi-layer.

22. The BSI sensor of claim 20, wherein the device isolation insulating pattern comprises tantalum oxide.

23. The BSI sensor of claim 19, further comprising:
an insulating layer disposed on the back side and an internal circuit disposed in the insulating layer.

24. The BSI sensor of claim 19, further comprising:
a voltage connection structure disposed in the semiconductor substrate and on the back side, the voltage connection structure electrically connected to the device isolation structure.

25. The BSI sensor of claim 24, further comprising:
a voltage applying device that is electrically connected to the device isolation structure via the voltage connection structure.

26. The BSI sensor of claim 25, wherein the voltage applying device comprises a MOS transistor.

* * * * *